US012666816B2

(12) United States Patent　　(10) Patent No.:　US 12,666,816 B2
Lee et al.　　(45) Date of Patent:　Jun. 23, 2026

(54) LIGHT EMITTING DISPLAY DEVICE

(71) Applicant: Samsung Display Co., LTD., Yongin-si (KR)

(72) Inventors: Jun Hee Lee, Hwaseong-si (KR); Jun Hyuk Woo, Yongin-si (KR); Hae Chan Park, Seoul (KR); Yeong Ho Lee, Seongnam-si (KR)

(73) Assignee: Samsung Display Co., LTD., Yongin-si (KR)

( * ) Notice: Subject to any disclaimer, the term of this patent is extended or adjusted under 35 U.S.C. 154(b) by 612 days.

(21) Appl. No.: 17/852,981

(22) Filed: Jun. 29, 2022

(65) Prior Publication Data

US 2023/0143745 A1　May 11, 2023

(30) Foreign Application Priority Data

Nov. 5, 2021　(KR) ......................... 10-2021-0151381

(51) Int. Cl.
*H10K 59/131*　(2023.01)
*H10K 50/818*　(2023.01)
*H10K 50/86*　(2023.01)
*H10K 59/122*　(2023.01)
*H10K 59/124*　(2023.01)
*H10K 59/35*　(2023.01)
*H10K 59/88*　(2023.01)

(52) U.S. Cl.
CPC ......... *H10K 59/131* (2023.02); *H10K 50/818* (2023.02); *H10K 50/86* (2023.02);
(Continued)

(58) Field of Classification Search
CPC .... H10K 59/131; H10K 59/122; H10K 59/35; H10K 59/88; H10K 59/124;
(Continued)

(56) References Cited

U.S. PATENT DOCUMENTS

2016/0155983 A1* 6/2016 Lee ...................... H10K 50/813
257/40
2018/0151663 A1* 5/2018 Kim ...................... H10K 59/123
(Continued)

FOREIGN PATENT DOCUMENTS

EP　　3 754 714　　12/2020
KR　　10-0640535　　10/2006
(Continued)

OTHER PUBLICATIONS

Extended European Search Report for European Patent Application No. 22190895.7, dated Mar. 21, 2023.

*Primary Examiner* — Shaun M Campbell
(74) *Attorney, Agent, or Firm* — Innovation Counsel LLP

(57)　　　　ABSTRACT

A light emitting display device includes a first semiconductor layer; a first gate insulating layer; a first gate conductive layer; a second gate insulating layer; a first data conductive layer; a lower organic layer; a second data conductive layer includes a first anode connection member and a second anode connection member; an upper organic layer; a first anode and a second anode; and a pixel defining layer that includes a first opening and a second opening respectively exposing the first anode and the second anode, wherein the upper organic layer include a first anode connection opening and a second anode connection opening through which the first anode and the second anode are respectively electrically connected with the first anode connection member and the second anode connection member.

20 Claims, 38 Drawing Sheets

(52) U.S. Cl.
CPC ......... *H10K 59/122* (2023.02); *H10K 59/124* (2023.02); *H10K 59/35* (2023.02); *H10K 59/88* (2023.02)

(58) Field of Classification Search
CPC ...... H10K 59/121; H10K 59/38; H10K 59/40; H10K 59/60; H10K 59/8792; H10K 59/123; H10K 59/179; H10K 59/353; H10K 59/8051; H10K 59/30; H10K 50/818; H10K 50/86
See application file for complete search history.

(56) References Cited

U.S. PATENT DOCUMENTS

| | | | | |
|---|---|---|---|---|
| 2019/0280061 A1* | 9/2019 | Joo | .................... | H10K 59/1213 |
| 2020/0403171 A1 | 12/2020 | Park et al. | | |
| 2021/0083034 A1 | 3/2021 | Bang et al. | | |
| 2021/0134906 A1* | 5/2021 | Lee | .................... | H10K 59/1213 |
| 2021/0191552 A1 | 6/2021 | Bok et al. | | |
| 2021/0249486 A1* | 8/2021 | Lee | ...................... | H10K 59/122 |
| 2021/0273145 A1* | 9/2021 | Lee | ...................... | H10K 59/124 |
| 2022/0285638 A1 | 9/2022 | Park et al. | | |
| 2022/0399421 A1* | 12/2022 | Hai | ...................... | G06V 10/145 |

FOREIGN PATENT DOCUMENTS

| | | |
|---|---|---|
| KR | 10-2016-0098601 | 8/2016 |
| KR | 10-1870931 | 6/2018 |
| KR | 10-2019-0107260 | 9/2019 |
| KR | 10-2020-0049826 | 5/2020 |
| KR | 10-2020-0052482 | 5/2020 |
| KR | 10-2205401 | 1/2021 |
| KR | 10-2021-0052730 | 5/2021 |
| KR | 10-2021-0082316 A | 7/2021 |

* cited by examiner 128b-2' FL-SD1 OPg 128b-2 FL-SD1 OPg (A)

LIGHT EMITTING DISPLAY DEVICE

CROSS-REFERENCE TO RELATED APPLICATION

This application claims priority to and the benefit of Korean Patent Application No. 10-2021-0151381 under 35 U.S.C. § 119 filed in the Korean Intellectual Property Office (KIPO) on Nov. 5, 2021, the entire contents of which are incorporated herein by reference.

BACKGROUND

1. Technical Field

The disclosure relates to a light emitting display device, and more specifically, it relates to a light emitting display device for reducing color bands by flattening organic layers.

2. Description of the Related Art

A display device is a device that displays a screen, and includes a liquid crystal display (LCD), an organic light emitting diode (OLED) display, and the like. Such a display device is used in various electronic devices such as portable phones, navigation devices, digital cameras, electronic books, portable game devices, or various terminals.

A display device such as an organic light emitting diode (OLED) display may have a structure in which the display device can be bent or folded using a flexible substrate.

In addition, in small electronic devices such as portable phones, optical elements such as cameras and photosensors are formed in a bezel region, which is the periphery of the display area. However, a technology that allows the optical sensor to be positioned on the rear of the display area is being developed as the size of the peripheral area of the display area is reduced while increasing the size of the displaying screen.

The above information disclosed in this Background section is only for enhancement of understanding of the background of the described technology, and therefore it may contain information that does not form the prior art that is already known in this country to a person of ordinary skill in the art.

SUMMARY

Embodiments are for improving display quality by reducing a reflective color band generated while being asymmetrically reflected due to reflection of external light.

A light emitting display device according to an embodiment includes a first semiconductor layer that is positioned on a substrate; a first gate insulating layer that is positioned on the first semiconductor layer; a first gate conductive layer that is positioned on the first gate insulating layer; a second gate insulating layer that is positioned on the first gate conductive layer; a first data conductive layer that is positioned on the second gate insulating layer; a lower organic layer that is positioned on the first data conductive layer; a second data conductive layer that is positioned on the lower organic layer, and includes a first anode connection member and a second anode connection member; an upper organic layer that are positioned on the second data conductive layer; a first anode and a second anode that are positioned on the upper organic layer; and a pixel defining layer that includes a first opening and a second opening respectively exposing the first anode and the second anode, wherein the upper organic layer include a first anode connection opening and a second anode connection opening through which the first anode and the second anode are respectively electrically connected with the first anode connection member and the second anode connection member, and a center line that passes through the first anode connection opening or a center of the first anode connection opening and the second anode connection opening or a center of the second anode connection opening passes through a center of the first opening or a center of the second opening.

The center line may extend in a horizontal direction, and may match the center of the first opening.

The first anode overlapping the first opening in a plan view may be an anode of a green light emitting diode, and the second anode overlapping the second opening in a plan view may be an anode of a red light emitting diode or an anode of a blue light emitting diode.

The light emitting display device may further include a third anode that is positioned on the upper organic layer. The pixel defining layer may further include a third opening exposing the third anode, and a distance from the center line in a horizontal direction, passing through the first anode connection opening or the center of the first anode connection opening or the center of the first opening to the center line in the horizontal direction, passing through the center of the second opening may be equal to a distance from the center line in the horizontal direction, passing through the first anode connection opening or the center of the first anode connection opening to the center line in the horizontal direction, passing through the center of the third opening.

The first anode overlapping the first opening in a plan view may be an anode of a green light emitting diode, the second anode overlapping the second opening in a plan view may be an anode of a red light emitting diode, and the third anode overlapping the third opening in a plan view may be an anode of a blue light emitting diode.

The second data conductive layer may further include a driving voltage line that includes a plurality of expansion portions and a connection portion electrically connecting the plurality of expansion portions, the first data conductive layer may include an expansion portion that overlaps the first opening in a plan view and includes a protruded portion, the protruded portion of the expansion portion of the first data conductive layer and the connection portion of the driving voltage line may be electrically connected with each other through an opening positioned in the lower organic layer, and the opening of the lower organic layer may be entirely covered by the protruded portion of the expansion portion of the first data conductive layer and the connection portion of the driving voltage line in a plan view.

The first data conductive layer may include an expansion portion overlapping the first opening in a plan view, and the expansion portion may have a structure that is narrowed toward a side.

The light emitting display device may further include between the second gate insulating layer and the first date conductive layer, a second gate conductive layer positioned on the second gate insulating layer; a first interlayer insulating layer positioned on the second gate conductive layer; a second semiconductor layer positioned on the first interlayer insulating layer and including an oxide semiconductor; a third gate insulating layer positioned on the second semiconductor layer; a third gate conductive layer positioned on the third gate insulating layer; and a second interlayer insulating layer positioned on the third gate conductive layer, and the first data conductive layer may be positioned on the second interlayer insulating layer.

The light emitting display device may further include a polycrystalline semiconductor transistor that includes a channel in the first semiconductor layer, and a gate electrode in the first gate conductive layer; and an oxide semiconductor transistor that includes a channel in the second semiconductor layer, and a gate electrode in the third gate conductive layer, wherein a driving transistor generating an output current to the first anode or the second anode may be the polycrystalline semiconductor transistor, and an anode initialization transistor that initializes the first anode or the second anode may be the oxide semiconductor transistor.

The first data conductive layer may include a wiring portion extended in a vertical direction and an extension portion protruded to opposite sides from the wiring portion in a horizontal direction, an end of the extension portion may be expanded, and the light emitting display device may include a second initialization voltage line that transmits a second initialization voltage to the anode initialization transistor.

The upper organic layer may further include a dummy anode connection opening, and a horizontal direction center line passing through the center of the first opening of the pixel defining layer or the center of the second opening passes through the dummy anode connection opening or the center of the dummy anode connection opening.

The light emitting display device may further include a display area and a first component area, wherein the dummy anode connection opening may be positioned in the display area, and at least part of the pixel defining layer may be positioned in the dummy anode connection opening.

The dummy anode connection opening may be positioned in the first component area, at least part of a function layer may be positioned in the dummy anode connection opening, and the function layer may include at least one of an electron injection layer, an electron transport layer, a hole transport layer, and a hole injection layer of a light emitting diode.

The first gate conductive layer may include a first scan line, and the first scan line may have a structure bent along the boundary of the first component area.

The first gate conductive layer may further include a dummy scan portion, the first scan line may be bent along an upper boundary of the first component area, and the dummy scan portion may be separated from the first scan line while being bent along a lower boundary of the first component area.

A light emitting display device according to an embodiment includes a first semiconductor layer that is positioned on a substrate; a first gate insulating layer that is positioned on the semiconductor layer; a gate conductive layer that is positioned on the first gate insulating layer; a second gate insulating layer that is positioned on the gate conductive layer; a first data conductive layer that is positioned on the second gate insulating layer; a lower organic layer that is positioned on the first data conductive layer; a second data conductive layer that is positioned on the lower organic layer; an upper organic layer that are positioned on the second data conductive layer; a first anode and a second anode that are positioned on the upper organic layer; and a pixel defining layer that includes a first opening and a second opening respectively exposing the first anode and the second anode, wherein the upper organic layer includes a dummy anode connection opening, and a center line passing through a center of the first opening and a center of the second opening of the pixel defining layer passes through the dummy anode connection opening or a center of the dummy anode connection opening.

The light emitting display device include a display area and a first component area, wherein the dummy anode connection opening may be positioned in the display area, and at least part of the pixel defining layer may be positioned in the dummy anode connection opening.

The dummy anode connection opening may be positioned in the first component area, at least part of a function layer may be positioned in the dummy anode connection opening, and the function layer may include at least one of an electron injection layer, an electron transport layer, a hole transport layer, and a hole injection layer of a light emitting diode.

The gate conductive layer may include a first scan line, and the first scan line may have a structure bent along the boundary of the first component area.

The gate conductive layer may further include a dummy scan portion, the first scan line is bent along an upper boundary of the first component area, and the dummy scan portion may be separated from the first scan line while being bent along a lower boundary of the first component area.

According to the embodiments, the opening positioned in the organic layer positioned under the anode is formed symmetrically from the opening of the adjacent anode or pixel defining layer, and thus the anode is evenly flat, thereby preventing the reflected light from spreading asymmetrically. As a result, it is possible to improve the display quality by reducing the reflected color band caused by the color separation caused by the reflected light. In addition, the ratio of external light reflection can be reduced by using a pixel defining layer as a pixel defining layer that separates the emission layer from each other instead of a polarizer.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION OF THE EMBODIMENTS

Figure 1:
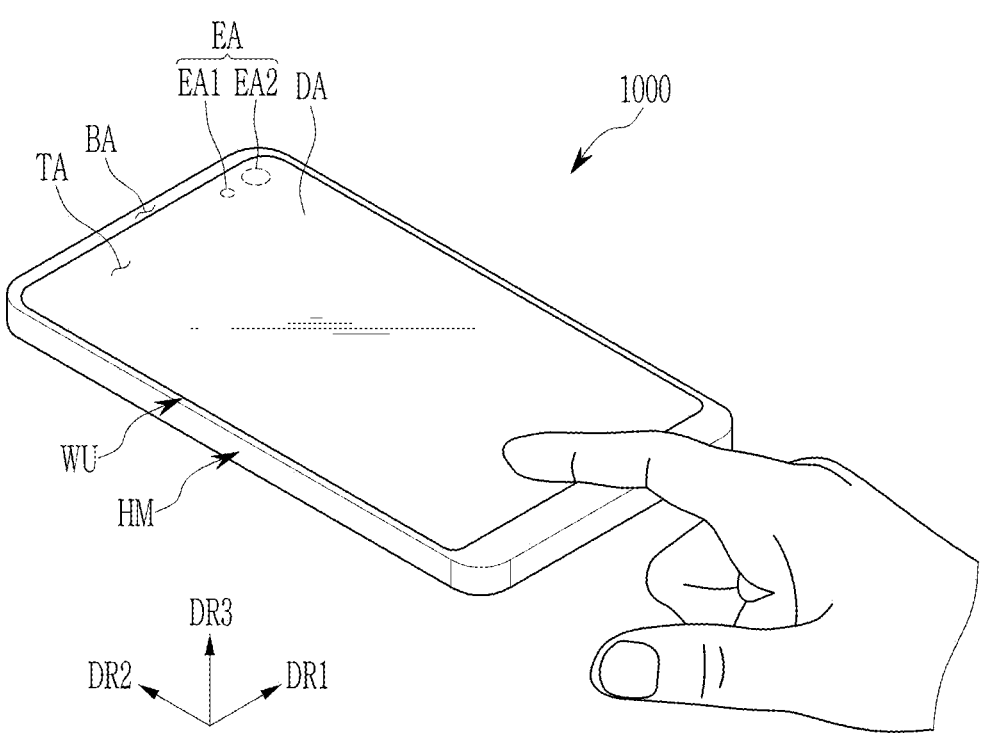
FIG. 1 is a schematic perspective view that illustrates a use state of a display device according to an embodiment.

Hereinafter, with reference to the accompanying drawings, various embodiments will be described in detail so that those of ordinary skill in the art can readily carry out the disclosure. The disclosure may be implemented in several different forms and is not limited to the embodiments described herein.

In order to clearly explain the disclosure, parts irrelevant to the description are omitted, and the same reference sign is attached to the same or similar constituent elements throughout the specification.

In addition, since the size and thickness of each component shown in the drawing are arbitrarily indicated for better understanding and ease of description, the disclosure is not necessarily limited to the illustrated drawings. In the drawings, the thickness of layers, films, panels, regions, and the like are exaggerated for clarity. In addition, in the drawing, the thickness of some layers and regions is exaggerated for better understanding and ease of description.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, throughout the specification, the word "on" a target element will be understood to mean positioned above or below the target element, and will not necessarily be understood to mean positioned "at an upper side" based on an opposite to gravity direction.

In addition, unless explicitly described to the contrary, the word "comprise", and variations such as "comprises" or "comprising", will be understood to imply the inclusion of stated elements but not the exclusion of any other elements.

Further, throughout the specification, the phrase "on a plane" means viewing a target portion from the top, and the phrase "on a cross-section" means viewing a cross-section formed by vertically cutting a target portion from the side.

In addition, throughout the specification, "connected" does not mean only when two or more constituent elements are directly connected, but may also include a case that two or more constituent elements are indirectly connected through other constituent elements, a case that they are physically connected, a case of electrically connected, and a case in which each part that is substantially integral with each other while being referred to by a different name depending on a position or function. It will be understood that the terms "contact," "connected to," and "coupled to" may include a physical and/or electrical contact, connection, or coupling.

In addition, throughout the specification, when it is stated that parts such as wire, layer, film, region, plate, and constituent elements are "extended in the first direction or second direction", this does not mean only a straight line shape extending straight in the corresponding direction but also includes a structure that is bent in a part, has a zigzag structure, or extends while including a curved line structure, which is a structure that extends overall in the first direction or the second direction.

In addition, electronic devices (e.g., a mobile phone, a TV, a monitor, a laptop computer, etc.) including display devices and display panels described in the specification or electronic devices including display devices and display panels manufactured by the manufacturing method described in the specification are not excluded from the right range of this specification.

The terms "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

The phrase "at least one of" is intended to include the meaning of "at least one selected from the group of" for the purpose of its meaning and interpretation. For example, "at least one of A and B" may be understood to mean "A, B, or A and B."

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Figure 2:
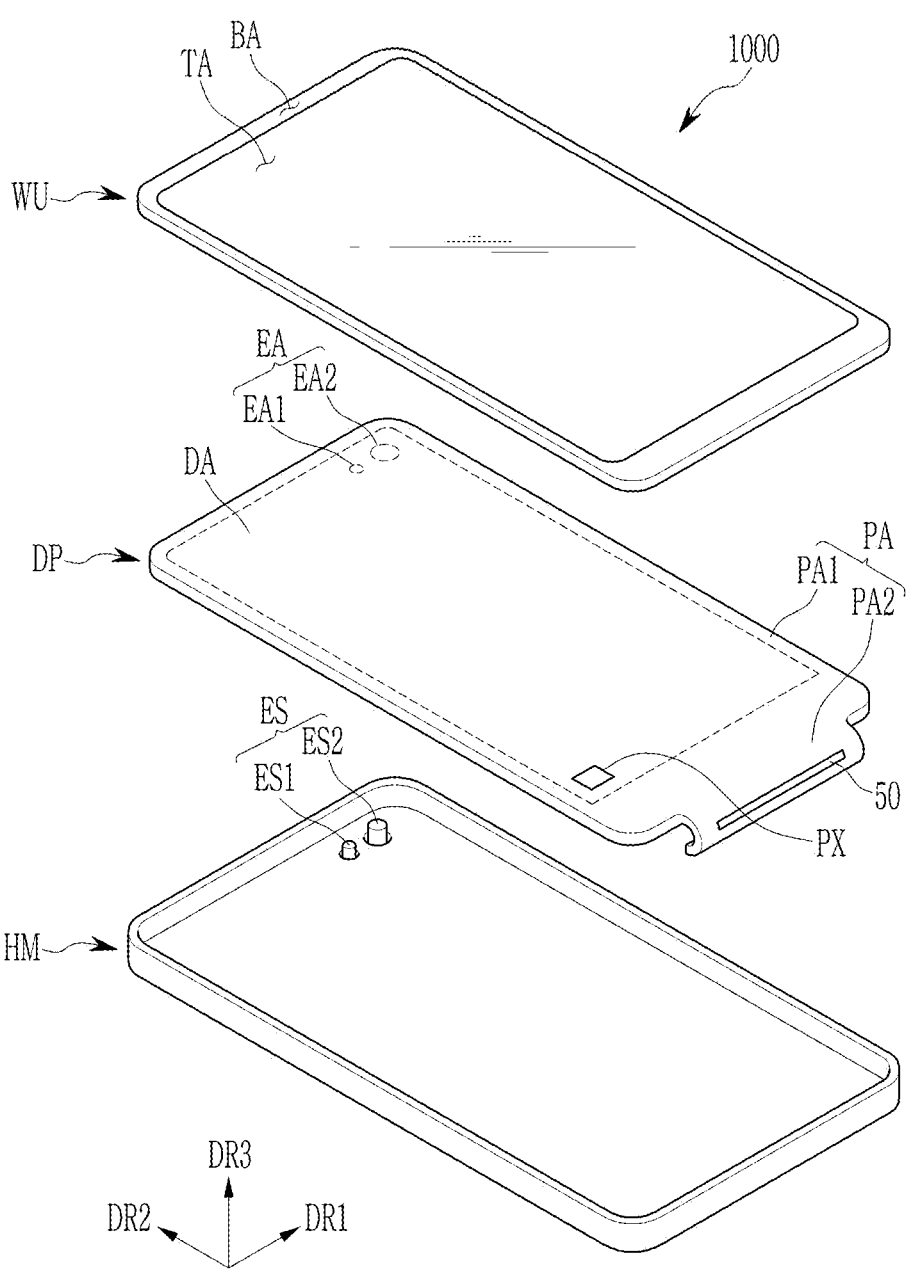
FIG. 2 is a schematic exploded perspective view of the display device according to the embodiment.
Figure 3:
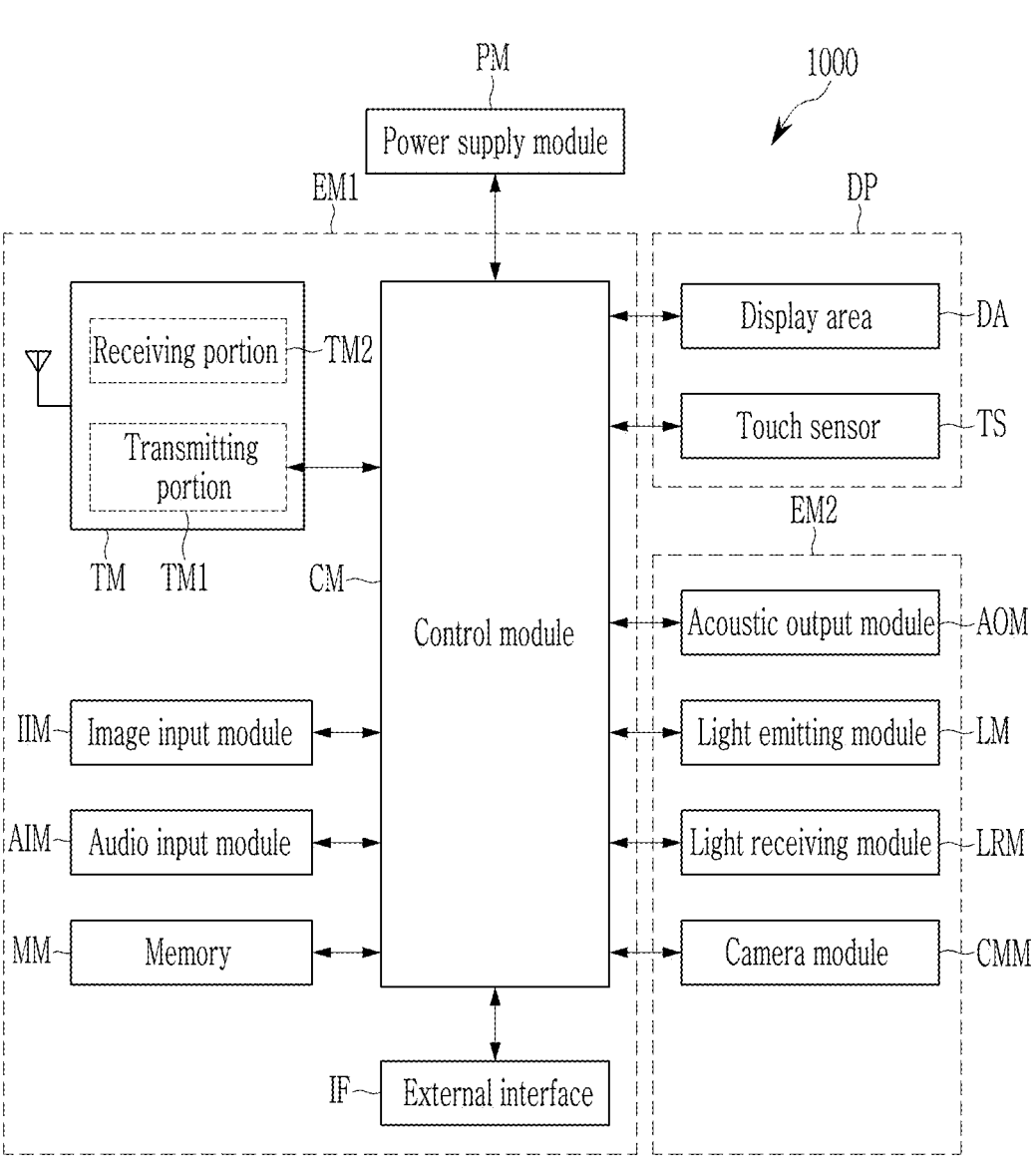
FIG. 3 is a schematic block diagram of the display device according to the embodiment.

Hereinafter, a schematic structure of a display device will be described with reference to FIGS. 1 to 3. FIG. 1 is a schematic perspective view that illustrates a use state of a display device according to an embodiment, FIG. 2 is a schematic exploded perspective view of the display device according to the embodiment, and FIG. 3 is a schematic block diagram of the display device according to the embodiment.

Referring to FIG. 1, a display device 1000 according to an embodiment is a device that displays motion pictures or still images, and may be used as a display screen of not only a portable electronic device such as a mobile phone, a smartphone, a tablet personal computer, a mobile communication terminal, an electronic notebook, an electronic book, a portable multimedia player (PMP), a navigator, an ultra-mobile PC (UMPC), and the like but also various products such as a television, a laptop, a monitor, an advertisement board, an Internet of things (IoT) device, and the like. In addition, the display device 1000 according to the embodiment may be used in a wearable device such as a smartwatch, a watch phone, a spectacles type display, and a head-mounted display (HMD). In addition, the display device 1000 according to the embodiment may be used as the dashboard of a car, and a center information display (CID) disposed on the center fascia or dashboard of the car, a room mirror display that replaces the side-view mirror of the car, and a display disposed on the back of the front seat as an entertainment device for the rear seat of the car. FIG. 1 illustrates that the display device 1000 is used as a smartphone for better comprehension and ease of description.

The display device 1000 may display an image on a display plane that is parallel with a first direction DR1 and a second direction DR2, in a third direction DR3. The display plane where an image is displayed may correspond to a front surface of the display device 1000, and may correspond to a front surface of a cover window WU. The images may include static images as well as dynamic images.

In the embodiment, a front (or top) and a rear (or bottom) of each member are defined with reference to a direction in which the image is displayed. The front and rear surfaces may be opposite to each other in the third direction DR3, and the normal directions of the front and rear surfaces may be parallel to the third direction DR3.

A separation distance between the front surface and the rear surface in the third direction DR3 may correspond to a thickness of the display panel in the third direction DR3.

The display device 1000 according to the embodiment may detect a user's input (refer to the hand in FIG. 1) from the outside. The user's input may include various types of external input such as a part of the user's body, light, heat, or pressure. In the embodiment, the user's input is shown as the user's hand applied to the front. However, the disclosure is not limited thereto. The user's input may be provided in various forms, and the display device 1000 may detect the user's input applied to a side or the rear surface of the display device 1000 according to the structure of the display device 1000.

Referring to FIGS. 1 and 2, the display device 1000 may include a cover window WU, a housing HM, a display panel DP, and an optical element ES. In the embodiment, the cover window WU and housing HM are combined to form (or configure) the appearance of the display device 1000.

The cover window WU may include an insulating panel. For example, the cover window WU may be made of glass, plastic, or a combination thereof.

The front of the cover window WU may define the front of the display device 1000. A transmissive area TA may be an optically transparent area. For example, the transmissive area TA may be a region having a visible ray transmittance of about 90% or more.

A blocking area BA may define the shape of the transmissive area TA. The blocking area BA is adjacent to the transmissive area TA and may surround the transmissive area TA. The blocking area BA may be a region having relatively low light transmittance compared to the transmissive area TA. The blocking area BA may include a transparent material that blocks light. The blocking area BA may have a color.

The blocking area BA may be defined by a bezel layer provided separately from the transparent substrate defining the transmission area TA, or may be defined by an ink layer formed by being inserted or colored in the transparent substrate.

The display panel DP may include a display panel DP and a driver 50 for displaying an image. The display panel DP may include a front surface including a display area DA and a peripheral area PA. The display area DA may be a region in which a pixel operates according to an electrical signal and emits light.

In the embodiment, the display area DA may be a region in which pixels are included and an image is displayed, and simultaneously a region in which an external input is sensed by a touch sensor positioned on an upper side in the third direction DR3 of the pixel.

The transmissive area TA of the cover window WU may at least partially overlap the display area DA of the display panel DP. For example, the transmissive area TA may overlap the front surface of the display area DA or may overlap at least a portion of the display area DA. Accordingly, the user may recognize an image through the transmissive area TA or provide an external input based on the image. However, the disclosure is not limited thereto. For example, in the display area DA, a region where an image is displayed and a region where an external input is sensed may be separated from each other.

The peripheral area PA of the display panel DP may at least partially overlap the blocking area BA of the cover window WU. The peripheral area PA may be a region covered by the blocking area BA. The peripheral area PA is adjacent to the display area DA and may surround the display area DA. An image is not displayed in the peripheral area PA, and a driving circuit or driving wire for driving the display area DA may be disposed.

The peripheral area PA may include a first peripheral area PA1 positioned outside the display area DA, and a second peripheral area PA2 including the driver 50, a connection line, and a bending area. In the embodiment of FIG. 2, the first peripheral area PA1 is positioned on three sides of the display area DA, and the second peripheral area PA2 is positioned on the other side of the display area DA.

In the embodiment, the display panel DP may be assembled in a flat state with the display area DA and the peripheral area PA facing the cover window WU. However, the disclosure is not limited thereto. A part of the peripheral area PA of the display panel DP may be bent. In this case, a part of the peripheral area PA faces toward the rear side of the display device 1000 and thus the blocking area BA shown on the front of the display device 1000 can be reduced, and in FIG. 2, the second peripheral area PA2 is bent and positioned on the back side of the display area DA, and then assembled.

In addition, the display panel DP may include a component area EA, and specifically, may include a first component area EA1 and a second component area EA2. The first component area EA1 and the second component area EA2 may be at least partially surrounded by the display area DA. Although the first component area EA1 and the second component area EA2 are shown to be spaced apart from each other, the disclosure is not limited thereto and at least some (or part) of them may be connected. The first component area EA1 and the second component area EA2 may be regions in which components using infrared rays, visible rays, sound, or the like are disposed thereunder.

In the display area DA, light emitting diodes and pixel circuit portions for generating a light emitting current and transmitting the same to each of the light emitting diodes are formed. Here, a light emitting diode and a pixel circuit part are referred to as a pixel PX. In the display area DA, a pixel circuit part and a light emitting diode are formed one-to-one.

The first component area EA1 includes a region formed as a transparent layer to allow light to pass therethrough, and no conductive layer or no semiconductor layer is positioned, and may have a structure in which the pixel defining layer, the light blocking layer, and the like including the light blocking material include openings overlapping the position corresponding to the first component area EA1, thereby preventing light from being blocked.

The second component area EA2 may include a transmissive portion through which light or/and sound may pass and a display portion including pixels. The transmissive portion is positioned between adjacent pixels and is formed as a transparent layer through which light or/and sound can pass. The display portion may be formed to have a unit structure by combining pixels, and the transmissive portion may be positioned between adjacent unit structures.

Referring to FIGS. 1 to 3, the display panel DP may include the display area DA where display pixels are included, and a touch sensor TS. The display panel DP may be visually recognized by the user from the outside through the transmissive area TA, including the pixel that creates the image. In addition, the touch sensor TS may be positioned above the pixel, and may sense an external input applied from the outside. The touch sensor TS may detect an external input provided to the cover window WU.

Referring back to FIG. 2, the second peripheral area PA2 may include a bending portion. The display area DA and the first peripheral area PA1 may have a flat state in which they are substantially parallel to the plane defined by the first direction DR1 and the second direction DR2, and a side of the second peripheral area PA2 is extended from the flat state and may be flat again after passing through the bending portion. As a result, at least a part of the second peripheral area PA2 may be bent and assembled to be positioned on the rear side of the display area DA. At least a portion of the second peripheral area PA2 overlaps the display area DA in a plan view when assembled, and thus the blocking area BA of the display device 1000 may be reduced. However, the disclosure is not limited thereto. For example, the second peripheral area PA2 may not be bent.

The driver 50 may be mounted on the second peripheral area PA2, and may be mounted on the bending portion or positioned on one of sides of the bending portion. The driver 50 may be provided in the form of a chip.

The driver 50 may be electrically connected to the display area DA to transmit an electrical signal to the display area DA. For example, the driver 50 may provide data signals to pixels PX disposed in the display area DA. As another example, the driver 50 may include a touch driving circuit and may be electrically connected to the touch sensor TS disposed in the display area DA. The driver 50 may include various circuits in addition to the above-described circuits or may be designed to provide various electrical signals to the display area DA.

In the display device 1000, a pad portion may be positioned at the end of the second peripheral area PA2, and the second peripheral area PA2 may be electrically connected to a flexible printed circuit board (FPCB) including a driving chip by the pad portion. Here, the driving chip positioned on the flexible printed circuit board may include various driving circuits for driving the display device 1000 or connectors for power supply. In embodiments, instead of the flexible printed circuit board, a rigid printed circuit board (PCB) may be used.

The optical element ES may be disposed under the display panel DP. The optical element ES may include a first optical element ES1 overlapping the first component area EA1 and a second optical element ES2 overlapping the second component area EA2.

The first optical element ES1 may be an electronic element using light or sound. For example, the first optical element ES1 may be a sensor that receives and uses light, similar to an infrared sensor, a sensor that outputs and senses light or sound to measure a distance or recognizes a fingerprint and the like, a small lamp that outputs light, or a speaker that outputs a sound. In the case of an electronic element using light, light of various wavelength bands such as visible light, infrared light, and ultraviolet (UV) light can be used.

The second optical element ES2 may be at least one of a camera, an infrared (IR) camera, a dot projector, an infrared illuminator, and a time-of-flight sensor (ToF sensor).

Referring to FIG. 3, the display device 1000 may include a display panel DP, a power supply module PM, a first electronic module EM1, and a second electronic module EM2. The display panel DP, the power supply module PM, the first electronic module EM1, and the second electronic module EM2 may be electrically connected to each other. FIG. 3 illustrates, as an example, the display pixel and the touch sensor TS positioned in the display area DA among the configuration of the display panel DP.

The power supply module PM may supply power required for the overall operation of the display device 1000. The power supply module PM may include a conventional battery module.

The first electronic module EM1 and the second electronic module EM2 may include various functional modules for operating the display device 1000. The first electronic module EM1 may be directly mounted on a motherboard electrically connected to the display panel DP or mounted on a separate substrate and electrically connected to a motherboard through a connector (not shown).

The first electronic module EM1 may include a control module CM, a wireless communication module TM, an image input module IIM, an audio input module AIM, a memory MM, and an external interface IF. Some of the modules are not mounted on the motherboard, and may be electrically connected to the motherboard through the flexible printed circuit board connected thereto.

The control module CM may control the overall operation of the display device 1000. The control module CM may be a microprocessor. For example, the control module CM activates or deactivates the display panel DP. The control module CM may control other modules such as an image input module IIM or an audio input module AIM based on the touch signal received from the display panel DP.

The wireless communication module TM may transmit/receive a wireless signal to/from another terminal using a Bluetooth or Wi-Fi line. The wireless communication module TM may transmit/receive voice signals using a general communication line. The wireless communication module TM includes a transmitting portion TM1 that modulates and transmits a signal to be transmitted, and a receiving portion TM2 that demodulates a received signal.

The image input module IIM may process a video signal and convert it into image data that can be displayed on the display panel DP. The audio input module AIM may receive an external sound signal input by a microphone in a recording mode, a voice recognition mode, and the like, and convert it into electrical voice data.

The external interface IF may serve as an interface connected to an external charger, a wired/wireless data port, or a card socket (e.g., a memory card, a SIM/UIM card).

The second electronic module EM2 may include an audio output module AOM, a light emitting module LM, a light receiving module LRM, a camera module CMM, and the like, and at least some of these are optical elements ES that may be positioned on the rear side of the display panel DP as shown in FIGS. 1 and 2. The optical element ES may include a light emitting module LM, a light receiving module LRM, and a camera module CMM. In addition, the second electronic module EM2 may be directly mounted on the motherboard, mounted on a separate substrate and electrically connected to the display panel DP through a connector (not shown), or electrically connected to the first electronic module EM1.

The audio output module AOM may convert the sound data received from the wireless communication module TM or the sound data stored in the memory MM and output it to the outside.

The light emitting module LM may generate and output light.

The light emitting module LM may output infrared rays. For example, the light emitting module LM may include an LED element. For example, the light receiving module LRM may detect infrared rays. The light receiving module LRM may be activated in case that infrared light above a level (e.g., predetermined or selected level) is detected. The light receiving module LRM may include a CMOS sensor. After the infrared light generated by the light emitting module LM is output, it is reflected by an external subject (e.g., a user's finger or face), and the reflected infrared light may be incident on the light receiving module LRM. The camera module CMM may capture an external image.

In an embodiment, the optical element ES may additionally include a light sensor or a thermal sensor. The optical element ES may detect an external object received through the front side or provide a sound signal such as voice through the front side to the outside. In addition, the optical element ES may include configurations, and is not limited to any one embodiment.

Referring back to FIG. 2, the housing HM may be combined with the cover window WU. The cover window WU may be disposed in front of the housing HM. The housing HM may be coupled to the cover window WU to provide a space. The display panel DP and optical element ES may be accommodated in the space provided between the housing HM and the cover window WU.

The housing HM may contain a material with relatively high stiffness. For example, the housing HM may include frames and/or plates made of glass, plastic, or metal, or a combination thereof. The housing HM may reliably protect the components of the display device 1000 accommodated in the inner space from external impact.

Figure 4:
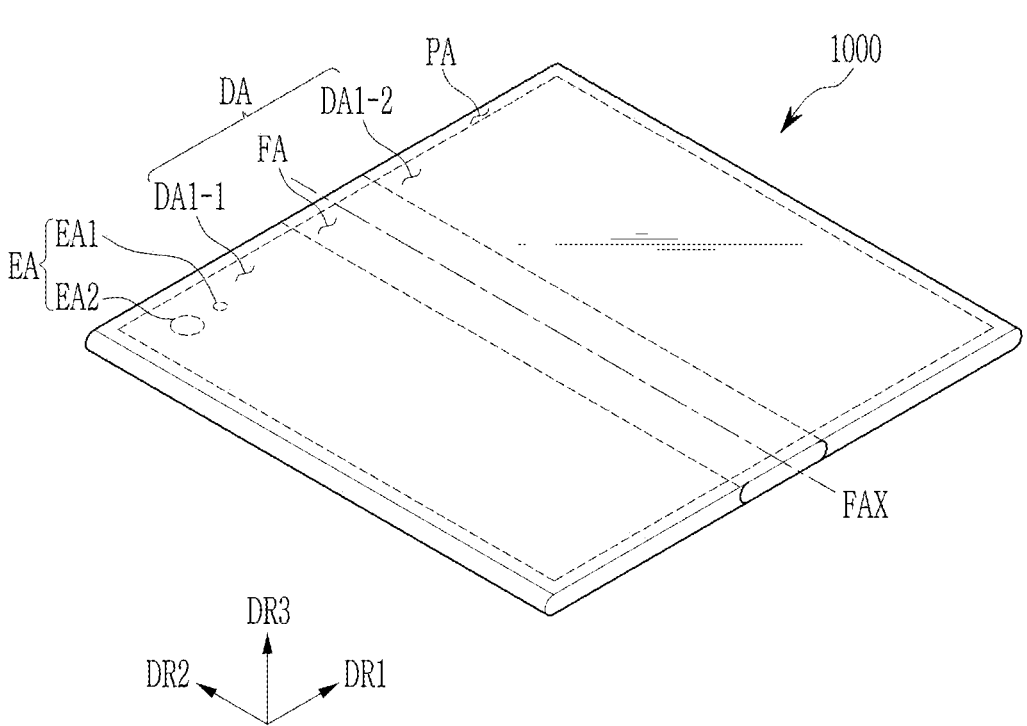
FIG. 4 is a schematic perspective view of a display device according to another embodiment.

Hereinafter, referring to FIG. 4, a structure of a display device 1000 according to another embodiment will be described. FIG. 4 is a schematic perspective view of a display device according to another embodiment.

Descriptions of the same components as those described above will be omitted.

FIG. 4 illustrates a foldable display device having a structure in which the display device 1000 is folded through a folding axis FAX.

Referring to FIG. 4, in an embodiment, the display device 1000 may be a foldable display device. The display device 1000 may be folded outward or inward with reference to the folding axis FAX. In case that the display device 1000 is folded outward with the folding axis FAX as a reference (or with respect to the folding axis FAX), a display plane of the display device 1000 is positioned on the outside in the third direction DR3, and thus images may be displayed in directions. In case that the display device 1000 is folded inward with the folding axis FAX as a reference, the display plane may not be visible from the outside.

In the embodiment, the display device 1000 may include a display area DA, a component area EA, and a peripheral area PA. The display area DA may be divided into a 1-1-th display area DA1-1, a 1-2-th display area DA1-2, and a folding area FA. The 1-1-th display area DA1-1 and the 1-2-th display area DA1-2 may be positioned on the left and right sides, respectively, with the folding axis FAX as a reference (or at the center), and the folding area FA may be positioned between the 1-1-th display area DA1-1 and the 1-2-th display areas DA1-2. In this case, in case that the display area DA is folded outward with respect to the folding axis FAX, the 1-1-th display area DA1-1 and the 1-2-th display area DA1-2 are positioned on sides in the third direction DR3, and images can be displayed on the sides in the third directions DR3.

In this case, in case that the display device 1000 is folded inward with respect to the folding axis FAX, the 1-1-th display area DA1-1 and the 1-2-th display area DA1-2 may not be viewed from the outside.

Figure 5:
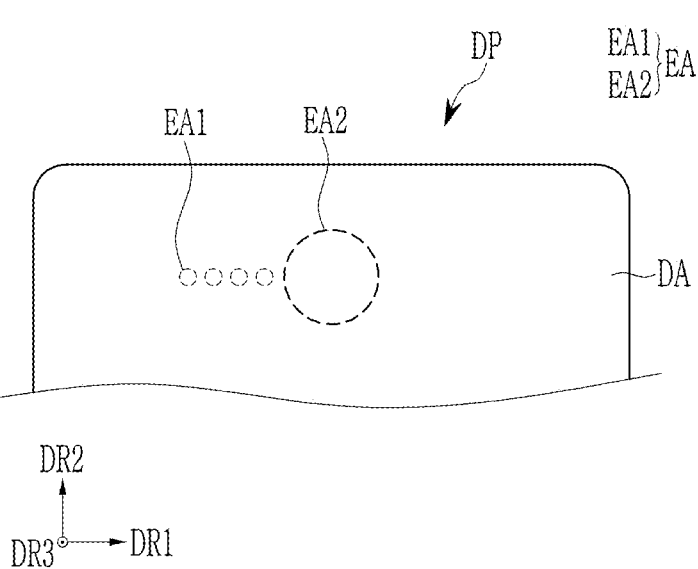
FIG. 5 is a schematic enlarged plan view of some area of the display device according to the embodiment.

FIG. 5 is a schematic enlarged plan view of an area of the display device according to the embodiment.

FIG. 5 illustrates a part of the light emitting display panel DP of the light emitting display device according to the embodiment, and a display panel for a mobile phone is used.

The display area DA is positioned over the entire front surface of the light emitting display panel DP, and may include a component area EA provided on a front, and specifically may include a first component area EA1 and a second component area EA2. Additionally, in the embodiment of FIG. 5, the first component area EA1 is positioned at a location adjacent to the second component area EA2. In the embodiment of FIG. 5, the first component area EA1 is positioned at the left side of the second component area EA2. The position and number of first component areas EA1 may vary for each embodiment. In FIG. 5, an optical element corresponding to the second component area EA2 may be a camera, and an optical element corresponding to the first component area EA1 may be a photosensor.

In the display area DA, light emitting diodes, and pixel circuit parts for generating and transmitting a light emitting current to each of the light emitting diodes, are formed. Here, a light emitting diode and a pixel circuit part are referred to as a pixel PX. In the display area DA, a pixel circuit part and a light emitting diode are formed one-to-one. The display area DA will hereinafter be referred to as a normal display area. In FIG. 5, a structure of the light emitting display panel DP below the cut-out line is not illustrated, but the display area DA may be positioned below the cut-out line.

The first component area EA1 is formed only as a transparent layer to allow light to pass therethrough, and a conductive layer or a semiconductor layer is not positioned therein, and may have a structure in which a photosensor area OPS is included in a lower panel layer, and an opening (hereinafter also referred to as an additional opening) is formed at a position in a black pixel defining layer 380 (hereinafter also referred to as a pixel defining layer), a light blocking member 220, and a color filter layer 230 of an upper panel layer corresponding to the first component area EA1 such that light is not blocked. Although the photosensor area OPS is located in the lower panel layer, the component area EA1 may be the display area DA if no opening corresponding to the upper panel layer is provided. FIGS. 7 to 20 illustrate a pixel and a photosensor area OPS, and illustrate a pixel structure of first component area EA1 or display area DA.

The light emitting display panel DP according to the embodiment may be divided into a lower panel layer and an upper panel layer. The lower panel layer is a portion where the light emitting diode and the pixel circuit part forming the pixel are positioned, and may include an encapsulation layer 400 (refer to FIG. 20) covering the lower panel layer. For example, the lower panel layer is from a substrate 110 (refer to FIG. 20) to the encapsulation layer, and includes an anode Anode, a black pixel defining layer 380 (refer to FIG. 20), an emission layer EML (refer to FIG. 20), a spacer 385 (refer to FIG. 20), a function layer FL (refer to FIG. 20), and a cathode Cathode (refer to FIG. 20), and includes an insulation layer, a semiconductor layer, and a conductive layer between the substrate and the anode. The upper panel layer is a portion positioned on an upper portion of the encapsulation layer, and may include a sensing insulation layer 501, 510, and 511 (refer to FIG. 20) that can detect a touch and sensing electrodes 540 and 541 (refer to FIG. 20), a light blocking member 220 (refer to FIG. 20), a color filter 230 (refer to FIG. 20), a planarization layer 550 (refer to FIG. 20), and the like.

A structure of the lower panel layer of the display area DA will be described with reference to FIGS. 7 to 20 below.

Although it is not illustrated in FIG. 5, a peripheral area may be further positioned outside the display area DA. In addition, FIG. 5 illustrates a display panel for a mobile phone, but the embodiment may be applied in case that an optical element can be positioned on a rear side of the display panel, and the display panel for a mobile phone may also be a flexible display device. In the case of a foldable display device among flexible display devices, the positions of the second component area EA2 and the first component area EA1 may be formed in positions that are different from the positions shown in FIG. 5.

Hereinafter, a circuit structure of a pixel located in the lower panel layer of the light emitting display panel DP will be described in detail with reference to FIG. 6.

The following pixel structure may be a pixel structure of the display area DA and/or the second component area EA2 including the photosensor area OPS. Here, the photosensor area OPS is a portion that can correspond to the first component area EA1 in case that a light blocking portion such as the light blocking member is removed from the upper portion of the photosensor area OPS, and may be included in the display area DA in case that light can be blocked with a light blocking member on the upper portion of the photosensor area OPS.

First, referring to FIG. 6, a pixel circuit structure will be described.

Figure 6:
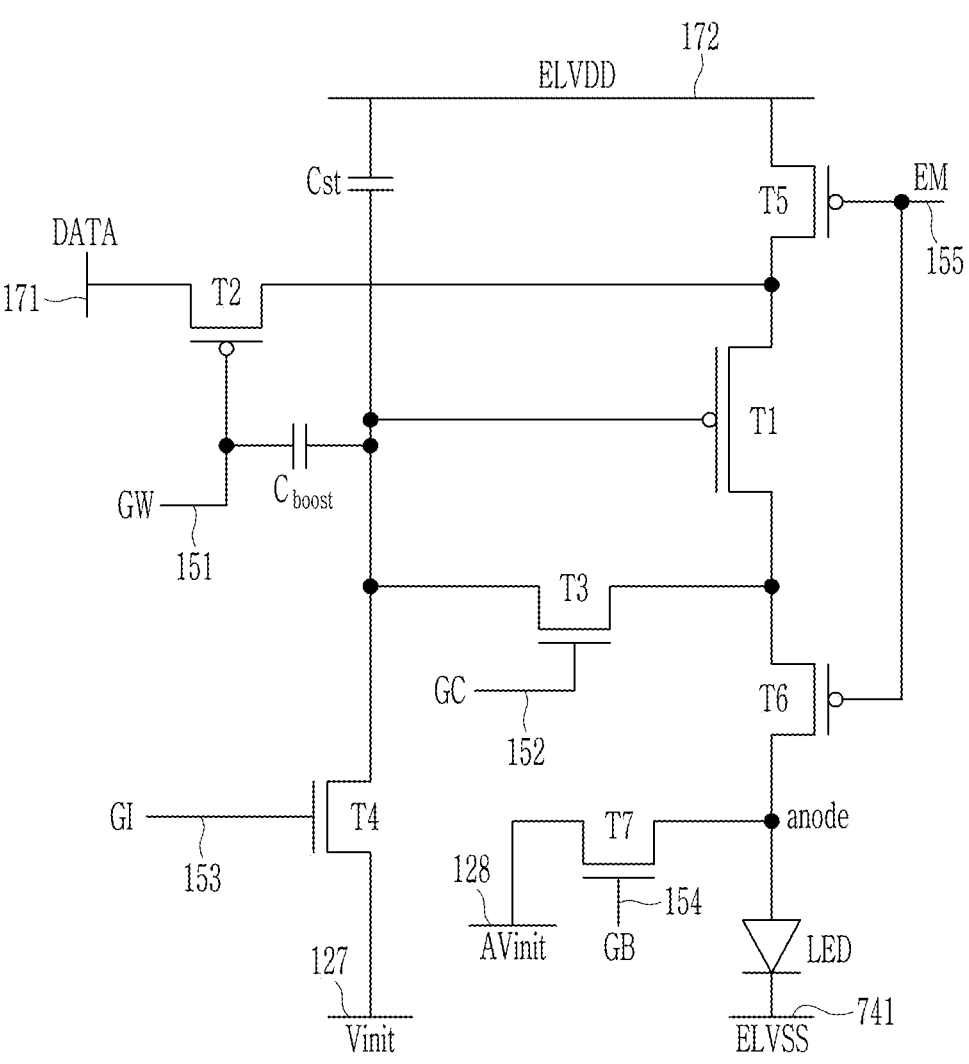
FIG. 6 is a schematic diagram of an equivalent circuit of a pixel included in the light emitting display device according to the embodiment.

FIG. 6 is a schematic diagram of an equivalent circuit of a pixel included in the light emitting display device according to the embodiment.

The circuit structure shown in FIG. 6 is a circuit structure of a pixel circuit portion and a light emitting diode formed in the display area DA and the second component area EA2.

A pixel according to the embodiment includes transistors T1, T2, T3, T4, T5, T6, and T7 connected to wires 127, 128, 151, 152, 153, 154, 155, 171, 172, and 741, a storage capacitor Cst, a boost capacitor $C_{boost}$, and a light emitting diode LED. Here, the transistors and the capacitor, excluding the light emitting diode LED, form the pixel circuit portion. In embodiments, the boost capacitor $C_{boost}$ can be omitted. The transistors T1, T2, T3, T4, T5, T6, and T7 may be polycrystalline semiconductor transistors including a polycrystalline semiconductor and oxide semiconductor transistors including an oxide semiconductor, and the polycrystalline semiconductor transistors may be a driving transistor T1, a second transistor T2, a fifth transistor T5, and a sixth transistor T6, while the oxide semiconductor transistors may be a third transistor T3, a fourth transistor T4, and a seventh transistor T7.

A pixel PX may be connected with wires 127, 128, 151, 152, 153, 154, 155, 171, 172, and 741. The wires include a first initialization voltage line 127, a second initialization voltage line 128, a first scan line 151, a second scan line 152, an initialization control line 153, a bypass control line 154, a light emission control line 155, a data line 171, a driving voltage line 172, and a common voltage line 741.

The first scan line 151 is connected to a scan driver (not shown) and transmits a first scan signal GW to the second transistor T2 and the seventh transistor T7. A voltage of opposite polarity of a voltage applied to the first scan line 151 may be applied to the second scan line 152 at the same timing as a signal of the first scan line 151. For example, in case that a negative voltage is applied to the first scan line 151, a positive voltage may be applied to the second scan line 152. The second scan line 152 transmits a second scan signal GC to the third transistor T3. The initialization control line 153 transmits an initialization control signal GI to the fourth transistor T4, the light emission control line 155 transmits a light emission control signal EM to the fifth transistor T5 and the sixth transistor T6, and the bypass control line 154 transmits a bypass control signal GB to the seventh transistor T7. A voltage of opposite polarity may be applied to the bypass control signal GB at the same timing as the first scan signal GW, and in this case, the bypass control signal GB may have the same signal as the second scan signal GC.

The data line 171 is a wire that transmits a data voltage DATA generated by a data driver (not shown). Accordingly, the intensity of the light emitting current transmitted to the light emitting diode LED changes such that the luminance of the light emitting diode LED also changes. The driving voltage line 172 applies a driving voltage ELVDD. The first initialization voltage line 127 transmits a first initialization voltage Vinit, and the second initialization voltage line 128 transmits a second initialization voltage AVinit. The common voltage line 741 applies a common voltage ELVSS to a cathode of the light emitting diode LED. In the embodiment, voltages applied to the driving voltage line 172, the first and second initialization voltage line 127 and 128, and the common voltage line 741 may each be a constant voltage.

The driving transistor T1 (also referred to as a first transistor) is a P-type transistor, and has a silicon semiconductor (polycrystalline semiconductor) as a semiconductor layer. The driving transistor T1 is a transistor that adjusts the intensity of the light emitting current output to an anode of the light emitting diode LED according to the magnitude of a voltage of a gate electrode of the driving transistor T1 (for example, a voltage stored in the storage capacitor Cst). Since the brightness of the light emitting diode LED is adjusted according to the intensity of the light emitting current output to the anode of the light emitting diode LED, the light emitting luminance of the light emitting diode LED can be adjusted according to the data voltage DATA applied to the pixel. For this purpose, a first electrode of the driving transistor T1 is disposed to receive a driving voltage ELVDD, and is connected to the driving voltage line 172 via the fifth transistor T5. In addition, the first electrode of the driving transistor T1 is also connected to a second electrode of the second transistor T2 to receive the data voltage DATA. The second electrode of the driving transistor T1 outputs a light emitting current to the light emitting diode LED and is connected to the anode of the light emitting diode LED via the sixth transistor T6 (hereinafter referred to as an output control transistor). In addition, the second electrode of the driving transistor T1 is also connected to the third transistor T3, and the data voltage DATA applied to the first electrode of the driving transistor T1 is transmitted to the third transistor T3. The gate electrode of the driving transistor T1 is connected to an electrode (hereinafter referred to as a second storage electrode) of the storage capacitor Cst. Thus, the voltage of the gate electrode of the driving transistor T1 changes according to the voltage stored in the storage capacitor Cst, and accordingly, the light emitting current output by the driving transistor T1 is changed. The storage capacitor Cst serves to maintain the voltage of the gate electrode of the driving transistor T1 constant for a frame. The gate electrode of the driving transistor T1 is also connected with the third transistor T3 and thus the data voltage DATA applied to the first electrode of the driving transistor T1 may be transmitted to the gate electrode of the driving transistor T1 through the third transistor T3. The gate electrode of the driving transistor T1 is also connected to the fourth transistor T4 and may be initialized by receiving the first initialization voltage Vinit.

The second transistor T2 is a P-type transistor and has a silicon semiconductor as a semiconductor layer. The second transistor T2 is a transistor that receives the data voltage DATA into the pixel. A gate electrode of the second transistor T2 is connected with the first scan line 151 and an electrode (hereinafter referred to as a lower boost electrode) of the boost capacitor $C_{boost}$. A first electrode of the second transistor T2 is connected to the data line 171. The second electrode of the second transistor T2 is connected to the first electrode of the driving transistor T1. In case that the second transistor T2 is turned on by a negative voltage among the first scan signals GW transmitted through the first scan line 151, the data voltage DATA transmitted through the data line 171 is transmitted to the first electrode of the driving transistor T1, and finally, the data voltage DATA is transmitted to the gate electrode of the driving transistor T1 and stored in the storage capacitor Cst.

The third transistor T3 is an N-type transistor and has an oxide semiconductor as a semiconductor layer. The third transistor T3 electrically connects the second electrode of the driving transistor T1 to the gate electrode of the driving transistor T1. Accordingly, the data voltage DATA is compensated by a threshold voltage of the driving transistor T1 and is stored in a second storage electrode of the storage capacitor Cst. A gate electrode of the third transistor T3 is connected to the second scan line 152, and a first electrode of the third transistor T3 is connected to the second electrode of the driving transistor T1. A second electrode of the third transistor T3 is connected with a second storage electrode of the storage capacitor Cst, the gate electrode of the driving transistor T1, and another electrode of the boost capacitor $C_{boost}$. The third transistor T3 is turned on by a positive voltage of the second scan signal GC received through the second scan line 152, and connects the gate electrode of the driving transistor T1 and the second electrode of the driving transistor T1, and transmits a voltage applied to the gate electrode of the driving transistor T1, to the second storage electrode of the storage capacitor Cst and stores the same in the storage capacitor Cst. In this case, a voltage stored in the storage capacitor Cst is a voltage of the gate electrode of the driving transistor T1 in case that the driving transistor T1 is turned off, and thus the voltage is stored in a state that a threshold voltage of the driving transistor T1 is compensated.

The fourth transistor T4 is an N-type transistor and has an oxide semiconductor as a semiconductor layer. The fourth transistor T4 initializes the gate electrode of the driving transistor T1 and the second storage electrode of the storage capacitor Cst. A gate electrode of the fourth transistor T4 is connected to the initialization control line 153, and a first electrode of the fourth transistor T4 is connected to the first initialization voltage line 127. A second electrode of the fourth transistor T4 is connected to the second electrode of the third transistor T3, the second storage electrode of the storage capacitor Cst, the gate electrode of the driving transistor T1, and an upper boost electrode of the boost capacitor $C_{boost}$. The fourth transistor T4 is turned on by a positive voltage of the initialization control signal GI received through the initialization control line 153, and in this case, the first initialization voltage Vinit is applied to the gate electrode of the driving transistor T1, the second storage electrode of the storage capacitor Cst, and the upper boost electrode of the $C_{boost}$ for initialization.

The fifth transistor T5 and the sixth transistor T6 are P-type transistors, and have a silicon semiconductor as a semiconductor layer.

The fifth transistor T5 serves to transmit the driving voltage ELVDD to the driving transistor T1. A gate electrode of the fifth transistor T5 is connected with the light emission control line 155, a first electrode of the fifth transistor T5 is connected with the driving voltage line 172, and a second electrode of the fifth transistor T5 is connected with the first electrode of the driving transistor T1.

The sixth transistor T6 serves to transfer the light emitting current, output from the driving transistor T1, to the light emitting diode LED. A gate electrode of the sixth transistor T6 is connected with the light emission control line 155, a first electrode of the sixth transistor T6 is connected with the second electrode of the driving transistor T1, and a second electrode of the sixth transistor T6 is connected with the anode of the light emitting diode LED.

The seventh transistor T7 is an N-type transistor and includes an oxide semiconductor as a semiconductor layer. The seventh transistor T7 initializes the anode of the light emitting diode LED. Hereinafter, the seventh transistor T7 is also referred to as an anode initialization transistor. A gate electrode of the seventh transistor T7 is connected with the bypass control line 154, a first electrode of the seventh transistor T7 is connected with the anode of the light emitting diode LED, and a second electrode of the seventh transistor T7 is connected with the second initialization voltage line 128. In case that the seventh transistor T7 is turned on by the positive voltage of the bypass control signal GB flowing through the bypass control line 154, the second initialization voltage AVinit is applied to the anode of the light emitting diode LED and initialized.

Although it has been described that a pixel PX includes seven transistors T1 to T7, two storage capacitors Cst, and a boost capacitor $C_{boost}$, the disclosure is not limited thereto, and the boost capacitor $C_{boost}$ may be excluded in embodiments. In addition, the third transistor T3, the fourth transistor T4, and the seventh transistor T7 are N-type transistors in the embodiment, but only one of them may be formed as an N-type transistor or the other transistors may be formed as N-type transistors.

Hereinabove, the circuit structure of the pixel formed in the display area DA has been described with reference to FIG. 6.

Hereinafter, a detailed planar structure and a layered structure of a pixel formed in a display area DA will be described with reference to FIGS. 7 to 20, and the pixel in the following embodiment includes a photosensor area OPS.

FIGS. 7 to 19 illustrate a structure of each layer according to a manufacturing order of a lower panel layer of a light emitting display device according to an embodiment in detail.

Figure 7:
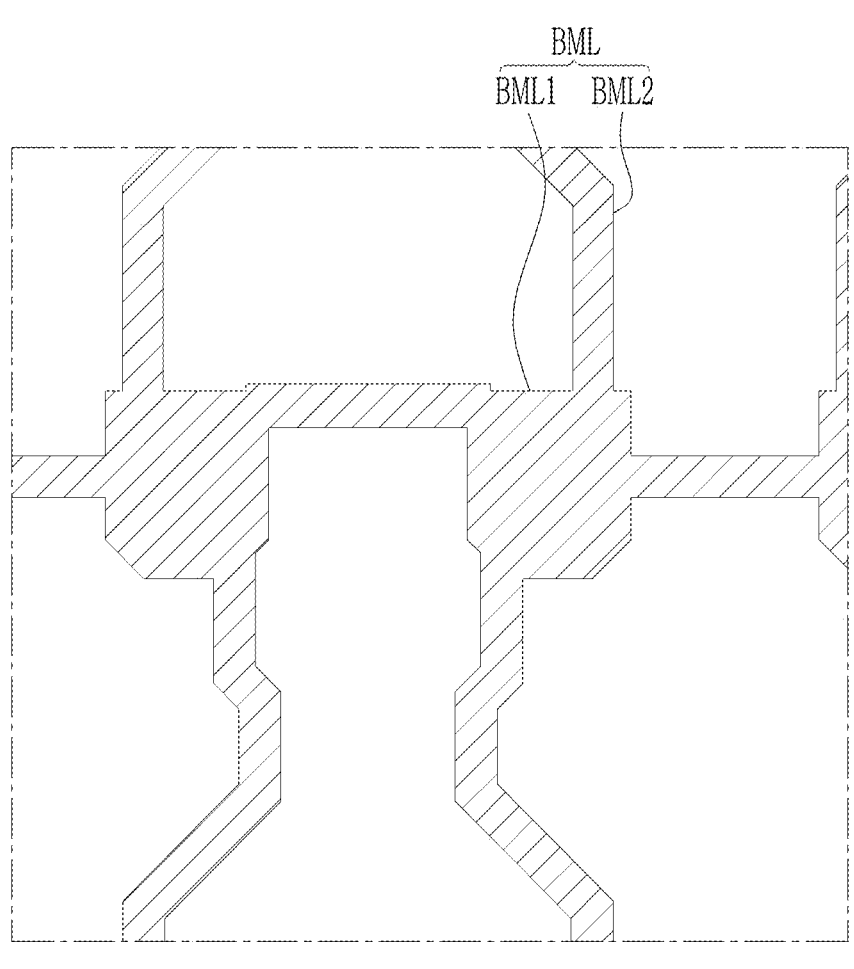
FIG. 7 to FIG. 19 schematically illustrate a structure of each layer according to a manufacturing order of a lower panel layer of a light emitting display device according to an embodiment in detail.
Figure 7:
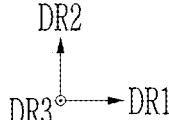

Referring to FIG. 7, a metal layer BML is positioned on a substrate 110.

The substrate 110 may include a material that does not bend due to a rigid feature, such as glass, or a flexible material that can be bent, such as plastic or a polyimide. In case that the substrate 110 is a flexible substrate, as shown in FIG. 20, the substrate 110 may have a two-layer structure of a polyimide and a barrier layer formed of an inorganic insulating material thereon.

The metal layer BML includes expansion portions BML1 and connection portions BML2 that connect the expansion portions BML1 to each other. The expansion portion BML1 of the metal layer BML may be formed at a position overlapping a channel 1132 of a driving transistor T1 in a plan view among the subsequent first semiconductor layers. The metal layer BML is also called a lower shielding layer, may include a metal or a metal alloy such as copper (Cu), molybdenum (Mo), aluminum (Al), and titanium (Ti), may additionally include amorphous silicon, and may be a single layer or multiple layers.

Figure 20:
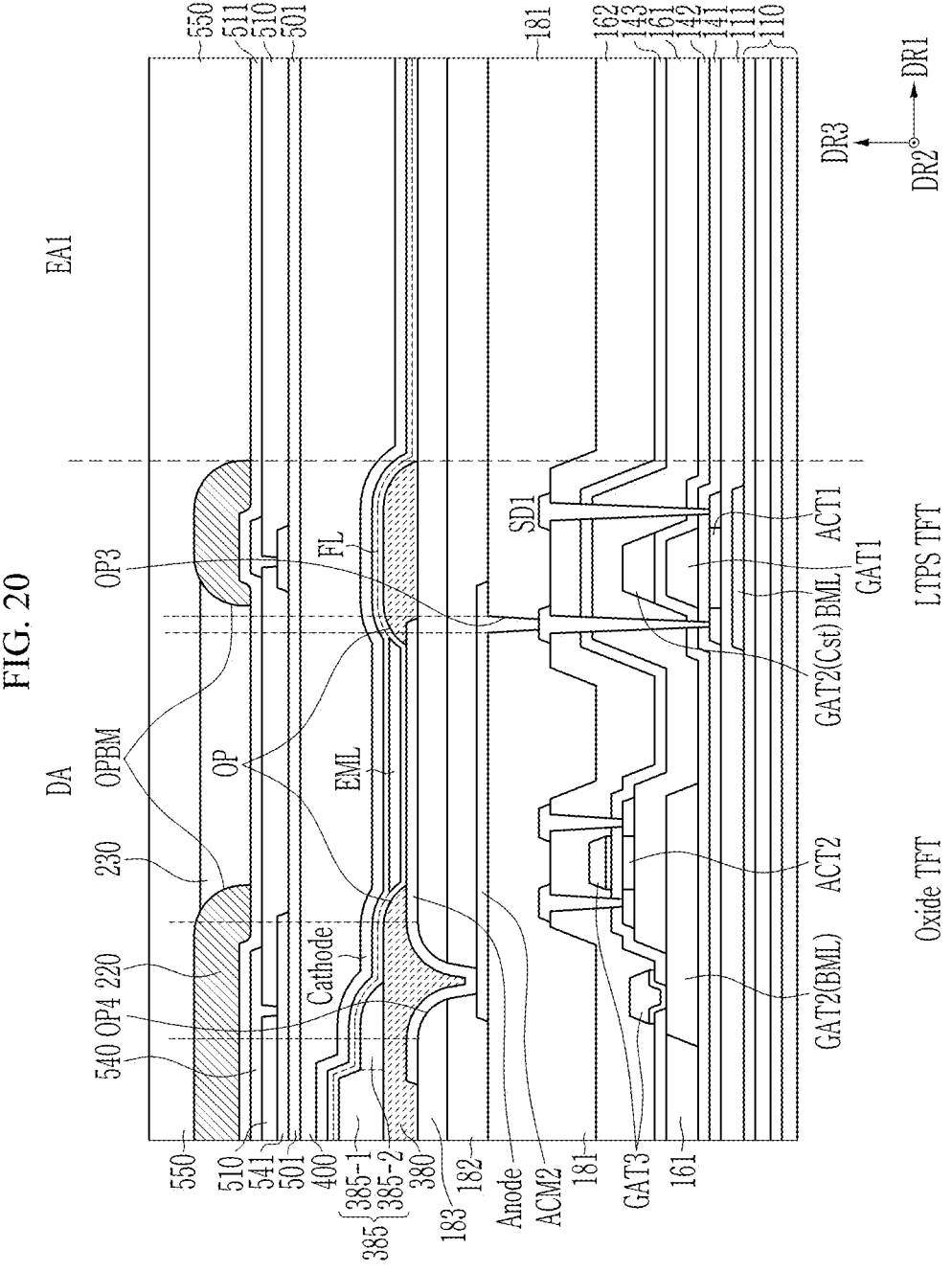
FIG. 20 is a schematic cross-sectional view of the light emitting display device according to the embodiment.

Referring to FIG. 20, a buffer layer 111 covering the substrate 110 and the metal layer BML is positioned on the substrate 110 and the metal layer BML. The buffer layer 111 serves to block penetration of impurity elements into a first semiconductor layer 130, and may be an inorganic insulating layer including a silicon oxide ($SiO_x$), a silicon nitride ($SiN_x$), or a silicon oxynitride ($SiO_xN_y$).

Figure 8:
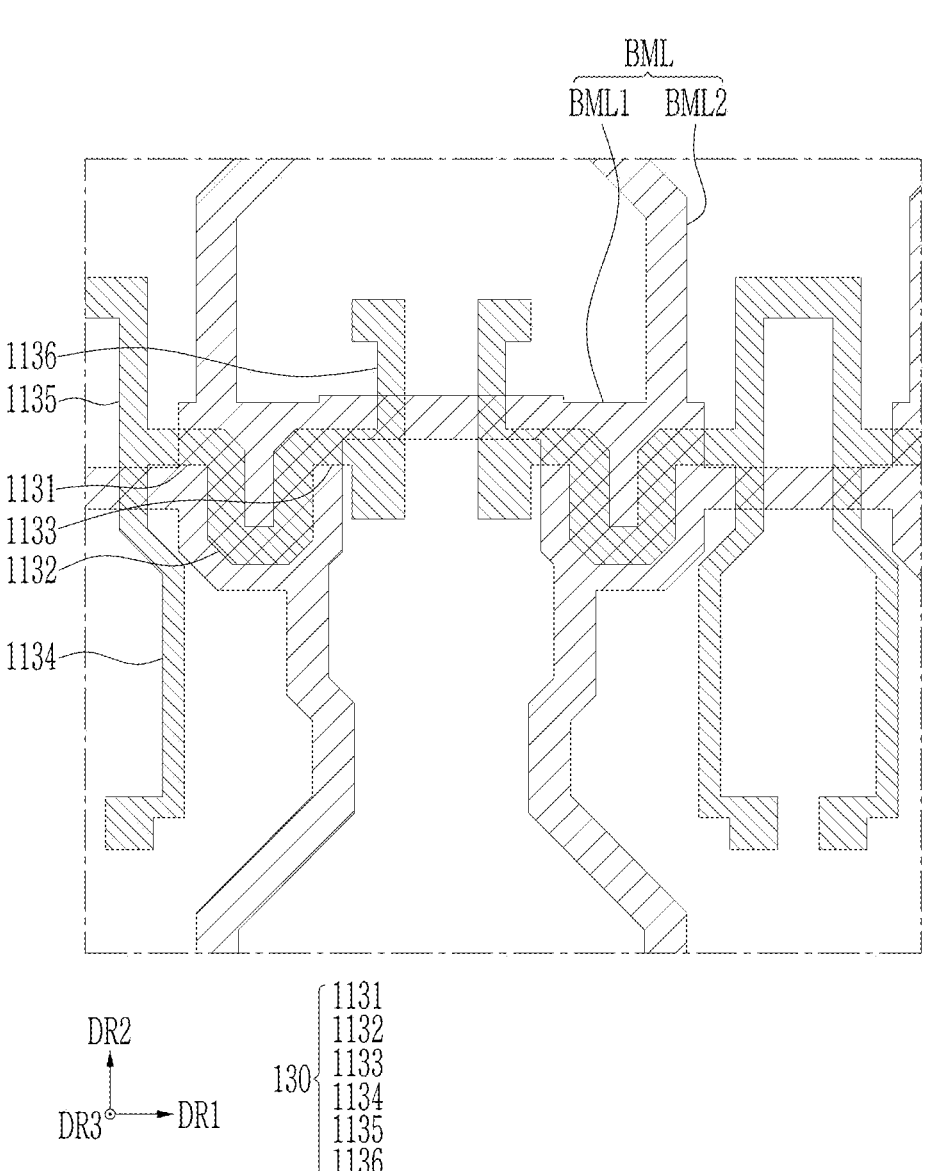

As shown in FIG. 8, the first semiconductor layer 130 formed of a silicon semiconductor (e.g., a polycrystalline semiconductor) is positioned on the buffer layer 111. The first semiconductor layer 130 includes a channel 1132, a first region 1131, and a second region 1133 of the driving transistor T1. In addition, the first semiconductor layer 130 includes not only the channel of the driving transistor T1 but also channels of the second transistor T2, the fifth transistor T5, and the sixth transistor T6, and includes a region having a conductive layer feature on sides of each channel by plasma treatment or doping to serve as a first electrode and a second electrode. A transistor including the first semiconductor layer 130 may be referred to as a polycrystalline semiconductor transistor.

The channel 1132 of the driving transistor T1 may have a U-shaped curved shape in a plan view. However, the shape of channel 1132 of the driving transistor T1 is not limited thereto, and may be variously changed. For example, the channel 1132 of the driving transistor T1 may be bent into a different shape or may have a bar shape. A first region 1131 and a second region 1133 of the driving transistor T1 may be positioned on sides of the channel 1132 of the driving transistor T1. The first region 1131 and the second region 1133 positioned in the first semiconductor layer serve as the first electrode and the second electrode of the driving transistor T1.

A channel, a first region, and a second region of the second transistor T2 are positioned in a portion 1134 in the first semiconductor layer 130, extending downward from a first area 1131 of the driving transistor T1. A channel, a first region, and a second region of the fifth transistor T5 are positioned in a portion 1135 extending upward from the first area 1131 of the driving transistor T1. A channel, a first region, and a second region of the sixth transistor T6 are positioned in a portion 1136 extending upward from a second area 1133 of the driving transistor T1.

Referring to FIG. 20, a first gate insulating layer 141 may be positioned on the first semiconductor layer 130 that includes the channel 1132, the first region 1131, and the second region 1133 of the driving transistor T1. The first gate insulating layer 141 may be an inorganic insulating layer including a silicon oxide ($SiO_x$), a silicon nitride ($SiN_x$), or a silicon oxynitride ($SiO_xN_y$).

Figure 9:
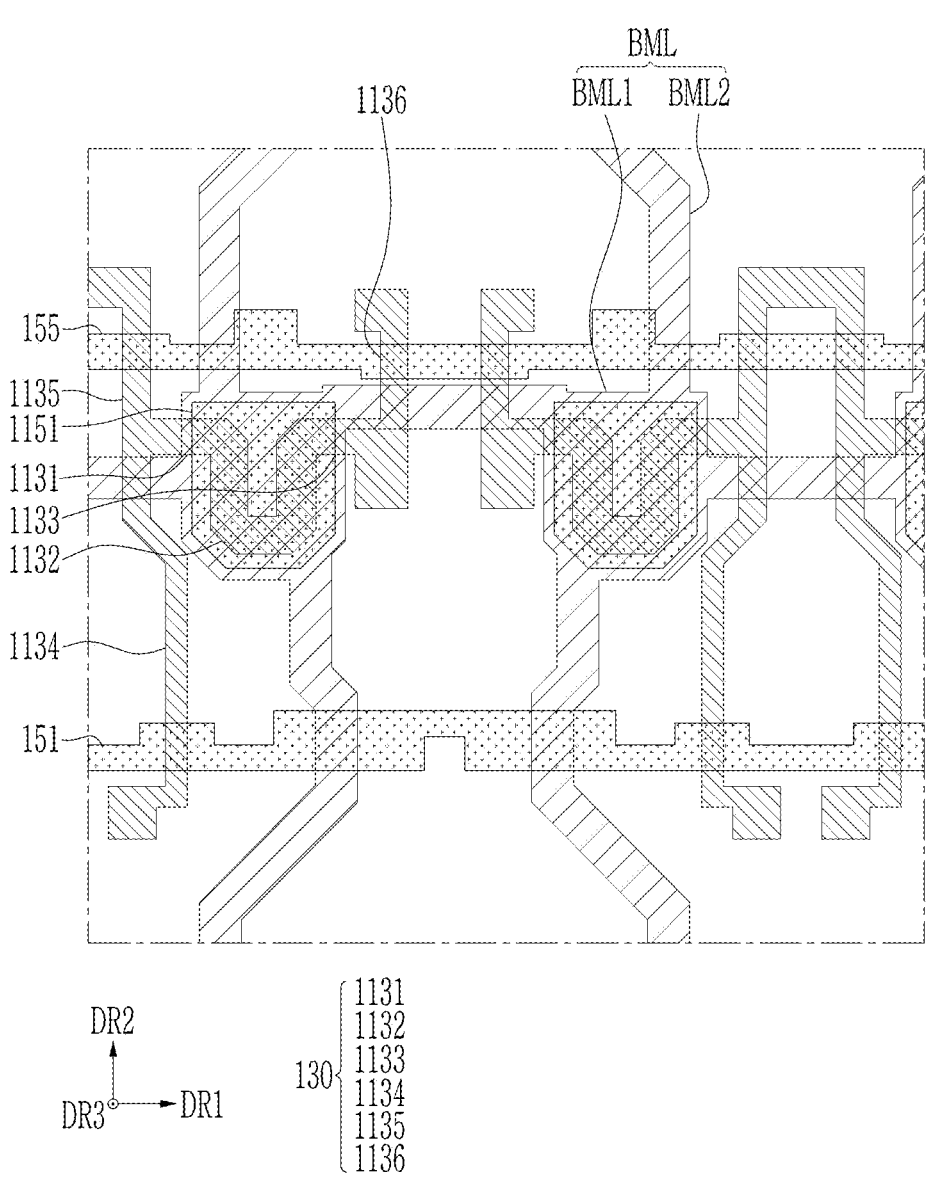

Referring to FIG. 9, a first gate conductive layer including a gate electrode 1151 of the driving transistor T1 may be positioned on the first gate insulating layer 141. The first gate conductive layer includes gate electrodes of the second transistor T2, the fifth transistor T5, and the sixth transistor T6 as well as the driving transistor T1. The gate electrode 1151 of the driving transistor T1 may overlap the channel 1132 of the driving transistor T1. The channel 1132 of the driving transistor T1 is covered by the gate electrode 1151 of the driving transistor T1.

The first gate conductive layer may further include a first scan line 151 and a light emission control line 155. The first scan line 151 and the light emission control line 155 may extend in an approximately horizontal direction (hereinafter also referred to as a first direction). The first scan line 151 may be connected to the gate electrode of the second transistor T2. The first scan line 151 may be formed integrally with the gate electrode of the second transistor T2.

The light emission control line 155 may be connected with a gate electrode of the fifth transistor T5 and a gate electrode of the sixth transistor T6, and the light emission control line 155 and the gate electrodes of the fifth transistor T5 and the sixth transistor T6 may be integrally formed.

The first gate conductive layer may include a metal such as copper (Cu), molybdenum (Mo), aluminum (Al), or titanium (Ti), or a metal alloy thereof, and may be formed as a single layer or multiple layers.

After the first gate conductive layer including the gate electrode 1151 of the driving transistor T1 is formed, a plasma treatment or a doping process is performed such that an exposed portion of the first semiconductor layer becomes conductive. For example, the first semiconductor layer covered by the first gate conductive layer is not conductive, and the portion of the first semiconductor layer not covered by the first gate conductive layer, and may have the same feature as the conductive layer. As a result, the transistor including the conductive portion has a P-type transistor feature, and the driving transistor T1, the second transistor T2, the fifth transistor T5, and the sixth transistor T6 may be P-type transistors.

Referring to FIG. 20, a second gate insulating layer 142 may be positioned on the first gate conductive layer including the gate electrode 1151 of the driving transistor T1 and the first gate insulating layer 141. The second gate insulating layer 142 may be an inorganic insulating layer including a silicon oxide ($SiO_x$), a silicon nitride ($SiN_x$), or a silicon oxynitride ($SiO_xN_y$).

Figure 10:
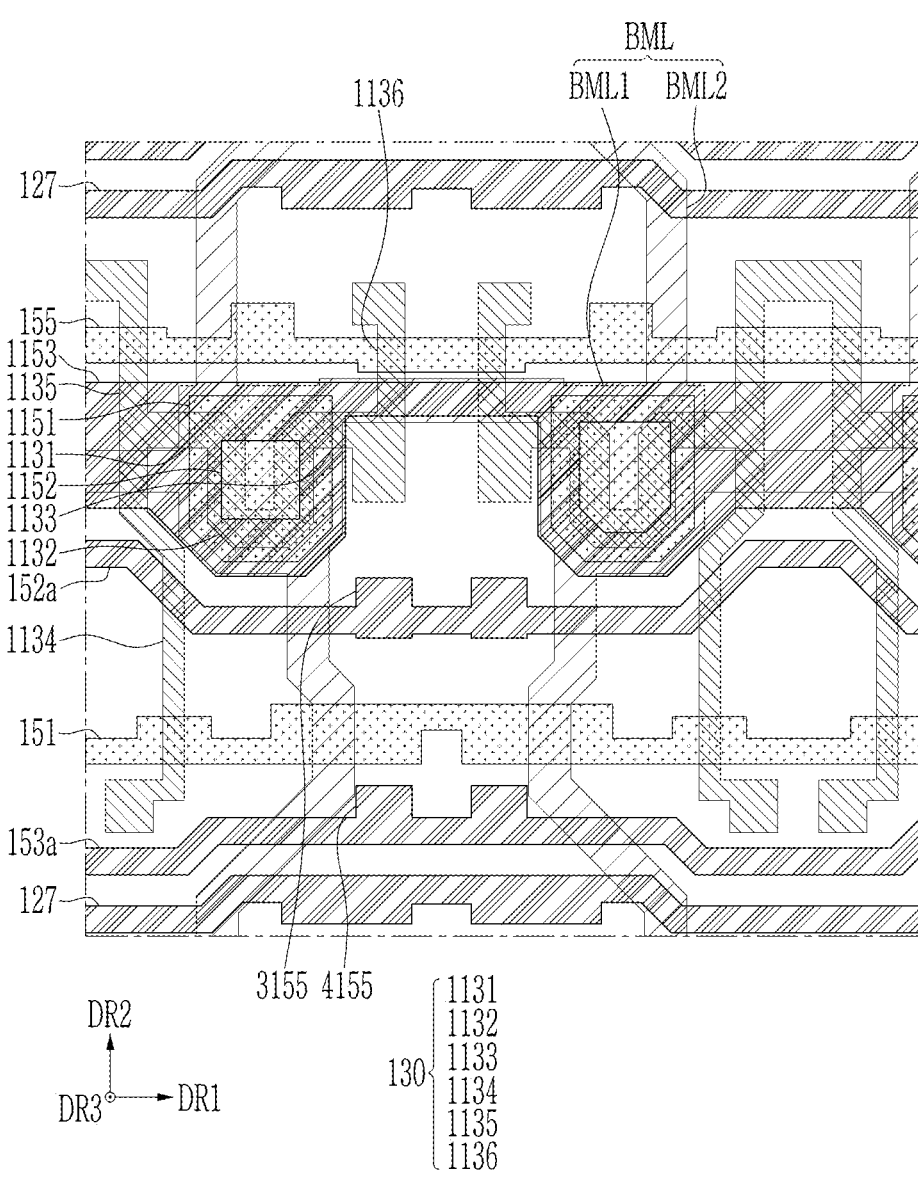

Referring to FIG. 10, a second gate conductive layer that includes a first storage electrode 1153 of the storage capacitor Cst, a lower shielding layer 3155 of the third transistor T3, and a lower shielding layer 4155 of the fourth transistor T4 may be positioned on the second gate insulating layer 142. The lower shielding layers 3155 and 4155 are positioned below the channels of the third transistor T3 and the fourth transistor T4, respectively, and may serve to shield light or electromagnetic interference (EMI) provided to the channel from the lower side.

The first storage electrode 1153 overlaps the gate electrode 1151 of the driving transistor T1 to form the storage capacitor Cst. An opening 1152 is formed in the first storage electrode 1153 of the storage capacitor Cst. The opening 1152 of the first storage electrode 1153 of the storage capacitor Cst may overlap the gate electrode 1151 of the driving transistor T1. The first storage electrode 1153 is extended in the horizontal direction (first direction) and is connected to the adjacent first storage electrode 1153.

The lower shielding layer 3155 of the third transistor T3 may overlap the channel 3137 and the gate electrode 3151 of the third transistor T3. The lower shielding layer 4155 of the fourth transistor T4 may overlap the channel 4137 and the gate electrode 4151 of the fourth transistor T4.

The second gate conductive layer may further include a lower second scan line 152a, a lower initialization control line 153a, and a first initialization voltage line 127. The lower second scan line 152a, the lower initialization control line 153a, and the first initialization voltage line 127 may extend in an approximately horizontal direction (first direction). The lower second scan line 152a may be connected to the lower shielding layer 3155 of the third transistor T3. The lower second scan line 152a may be formed integrally with the lower shielding layer 3155 of the third transistor T3. The lower initialization control line 153a may be connected to the lower shielding layer 4155 of the fourth transistor T4. The lower initialization control line 153a may be formed integrally with the lower shielding layer 4155 of the fourth transistor T4.

The second gate conductive layer GAT2 may include a metal such as copper (Cu), molybdenum (Mo), aluminum (Al), or titanium (Ti), or a metal alloy thereof, and may be formed as a single layer or multiple layers.

Referring to FIG. 20, a first interlayer insulating layer 161 may be positioned on the second gate conductive layer GAT2 that includes the first storage electrode 1153 of the storage capacitor Cst, the lower shielding layer 3155 of the third transistor T3, and the lower shielding layer 4155 of the fourth transistor T4. The first interlayer insulating layer 161 may include an inorganic insulating layer including a silicon oxide ($SiO_x$), a silicon nitride ($SiN_x$), or a silicon oxynitride ($SiO_xN_y$), and the inorganic insulating material may be formed to be thick in embodiments.

Figure 11:
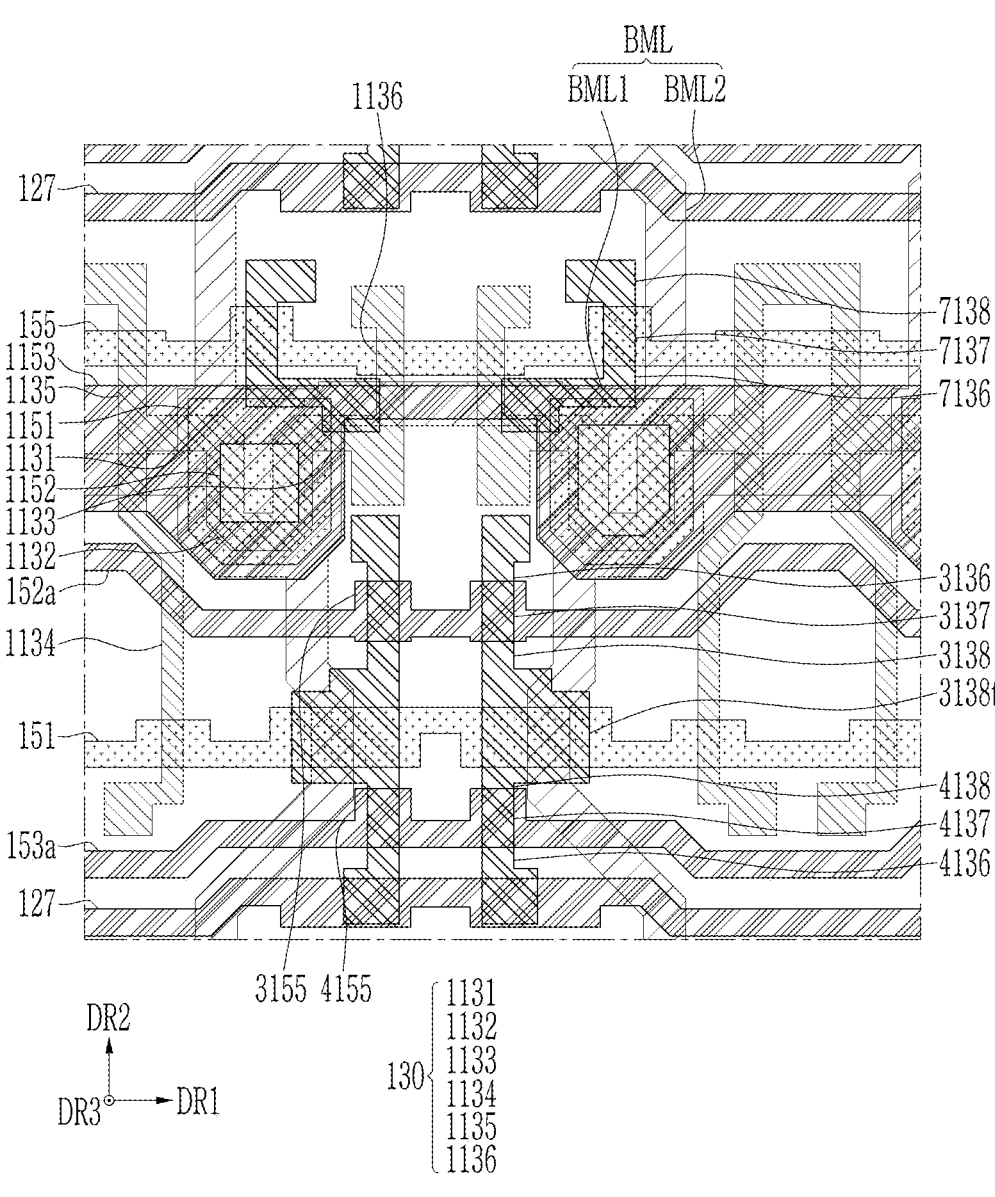

Referring to FIG. 11, an oxide semiconductor layer that includes a channel 3137, a first region 3136, and a second region 3138 of the third transistor T3, a channel 4137, a first region 4136, and a second region 4138 of the fourth transistor T4, and a channel 7137, a first region 7136, and a second region 7138 of the seventh transistor T7 may be positioned on the first interlayer insulating layer 161. In addition, the oxide semiconductor layer may further include an upper boost electrode 3138t of the boost capacitor $C_{boost}$.

The channel 3137, the first region 3136, and the second region 3138 of the third transistor T3 and the channel 4137, the first region 4136, and the second region 4138 of the fourth transistor T4 may be connected to each other and thus may be integrally formed. A channel 7137, a first region 7136, and a second region 7138 of the seventh transistor T7 are separated from the channel 3137 of the third transistor T3 and the channel 4137 of the fourth transistor T4 such that the oxide semiconductor layer may be divided into two separated portions.

The first region 3136 and the second region 3138 of the third transistor T3 are positioned at opposite sides of the channel 3137 of the third transistor T3, and the first region 4136 and the second region 4138 of the fourth transistor T4 are positioned at opposite sides of the channel 4137 of the fourth transistor T4. The second region 3138 of the third transistor T3 is connected to the second region 4138 of the fourth transistor T4. The channel 3137 of the third transistor T3 overlaps the lower shielding layer 3155, and the channel 4137 of the fourth transistor T4 overlaps the lower shielding layer 4155. A first region 7136 and a second region 7138 of the seventh transistor T7 are positioned on opposite sides of the channel 7137 of the seventh transistor T7. A transistor including an oxide semiconductor layer may be referred to as an oxide semiconductor transistor.

The upper boost electrode 3138t of the boost capacitor $C_{boost}$ is positioned between the second region 3138 of the third transistor T3 and the second region 4138 of the fourth transistor T4. The upper boost electrode 3138t of the boost capacitor $C_{boost}$ overlaps a part (also referred to as a lower boost electrode of the boost capacitor $C_{boost}$) of the first scan line 151 such that the boost capacitor $C_{boost}$ is formed.

Referring to FIG. 20, a third gate insulating layer 143 may be positioned on the oxide semiconductor layer including the channel 3137, the first region 3136, and the second region 3138 of the third transistor T3, the channel 4137, the first region 4136, and the second region 4138 of the fourth transistor T4, the channel 7137, the first region 7136, and the second region 7138 of the seventh transistor T7, and the upper boost electrode 3138t of the boost capacitor $C_{boost}$.

The third gate insulating layer 143 may be positioned on the entire surface of the oxide semiconductor layer and the first interlayer insulating layer 161. Thus, the third gate insulating layer 143 may cover the channel 3137, the first region 3136, and the second region 3138 of the third transistor T3, the channel 4137, the first region 4136, and the second region 4138 of the fourth transistor T4, and a top surface and a side surface of the upper boost electrode 3138t of the boost capacitor $C_{boost}$. However, the embodiment is not limited thereto, and the third gate insulating layer 143 may not be positioned over the entire surface of the oxide semiconductor layer and the first interlayer insulating layer 161. For example, the third gate insulating layer 143 may overlap the channel 3137 of the third transistor T3 and may not overlap the first region 3136 and the second region 3138. In addition, the third gate insulating layer 143 may overlap the channel 4137 of the fourth transistor T4 and may not overlap the first region 4136 and the second region 4138.

The third gate insulating layer 143 may include an inorganic insulating layer including a silicon oxide ($SiO_x$), a silicon nitride ($SiN_x$), or a silicon oxynitride ($SiO_xN_y$).

Figure 12:
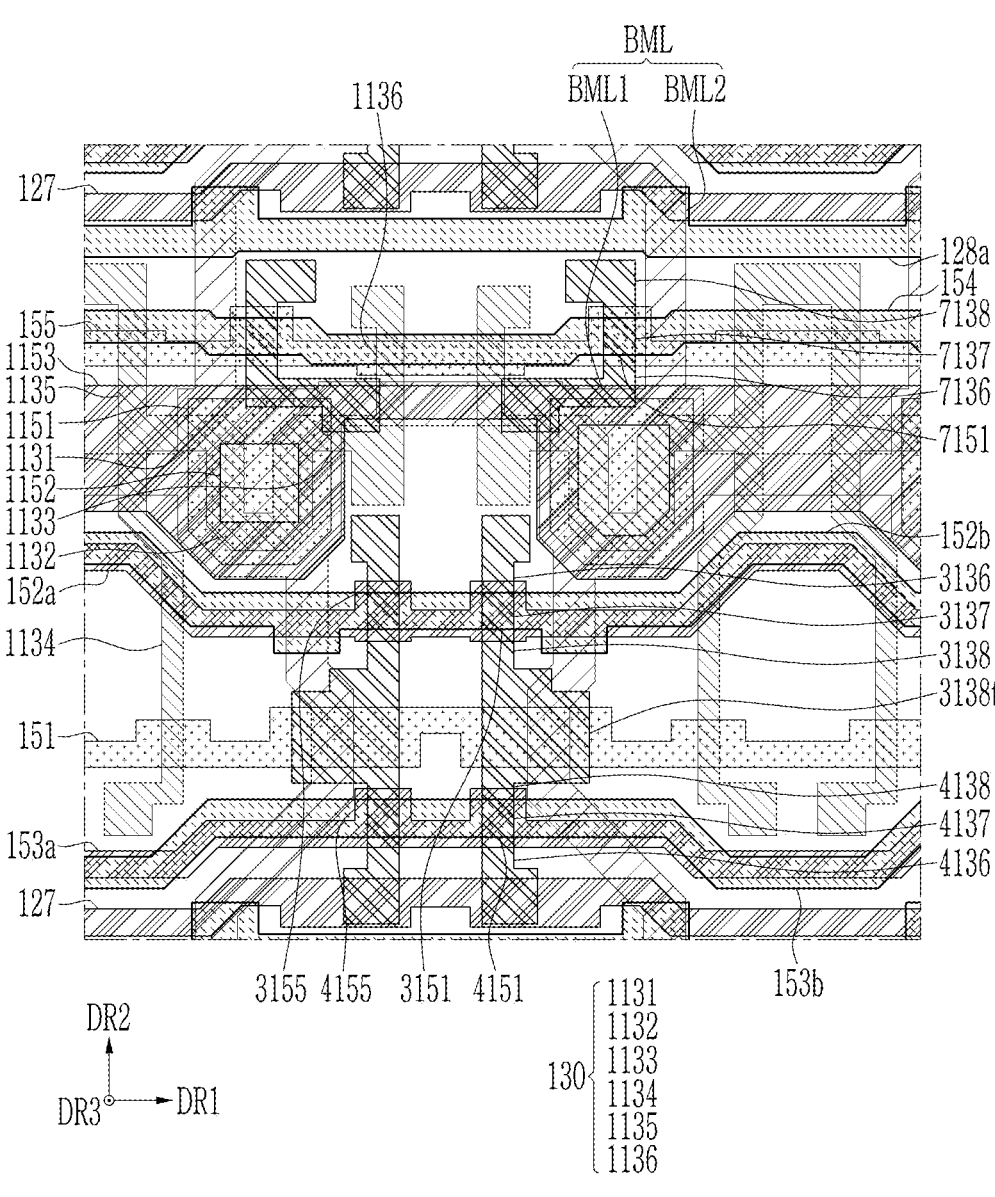

Referring to FIG. 12, a third gate conductive layer including the gate electrode 3151 of the third transistor T3, the gate electrode 4151 of the fourth transistor T4, and the gate electrode 7151 of the seventh transistor T7 may be positioned on the third gate insulating layer 143.

The gate electrode 3151 of the third transistor T3 may overlap the channel 3137 of the third transistor T3. The gate electrode 3151 of the third transistor T3 may overlap the lower shielding layer 3155 of the third transistor T3.

The gate electrode 4151 of the fourth transistor T4 may overlap the channel 4137 of the fourth transistor T4. The gate electrode 4151 of the fourth transistor T4 may overlap the lower shielding layer 4155 of the fourth transistor T4.

The gate electrode 7151 of the seventh transistor T7 may overlap the channel 7137 of the seventh transistor T7.

The third gate conductive layer may further include an upper second scan line 152b, an upper initialization control line 153b, and a bypass control line 154.

The upper second scan line 152b, the upper initialization control line 153b, and the bypass control line 154 may extend in an approximately horizontal direction (first direction). The upper second scan line 152b forms the second scan line 152 together with the lower second scan line 152a. The upper second scan line 152b may be connected to the gate electrode 3151 of the third transistor T3. The upper second scan line 152b may be formed integrally with the gate electrode 3151 of the third transistor T3. The upper initialization control line 153b forms the initialization control line 153 together with the lower initialization control line 153*a*. The upper initialization control line 153*b* may be connected to the gate electrode 4151 of the fourth transistor T4. The upper initialization control line 153*b* may be formed integrally with the gate electrode 4151 of the fourth transistor T4.

The bypass control line 154 may be connected to the gate electrode 7151 of the seventh transistor T7, and the bypass control line 154 may be formed integrally with the gate electrode 7151 of the seventh transistor T7.

In addition, the third gate conductive layer may further include a lower second initialization voltage line 128*a*. The lower second initialization voltage line 128*a* may extend in an approximately horizontal direction (first direction), and a second initialization voltage AVinit is applied.

A third gate conductive layer GAT3 may include a metal such as copper (Cu), molybdenum (Mo), aluminum (Al), titanium (Ti), and the like or a metal alloy thereof, and may be formed of a single layer or multilayers.

After forming a third gate conductive layer including the gate electrode 3151 of the third transistor T3, the gate electrode 4151 of the fourth transistor T4, and the gate electrode 7151 of the seventh transistor T7, a portion of the oxide semiconductor layer covered by the third gate conductive layer is formed as a channel and a portion of the oxide semiconductor not covered by the third gate conductive layer is conductive through the plasma treatment or doping process. The channel 3137 of the third transistor T3 may be positioned under the gate electrode 3151 to overlap the gate electrode 3151. The first region 3136 and the second region 3138 of the third transistor T3 may not overlap the gate electrode 3151. The channel 4137 of the fourth transistor T4 may be positioned under the gate electrode 4151 to overlap the gate electrode 4151. The first region 4136 and the second region 4138 of the fourth transistor T4 may not overlap the gate electrode 4151. The channel 7137 of the seventh transistor T7 may be positioned below the gate electrode 7151 to overlap the gate electrode 7151. The first region 7136 and the second region 7138 of the seventh transistor T7 may not overlap the gate electrode 7151. The upper boost electrode 3138*t* does not overlap the third gate conductive layer, and thus it may have features substantially identical or similar to the conductor's conductivity. A transistor including an oxide semiconductor layer may have features of an N-type transistor.

Referring to FIG. 20, a second interlayer insulating layer 162 may be positioned on the third gate conductive layer that includes the gate electrode 3151 of the third transistor T3, the gate electrode 4151 of the fourth transistor T4, and the gate electrode 7151 of the seventh transistor T7. The second interlayer insulating layer 162 may have a single-layer or multi-layer structure. The second interlayer insulating layer 162 may include an inorganic insulating layer including a silicon oxide ($SiO_x$), a silicon nitride ($SiN_x$), or a silicon oxynitride ($SiO_xN_y$), and may include an organic material in embodiments.

Figure 13:
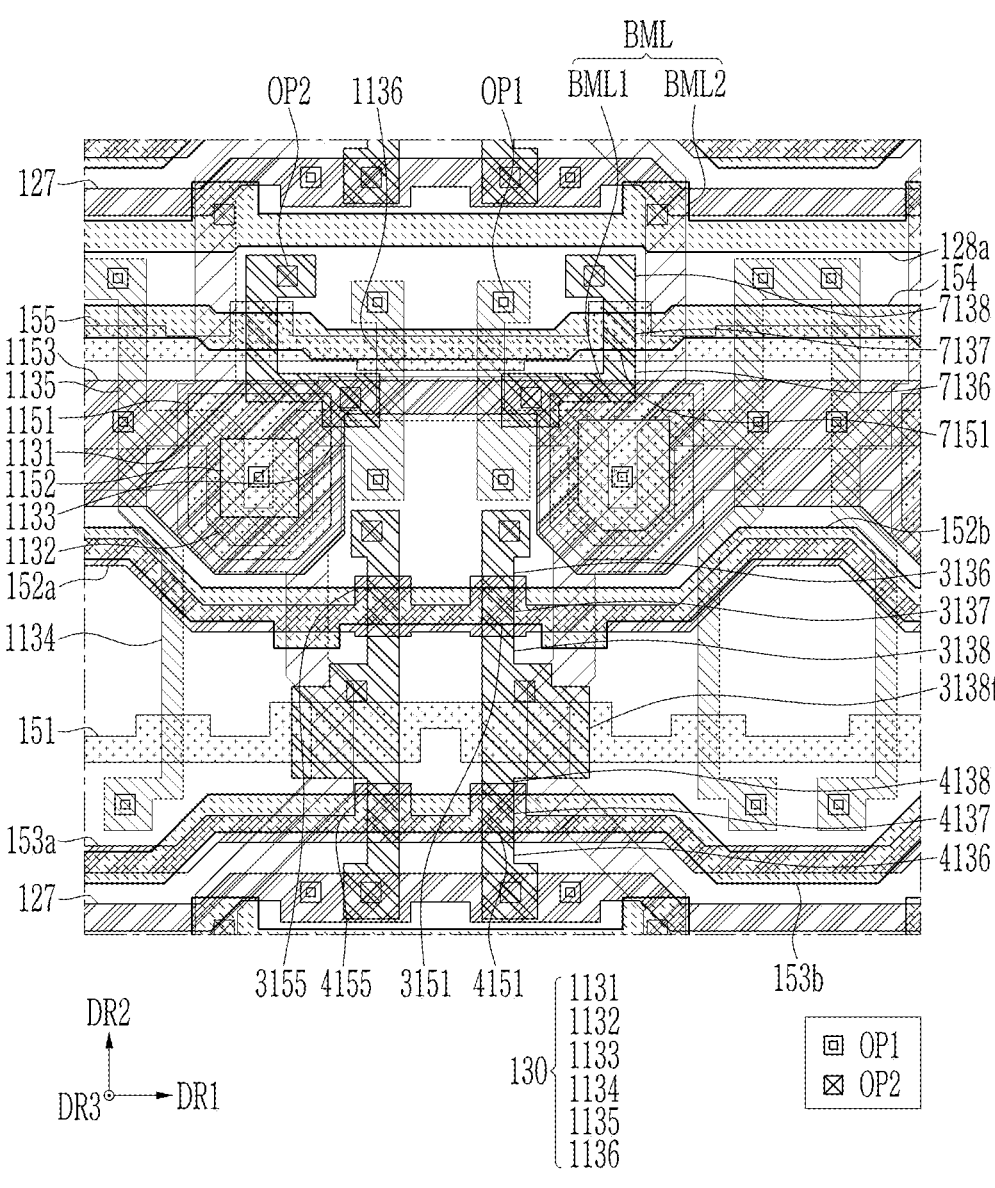

Referring to FIG. 13, the second interlayer insulating layer 162 may have two types of openings OP1 and OP2. The two types of openings OP1 and OP2 may be formed using different masks.

The opening OP1 is formed in at least one of the second interlayer insulating layer 162, the third gate insulating layer 143, the first interlayer insulating layer 161, the second gate insulating layer 142, and the first gate insulating layer 141, and may expose the first semiconductor layer 130, the first gate conductive layer, or the second gate conductive layer.

The opening OP2 is formed in the second interlayer insulating layer 162 and/or the third gate insulating layer 143, and may expose the oxide semiconductor layer or the third gate conductive layer.

One of the openings OP1 overlaps at least a part of the gate electrode 1151 of the driving transistor T1, and may also be formed in the third gate insulating layer 143, the first interlayer insulating layer 161, and the second gate insulating layer 142. In this case, one of the openings OP1 may overlap the opening 1152 of the first storage electrode 1153, and may be positioned in the opening 1152 of the first storage electrode 1153.

One of the openings OP2 may overlap at least a part of the boost capacitor $C_{boost}$, and may be further formed in the third gate insulating layer 143.

Another one of the openings OP1 overlaps at least a part of the second region 1133 of the driving transistor T1, and may be formed in the third gate insulating layer 143, the first interlayer insulating layer 161, the second gate insulating layer 142, and the first gate insulating layer 141.

Another one of the openings OP2 overlaps at least a part of the first region 3136 of the third transistor T3, and may be formed in the third gate insulating layer 143.

Figure 14:
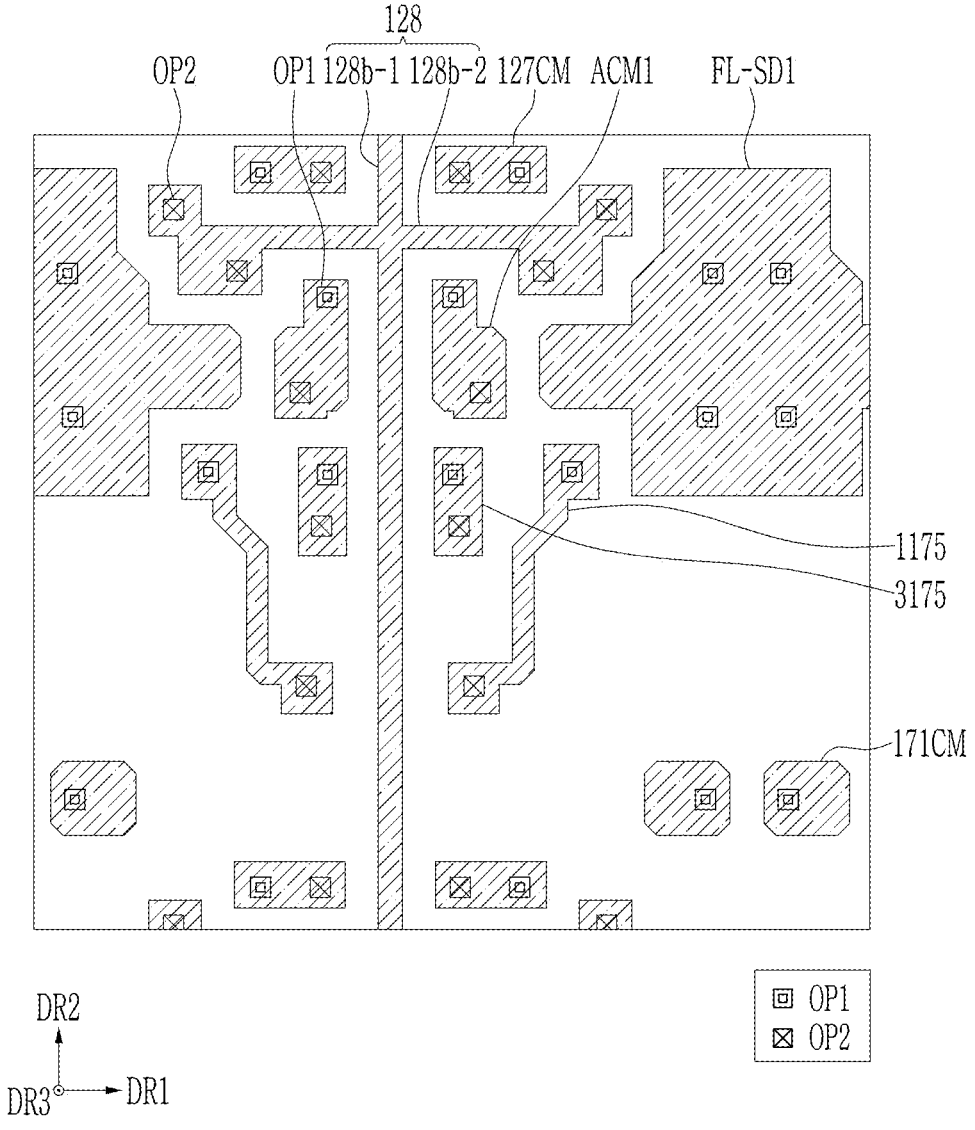
Figure 15:
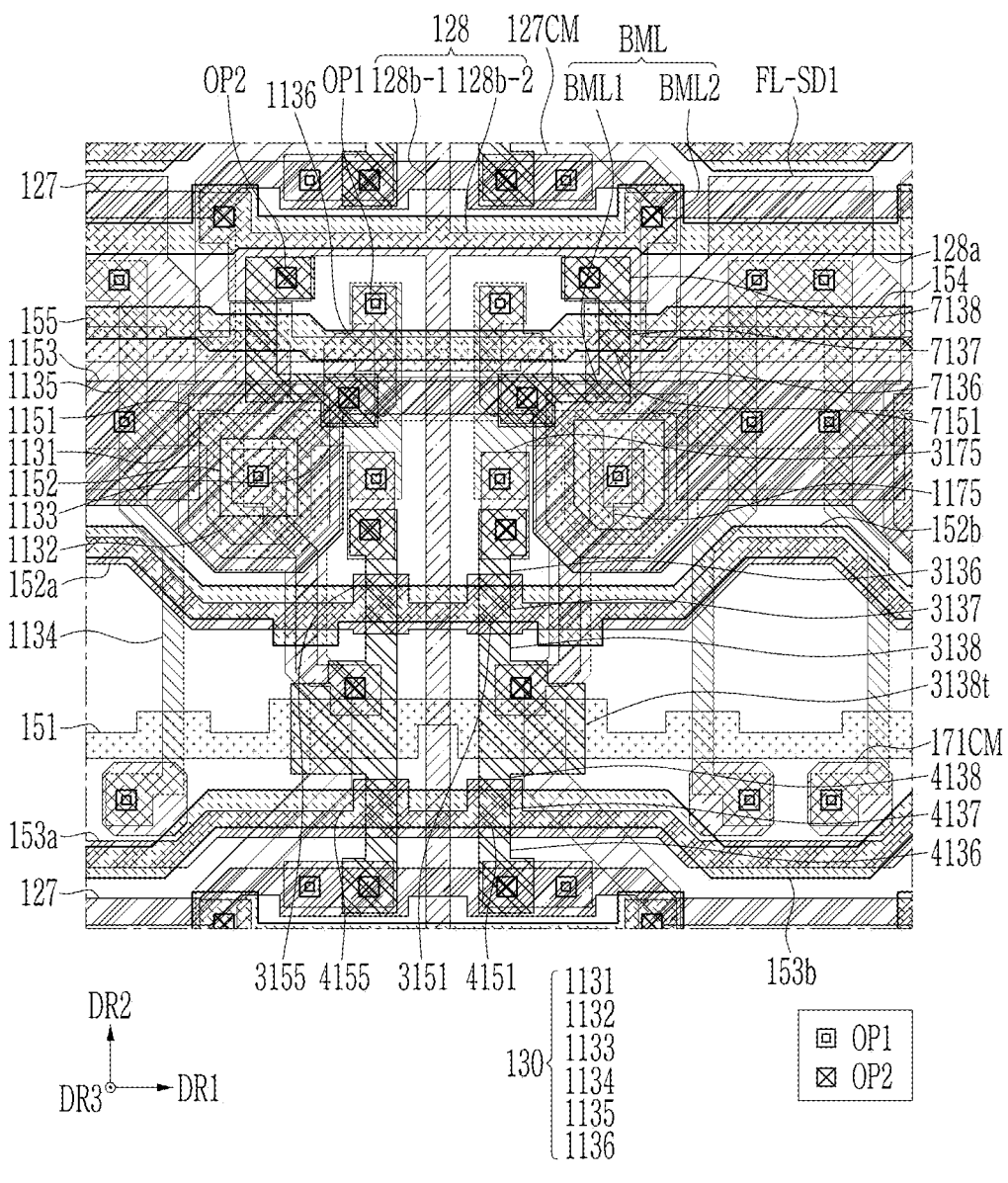

Referring to FIGS. 14 and 15, a first data conductive layer including a first connection electrode 1175 and a second connection electrode 3175 may be positioned on the second interlayer insulating layer 162. FIG. 14 is a schematic plan view of the first data conductive layer and openings OP1 and OP2 considering difficulty in recognition of the first data conductive layer in FIG. 15, and FIG. 15 is a schematic plan view of all layers below the first data conductive layer.

An end of the first connection electrode 1175 may overlap the gate electrode 1151 of the driving transistor T1. The end of the first connection electrode 1175 may be connected to the gate electrode 1151 of the driving transistor T1 through the opening OP1 and the opening 1152 of the first storage electrode 1153. Another end of the first connection electrode 1175 may overlap the boost capacitor $C_{boost}$. The other end of the first connection electrode 1175 may be connected with the upper boost electrode 3138*t* of the boost capacitor $C_{boost}$ through the opening OP2. Thus, the gate electrode 1151 of the driving transistor T1 and the upper boost electrode 3138*t* of the boost capacitor $C_{boost}$ may be connected by the first connection electrode 1175. In this case, the gate electrode 1151 of the driving transistor T1 may also be connected to the second region 3138 of the third transistor T3 and the second region 4138 of the fourth transistor T4 by the first connection electrode 1175.

An end of the second connection electrode 3175 may overlap the second region 1133 of the driving transistor T1. The end of the second connection electrode 3175 may be connected to the second region 1133 of the driving transistor T1 through the opening OP1. Another end of the second connection electrode 3175 may overlap the first region 3136 of the third transistor T3. The other end of the second connection electrode 3175 may be connected to the first region 3136 of the third transistor T3 through the opening OP2.

Accordingly, the second region 1133 of the driving transistor T1 and the first region 3136 of the third transistor T3 may be connected by the second connection electrode 3175, and the first semiconductor layer 130 and the oxide semiconductor layer are electrically connected.

The first data conductive layer may further include a second initialization voltage line 128*b*. The second initialization voltage line 128*b* includes a wiring portion 128*b*-1 extending in the vertical direction (second direction) and a first extension portion 128*b*-2 protruded from sides of the wiring portion 128*b*-1 in the horizontal direction (first direction), and an end of the first extension portion 128*b*-2 may be extended. An extended end of the first extension 128*b*-2 is electrically connected to the second initialization voltage line 128*a* positioned on the third gate conductive layer and the second region 7138 of the seventh transistor T7 positioned on the oxide semiconductor layer through two different openings OP2. As a result, the second initialization voltage line 128*a* positioned on the third gate conductive layer, and is also transmitted in the vertical direction (second direction) through the second initialization voltage line 128*b* positioned on the first data conductive layer. In addition, the second initialization voltage AVinit is provided to the second region 7138 of the seventh transistor T7.

The first data conductive layer may further include connection portions 127CM and 171CM, an anode connection member ACM1, and an expansion portion FL-SD1.

The connection portion 127CM is connected to the first initialization voltage line 127 of the second gate conductive layer through the opening OP1, and transmits the first initialization voltage Vinit, flowing through the first initialization voltage line 127 connected to a portion 4136 of the second semiconductor layer (oxide semiconductor layer) through the opening OP2, to the fourth transistor T4 of the oxide semiconductor layer.

The connection portion 171CM is electrically connected to an end of the portion 1134 of the first semiconductor layer 130, for example, the second transistor T2, through the opening OP1.

The anode connection member ACM1 is electrically connected to an end of a portion 1136 of the first semiconductor layer 130, for example, the sixth transistor T6, through the opening OP1.

The expansion portion FL-SD1 is formed wide in order to planarize the anode positioned thereon. In addition, the expansion portion FL-SD1 is connected to a portion 1135 of the first semiconductor layer 130, for example, the fifth transistor T5, through the opening OP1, and is also electrically connected to the first storage electrode 1153 through the opening OP1.

The first data conductive layer SD1 may include a metal such as aluminum (Al), copper (Cu), molybdenum (Mo), titanium (Ti), or a metal alloy thereof, and may be formed as a single layer or multiple layers.

Referring to FIG. 20, a first organic layer 181 (hereinafter also referred to as a lower organic layer) may be positioned on the first data conductive layer including the first connection electrode 1175 and the second connection electrode 3175. The first organic layer 181 may be an organic insulator including an organic material, and the organic material may include at least one material selected from a group consisting of a polyimide, a polyamide, an acryl resin, benzocyclobutene, and a phenol resin.

Figure 16:
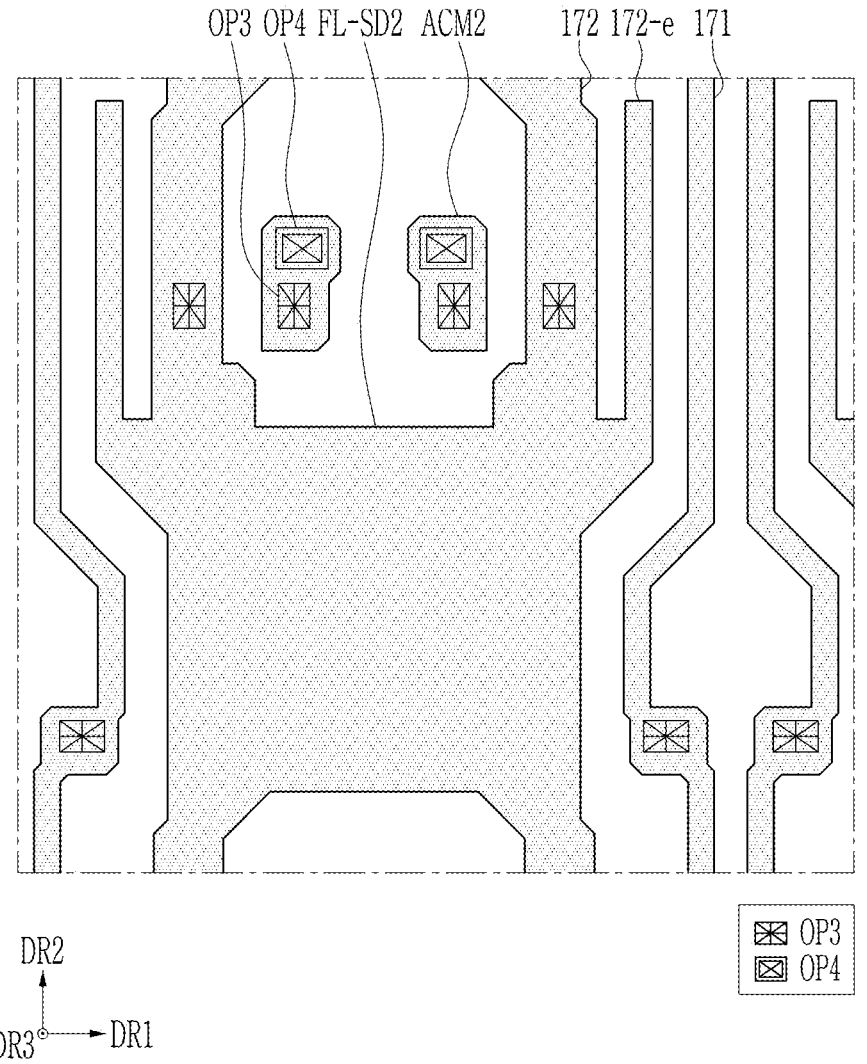
Figure 17:
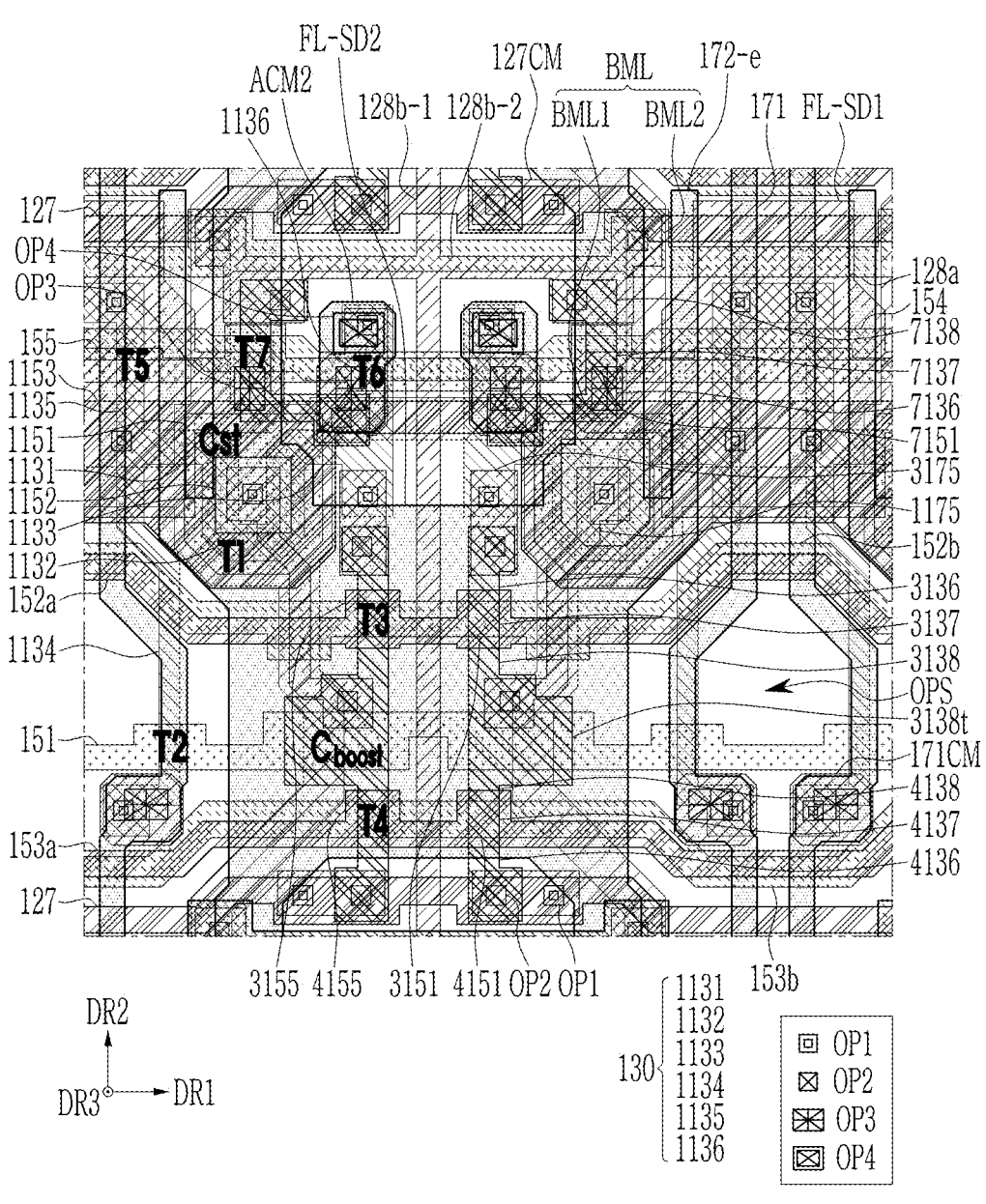

Referring to FIGS. 16, 17, and 20, a lower organic layer opening OP3 is positioned in the first organic layer 181. A second data conductive layer including the data line 171, the driving voltage line 172, and an anode connection member ACM2 may be positioned on the first organic layer 181. A second organic layer 182 and a third organic layer 183 (hereinafter also referred to as an upper organic layer) are positioned on the second data conductive layer, and an anode connection opening OP4 is formed in the second organic layer 182 and the third organic layer 183. The anode connection member ACM2 is electrically connected with the anode through the anode connection opening OP4. FIG. 16 is a schematic plan view of the second data conductive layer and openings OP3 and OP4 considering difficulty in recognition of the second data conductive layer in FIG. 17, and FIG. 17 is a schematic plan view of the second data conductive layer and all the peripheral layers.

Referring to FIGS. 16 and 17, the lower organic layer opening OP3 overlaps the connection portion 171CM, the anode connection member ACM1, and the expansion portion FL-SD1 disposed on the first data conductive layer and exposes them respectively.

The second data conductive layer may include a data line 171, a driving voltage line 172, and an anode connection member ACM2.

The data line 171 and the driving voltage line 172 may extend in an approximately vertical direction (second direction).

The data line 171 is connected to the connection portion 171CM of the first data conductive layer through the lower organic layer opening OP3 and is connected to the second transistor T2 through the connection portion 171CM. The data line 171 has a structure in which it extends in the vertical direction and bends, and the data line 171 in the bent portion may form the boundary of the photosensor area OPS or a first component area.

The driving voltage line 172 is electrically connected to the fifth transistor T5 and the first storage electrode 1153 through the expansion portion FL-SD1 of the first data conductive layer through the lower organic layer opening OP3.

The anode connection member ACM2 is electrically connected to the anode connection member ACM1 of the first data conductive layer through the opening OP3, and is electrically connected to the sixth transistor T6.

Referring to FIG. 16, the driving voltage line 172 further includes an expansion portion FL-SD2 and a protruded wiring portion 172-*e*, and is not formed in a portion where the anode connection member ACM2 is formed.

The expansion portion FL-SD2 is formed wide in order to planarize the anode positioned thereon.

The protruded portion 172-*e* of the driving voltage line 172 has a structure in which two protruded portion 172-*e* are formed at opposite sides of two data lines 171 to form an anode positioned thereabove to be flat, and thus a total of four wiring structures 171 and 172-*e* are positioned below the anode. Referring to FIG. 17, two data lines 171 formed adjacent to each other are bent in opposite directions and have a large spaced portion, and the portion corresponds to the photosensor area OPS.

The anode has a flattening feature due to the structure (the expansion portion FL-SDL1 and the wiring portion 128*b*-1 of the first data conductive layer, the expansion portion FL-SD2 of the second data conductive layer, the data line 171, and the wiring portion 172-*e*) under the anode and the organic layers 181, 182, and 183 as described above.

In the embodiment, the expansion portion FL-SD1 and the expansion portion FL-SD2 are electrically connected to the driving voltage line 172 to transmit the driving voltage ELVDD.

The second data conductive layer may include a metal such as aluminum (Al), copper (Cu), molybdenum (Mo), titanium (Ti), or a metal alloy thereof, and may be formed as a single layer or multiple layers.

Referring to FIG. 20, a second organic layer 182 and a third organic layer 183 are positioned on the second data conductive layer. The second organic layer 182 and the third organic layer 183 may be organic insulators, and may include at least one material selected from a group consisting of a polyimide, a polyamide, an acryl resin, benzocyclobutene, and a phenolic resin. In embodiments, the third organic layer 183 can be omitted.

An anode connection opening OP4 is formed in the second organic layer 182 and the third organic layer 183, and the anode and the anode connection member ACM2 are electrically connected through the anode connection opening OP4.

Figure 18:
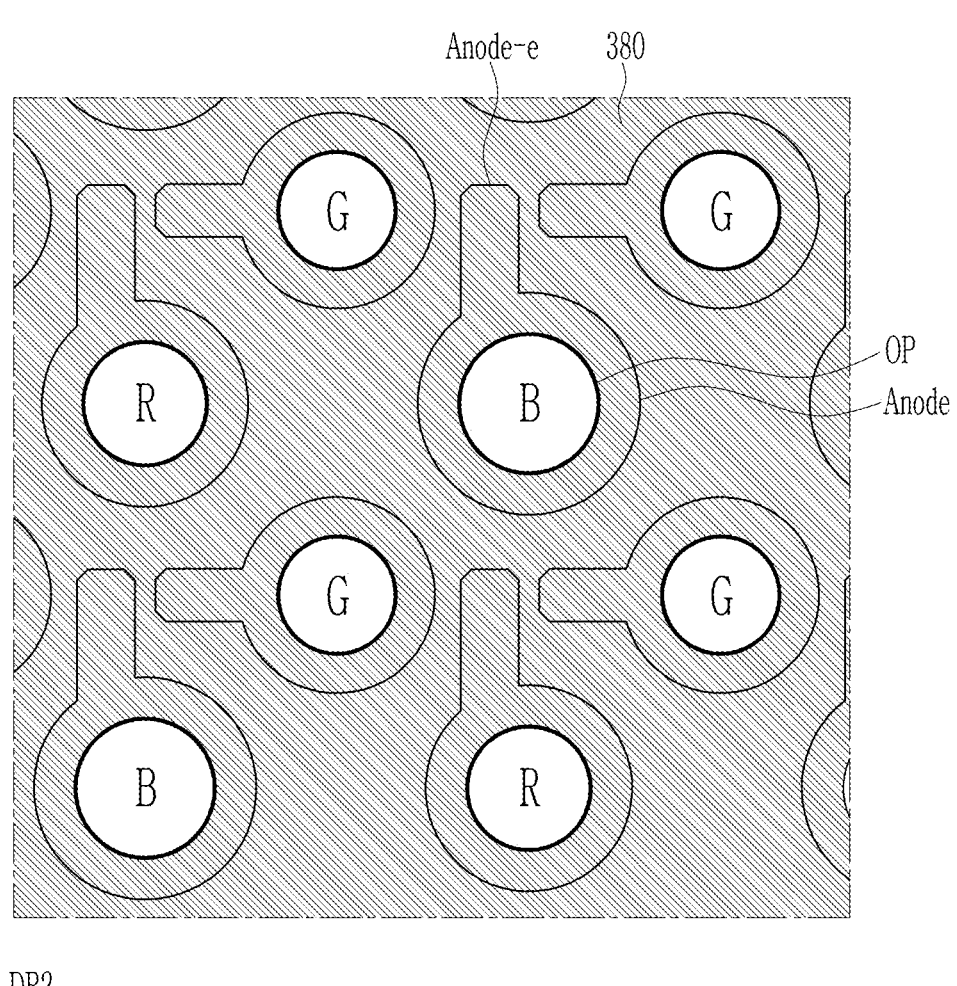
Figure 18:
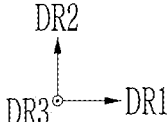
Figure 19:
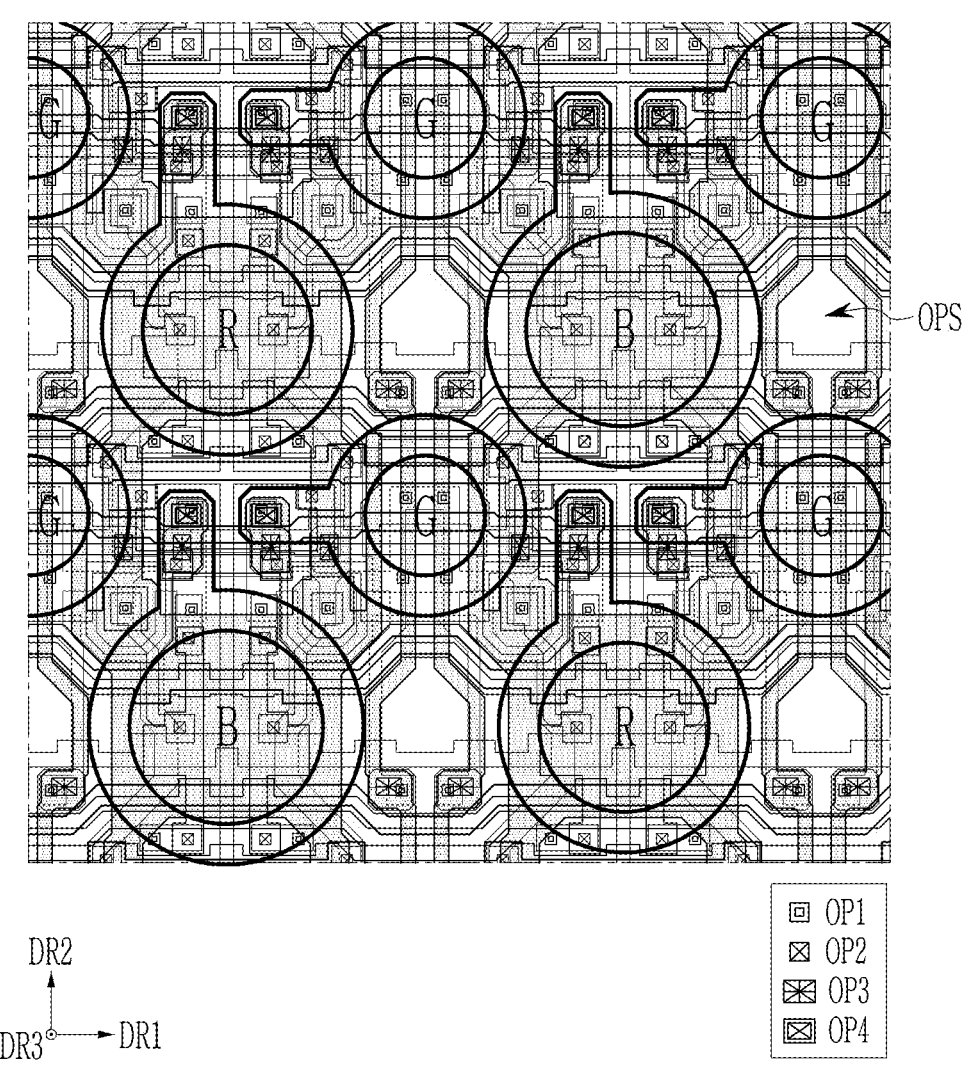

Referring to FIGS. 18 to 20, an anode Anode is formed on the third organic layer 183. The anode Anode may further include an extension portion Anode-e to receive a current from the pixel circuit portion through the anode connection opening OP4. Referring to FIG. 19, two anode connection openings OP4 are positioned to be adjacent to each other, and one of the two anode connection openings OP4 may have a structure of being connected with an anode of which an extension portion Anode-e extends in the first direction DR1 and is included in a green light emitting diode, and the other one may have a structure of being connected to an anode of which an extension portion Anode-e extends in the second direction and is included in a green or red light emitting diode.

Referring to FIGS. 19 and 20, a black pixel defining layer 380 is positioned on the anode Anode, and an opening OP of the black pixel defining layer 380 is formed to overlap the anode Anode. The extension portion Anode-e of the anode Anode is not exposed by the opening OP of the black pixel defining layer 380, and overlaps the black pixel defining layer 380 in a plan view. As a result, the anode connection opening OP4 also overlaps the black pixel defining layer 380 in a plan view.

Referring to FIG. 20, the anode connection opening OP4 does not overlap the opening OP of the black pixel defining layer 380 and an opening OPBM of a light blocking member 220 in a plan view, and therefore the anode connection opening OP4 overlaps the black pixel defining layer 380 and the light blocking member 220.

In addition, a part (a first lower organic layer opening) of the lower organic layer opening OP3 overlaps at least a part of the opening OPBM of the light blocking member 220 in a plan view, and the remaining lower organic layer opening OP3, for example, a second lower organic layer opening, overlaps the light blocking member 220 in a plan view. All lower organic layer openings OP3 overlap the black pixel defining layer 380 in a plan view.

In addition, a portion of the anode Anode, exposed through at least the opening OP of the black pixel defining layer 380, may be formed to be flat by the expansion portion FL-SD1 of the first data conductive layer and the expansion portion FL-SD2 of the second data conductive layer disposed below the anode Anode in the embodiment.

Due to the position relationship of the anode Anode and the anode connection opening OP4 therebelow, external light is not reflected asymmetrically and color separation does not occur. This will be described in more detail with reference to FIG. 21 and the like.

Based on such a planar structure, the entire cross-sectional structure of the light emitting display device will be described with reference to FIG. 20.

FIG. 20 is a schematic cross-sectional view of the light emitting display device according to the embodiment.

FIG. 20 illustrates a layered structure of the first component area EA1 in addition to the layered structure of the display area DA.

Hereinabove, up to the anode Anode in the detailed layered structure of the pixel of the display area DA shown in FIG. 20 has been described with reference to FIGS. 7 to 19. In the embodiment of FIG. 20, the pixel circuit portion includes the second organic layer 182 and the third organic layer 183, which implies a configuration provided below the second and third organic layers 182 and 183, and the light emitting diode is disposed above the third organic layer 183, which implies a configuration provided below the encapsulation layer 400.

Referring to FIG. 20, a layered structure above the anode Anode in the pixel of the display area DA is as follows.

A black pixel defining layer 380 that covers at least a part of the anode Anode while having an opening OP that exposes the anode Anode may be positioned on the anode Anode. The black pixel defining layer 380 is formed of an organic material with a black color and thus light applied from the outside is not reflected back to the outside. In embodiments, the black pixel defining layer 380 may include an organic material of a negative type of black color, and may include a black color pigment. In some embodiments, instead of the black pixel defining layer 380, a transparent pixel defining layer including transparent organic material may be used.

A spacer 385 is positioned on the black pixel defining layer 380 and may include a first part 385-1 and a second part 385-2. Unlike the black pixel defining layer 380, the spacer 385 may be formed of a transparent organic insulating material. In embodiments, the spacer 385 may be formed of a positive type of transparent organic material.

A function layer FL and a cathode Cathode are sequentially formed on the anode Anode, the spacer 385, and the black pixel defining layer 380, and the function layer FL and the cathode Cathode may be positioned in the entire region of the display area DA and the first component area EA1. An emission layer EML is positioned between the function layers FL, and the emission layer EML may be positioned only within the opening OP of the black pixel defining layer 380. Hereinafter, the function layer FL and the emission layer EML can be combined to form an intermediate layer. The function layer FL may include at least one of an auxiliary layer such as an electron injection layer, an electron transport layer, a hole transport layer, and a hole injection layer, and the hole injection layer and the hole transport layer may be positioned under the emission layer EML and the electron transport layer and the electron injection layer may be positioned on the emission layer EML.

The encapsulation layer 400 is positioned on the cathode Cathode. The encapsulation layer 400 includes at least one inorganic layer and at least one organic layer, and in embodiments, the encapsulation layer 400 may have a triple-layer structure including a first inorganic encapsulation layer, an organic encapsulation layer, and a second inorganic encapsulation layer. The encapsulation layer 400 may be for protecting the emission layer EML from moisture or oxygen that may be introduced from the outside. In embodiments, the encapsulation layer 400 may include a structure in which an inorganic layer and an organic layer are sequentially further stacked.

In the embodiment of FIG. 20, sensing insulation layers 501, 510, and 511 and sensing electrodes 540 and 541 are positioned on the encapsulation layer 400 to sense a touch. In the embodiment of FIG. 20, a touch may be sensed in a capacitive type using the two sensing electrodes 540 and 541.

Specifically, a first sensing insulation layer 501 is formed on the encapsulation layer 400, and the sensing electrodes 540 and 541 are formed thereon. The sensing electrodes 540 and 541 may be insulated with a second sensing insulation layer 510 interposed therebetween, and some thereof may be electrically connected through an opening positioned on the sensing insulation layer 510. Here, the sensing electrodes 540 and 541 may include a metal or metal alloy such as aluminum (Al), copper (Cu), silver (Ag), gold (Au), molybdenum (Mo), titanium (Ti), or tantalum (Ta), and may be formed of a single layer or multiple layers. A third sensing insulation layer 511 is formed on the sensing electrode 540.

A light blocking member 220 and a color filter layer 230 are positioned on the upper sensing electrode 540 and the third sensing insulation layer 511.

The light blocking member 220 may be positioned so as to overlap the sensing electrodes 540 and 541 in a plan view, and not to overlap the anode Anode in a plan view. This is to prevent the anode Anode that is capable of displaying an image from being covered by the light blocking member 220 and the sensing electrodes 540 and 541.

A color filter layer 230 may be positioned on the third sensing insulation layer 511 and light blocking member 220. The color filter layer 230 includes a red color filter that transmits red light, a green color filter that transmits green light, and a blue color filter that transmits blue light. Each color filter layer 230 may be positioned so as to overlap an anode Anode of the light emitting diode in a plan view. Light emitted from the emission layer EML can be emitted while passing through a color filter and changing to a corresponding color.

The light blocking member 220 may be positioned between each color filter layer 230. In embodiments, the color filter layer 230 may be replaced with a color conversion layer, or a color conversion layer may further be included. The color conversion layer may include quantum dots.

In addition, in embodiments, a reflection adjusting layer filling (or positioned in) the opening OPBM of the light blocking member 220 may be positioned instead of the color filter layer 230. The reflection adjusting layer may have a structure covering the light blocking member 220, and this will be described with reference to FIG. 35.

A planarization layer 550 covering the color filter layer 230 may be positioned on the color filter layer 230, and a polarizer may be additionally attached thereon.

FIG. 20 also illustrates a cross-sectional structure of the first component area EA1.

The first component area EA1 is a region in which the photosensor area OPS is positioned on the lower panel layer, and may mean a region in which the black pixel defining layer 380, the light blocking member 220, and the color filter layer 230 are not formed.

The first component area EA1 is formed as only a transparent layer to allow light to pass therethrough, and no conductive layer or semiconductor layer is positioned, and an opening (hereinafter also referred to as an additional opening) may be formed in a position in the black pixel defining layer 380, the light blocking member 220, and the color filter layer 230 corresponding to the photosensor area OPS to have a structure that does not block light.

Specifically, based on FIG. 20, a layered structure of the first component area EA1 according to the embodiment will be described.

A buffer layer 111, which is an inorganic insulating layer, is positioned on the substrate 110, and a first gate insulating layer 141 and a second gate insulating layer 142, which are inorganic insulating layers, are sequentially positioned on the buffer layer 111. In addition, a first interlayer insulating layer 161, a third gate insulating layer 143, and a second interlayer insulating layer 162, which are inorganic insulating layers, are sequentially stacked on the second gate insulating layer 142. A first organic layer 181, a second organic layer 182, and a third organic layer 183, which are organic insulating layers, are sequentially stacked on the second interlayer insulating layer 162. The function layer FL may be positioned on the third organic layer 183, and a cathode Cathode may be positioned on the function layer FL. The stacked structure from the substrate 110 to the cathode Cathode so far may correspond to the photosensor area OPS.

The encapsulation layer 400 is positioned on the cathode Cathode, and the sensing insulation layers 501, 510, and 511 are sequentially positioned on the encapsulation layer 400. The encapsulation layer 400 may have a triple layer structure including a first inorganic encapsulation layer, an organic encapsulation layer, and a second inorganic encapsulation layer. In addition, the sensing insulation layers 501, 510, and 511 may all be inorganic insulating layers.

Additional openings of the light blocking member 220 and the color filter layer 230 are respectively positioned on the third sensing insulation layer 511, and thus the light blocking member 220 and the color filter layer 230 may be not formed in the first component area EA1. Further, an additional opening may be also positioned in the black pixel defining layer 380 and thus the black pixel defining layer 380 may not be formed in the first component area EA1. In some embodiments, the light blocking member 220 may overlap the first component area EA1, and in this embodiments, the first optical element ES1 may use light other than visible light.

A planarization layer 550 may be positioned on the third sensing insulation layer 511 in the first component area EA1.

In the first component area EA1 and the photosensor area OPS, the metal layer BML, the first semiconductor layer ACT1, the first gate conductive layer GAT1, the second gate conductive layer GAT2, the oxide semiconductor layer ACT2, the third gate conductive layer GAT3, the first data conductive layer SD1, the second data conductive layer, and the anode Anode are not positioned. In addition, the emission layer EML and the sensing electrodes 540 and 541 are not formed.

Additionally, in the first component area EA1 and the photosensor area OPS, additional openings are formed in the black pixel defining layer 380, the light blocking member 220, and the color filter layer 230, and thus the black pixel defining layer 380, the light blocking member 220, and the color filter layer 230 are not formed.

The first semiconductor layer ACT1 may include (or may be made of), for example, P—Si, and the second semiconductor layer ACT2 may include (or may be made of), for example, IGZO, but embodiments are not limited thereto.

Hereinabove, the embodiment in which total three organic layers are formed and the anode connection opening is formed in the second organic layer and the third organic layer has been described. However, at least two organic layers may be formed, and in this case, the anode connection opening may be positioned in an upper organic layer positioned away from the substrate, and a lower organic layer opening may be positioned in a lower organic layer.

In the above, the overall structure of the light emitting display device and the pixel has been described in detail.

Hereinafter, some of the various features of the embodiment shown in FIGS. 7 to 20 will be highlighted in detail as follows with reference to FIGS. 21 to 25B.

FIGS. 21 to 25B are schematic enlarged views of a portion of the lower panel layer according to the embodiment of FIGS. 7 to 20.

First, a representative feature among features of the lower panel layer according to the embodiment will be briefly described with reference to FIG. 21.

Figure 21:
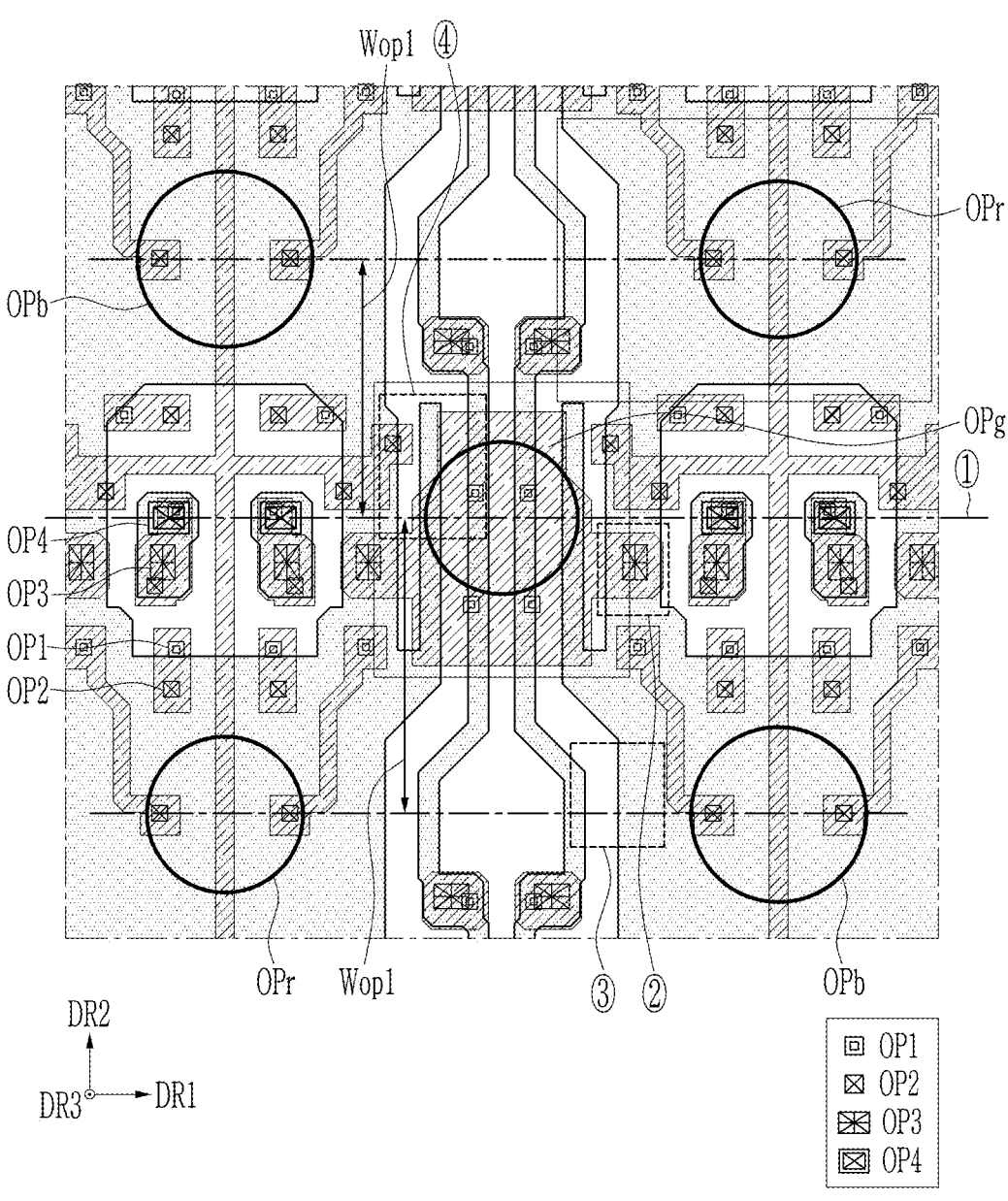
FIG. 21 to FIG. 25B are schematic enlarged views of a portion of the lower panel layer according to the embodiment of FIG. 7 to FIG. 20.

In FIG. 21, a part containing four features is indicated by a dotted line box, and the features of distances between openings OPr, OPg, and OPb adjacent up and down are also shown.

FIG. 21 illustrates, rather than the entire planar structure, only the first data conductive layer (FIG. 14) and the second data conductive layer (FIG. 16) with openings OP1, OP2, OP3, OP4, OPr, OPg, and OPb are illustrated for easy viewing.

The horizontal dotted lines shown in FIG. 21 represent the center lines in the horizontal direction of the openings OPr, OPg, and OPb of the black pixel defining layer 380, respectively. In FIG. 21, distances between the center line in the horizontal direction of the green opening OPg and the center lines in the horizontal direction of openings OPr and OPb of different colors disposed above and below the center line in the horizontal direction of the green opening OPg are Wop1, which have the same features. FIG. 21 illustrates that the distance between the center lines in the horizontal direction of the openings OPr and OPb of different colors vertically adjacent to each other with the green opening OPg as the center is the same, but, in embodiments, center lines in directions that are perpendicular to the center lines shown in FIG. 21 may have a same distance therebetween. For example, distances between the center line in the vertical direction of the green opening OPg and the center lines in the vertical direction of the openings OPr and OPb of the different colors positioned on the left and right of the green opening OPg also have the same features. Hereinafter, it may be determined that the distance between the center lines in the first direction is the same by combining these features, and hereinafter, the center line in the first direction is simply referred to as a center line.

In addition, ① shown in FIG. 21 illustrates a feature that the center line in the horizontal direction of the green opening OPg passes through the anode connection opening OP4 or corresponds to the center line in the horizontal direction of the anode connection opening OP4. Referring to FIG. 20, in case that two anode connection openings OP4 are positioned adjacent to each other and two green openings OPg are positioned on sides thereof, a horizontal line passing through the two anode connection openings OP4 or a horizontal line passing through the center of the two anode connection openings OP4 also passes through the centers of the two green openings OPg. Therefore, it may have a structure in which the center line in the horizontal direction of the green opening OPg passes through the two anode connection openings OP4 or passes through the two centers of the two anode connection openings OP4. In addition, the two anode connection openings OP4 or the center line passing through the centers thereof may pass through the center of the green opening OPg. As described, since the anode connection opening OP4 formed in the second organic layer 182 and the third organic layer 183 is formed in line with the center of the green opening OPg, the green anode exposed by the green opening OPg of the black pixel defining layer 380 is more symmetric and thus may be flatter (Refer to FIGS. 33A and B). Due to this, external light is not reflected asymmetrically from the anode Anode, and color separation does not occur.

Figure 22A:
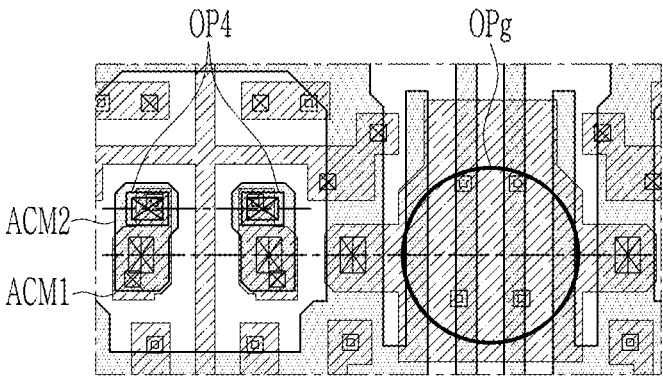
Figure 22B:
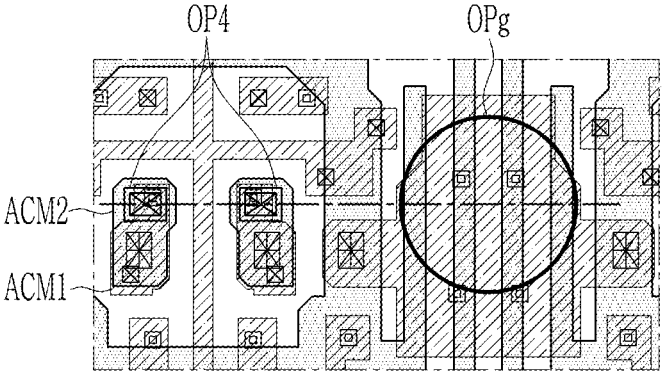

In FIGS. 22A and 22B, the features of ① are more readily determined by comparing a comparative example and an embodiment. FIG. 22A is a schematic plan view of a comparative example, and FIG. 22B illustrates an embodiment. FIG. 22B illustrates an embodiment in which a center line in a horizontal direction of a green opening OPb passes through two centers of two anode connection openings OP4.

Figure 32A:
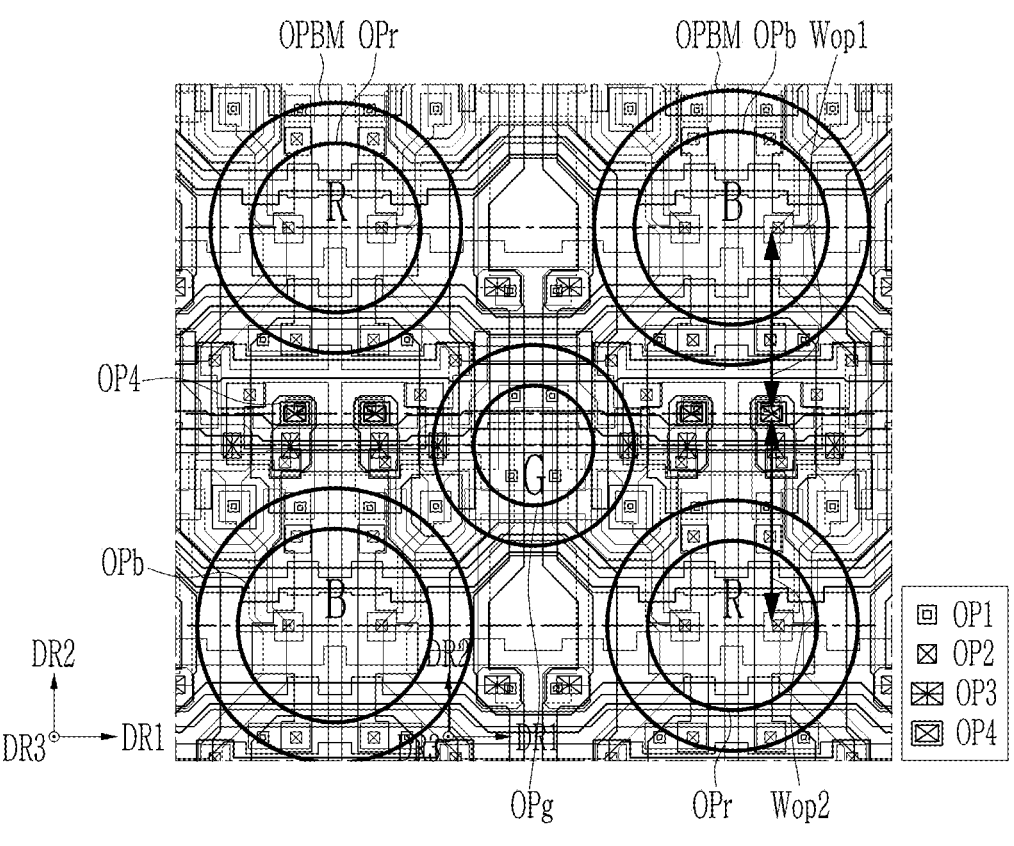
FIGS. 32A and 32B show flat features of the lower panel layer and the anode according to the comparative example.

According to FIG. 22A, in the comparative example, a center line in a horizontal direction of an anode connection opening OP4 and a center line in the horizontal direction of a green opening OPg do not correspond to each other. According to the structure of the comparative example, a green anode exposed by the green opening OPg of the black pixel defining layer 380 is not symmetrical, and thus, as shown in FIGS. 32A and B, it is difficult to be flat, and the light reflected from the anode is asymmetric, thereby causing color separation.

Figure 33A:
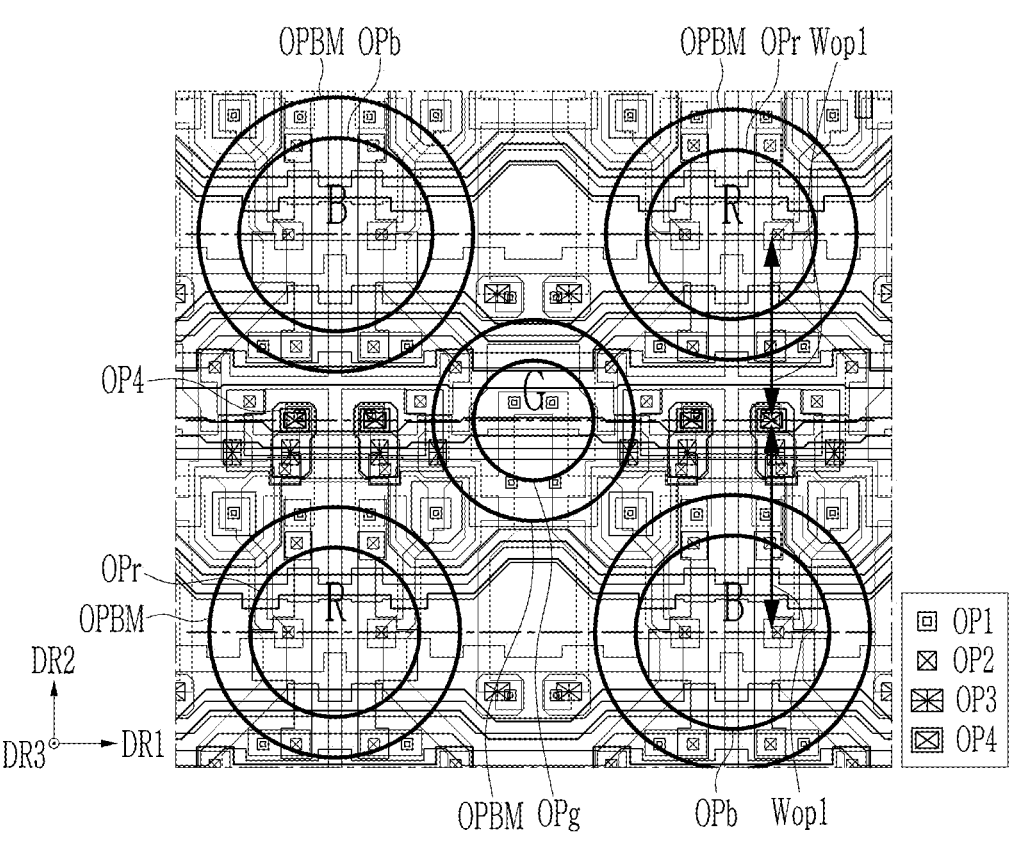
FIG. 33A and FIG. 34B show the flat feature of the lower panel layer and the anode according to the embodiment.

In contrast, according to FIG. 22B, in the embodiment, the center line of the anode connection opening OP4 corresponds to the center line of the green opening OPg, and thus the green anode exposed to the green opening OPg of the black pixel defining layer 380 is symmetrical and may be flatter (refer to FIGS. 33A and B). As a result, external light is not reflected asymmetrically from the anode Anode, and color separation does not occur.

In addition, in case that the feature of ① and the feature of a same interval between the center lines in the first direction are combined, the following features are obtained.

Since distances between the center line of the green opening OPg and the center lines in the horizontal direction of the adjacent openings OPr and OPb of different colors are the same and the center line of the green opening OPg also corresponds to the center line of the anode connection opening OP4, the center line of the anode connection opening OP4 and the center lines in the horizontal direction of the adjacent openings OPr and OPb of different colors are formed to have a same distance therebetween, thereby forming a symmetrical structure.

The anode connection opening OP4 as described above has a symmetrical position with respect to the openings OPr and OPb of different colors positioned thereabove and therebelow, and thus the second organic layer 182 and the third organic layer 183 where the anode Anode is positioned are formed more flatly, and formed flatter than anodes Anode of other colors (red and blue) positioned thereabove. Due to this, external light is not reflected asymmetrically from the anode Anode, and color separation does not occur. Therefore, all anodes of all colors can be formed more flatly.

In a portion where a portion (hereinafter also referred to as a connection portion) that connects two adjacent extension portions FL-SD2 in the driving voltage line 172 positioned in the second data conductive layer and a protruded portion of the expansion portion FL-SD1 positioned in the first data conductive layer are connected with each other through the opening OP3, a width of the connection portion of the driving voltage line 172 is sufficiently widened to correspond at least 80% of a width of protruded portion of the expansion portion FL-SD1 in the horizontal direction such that ② in FIG. 21 can be formed to sufficiently cover the opening OP3.

Figure 23A:
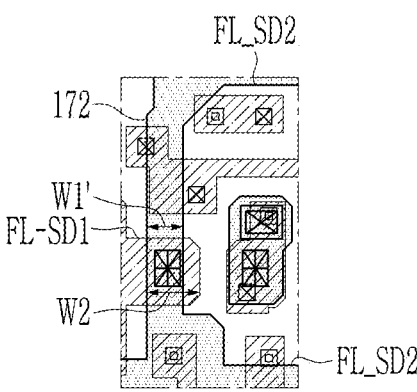
Figure 23B:
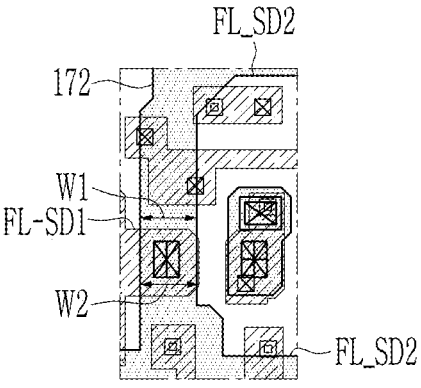

In FIGS. 23A and 23B, the features of ② are determined more readily by comparing the comparative example and the embodiment. FIG. 23A is a schematic plan view of a comparative example, and FIG. 23B illustrates an embodiment.

Referring to FIG. 23A, a width W1' in a horizontal direction of a connection portion of a driving voltage line 172 is formed to be relatively narrower than a width W2 in the horizontal direction of the protruded portion of the expansion portion FL-SD1. In contrast, in FIG. 23B, a width W1 in the horizontal direction of the connection portion of the driving voltage line 172 is sufficiently increased to correspond to the width W2 in the horizontal direction of the protruded portion such that the opening OP3 can be sufficiently covered.

As described above, in case that the width W1 in the horizontal direction of the connection portion of the driving voltage line 172 is increased, the driving voltage line 172 has lower resistance such that a voltage drop of the driving voltage ELVDD may be small. In addition, the connection portion of the driving voltage line 172 positioned above and below the opening OP3 and the protruded portion of the expansion portion FL-SD1 can be connected through the opening OP3 with a sufficient area, and thus contact resistance of the connection through the opening OP3 is also reduced, thereby improving the contact feature.

③ in FIG. 21 has the feature of reducing the distance between the expansion portion FL-SD2 of the driving voltage line 172 positioned in the second data conductive layer and the data line 171.

Figure 24A:
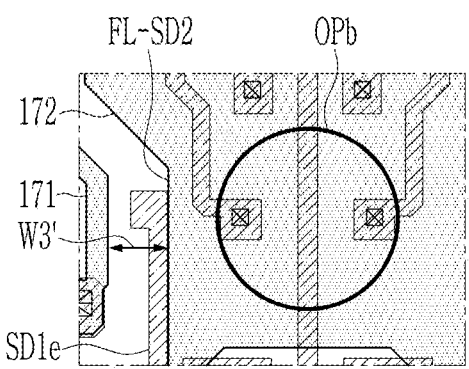
Figure 24B:
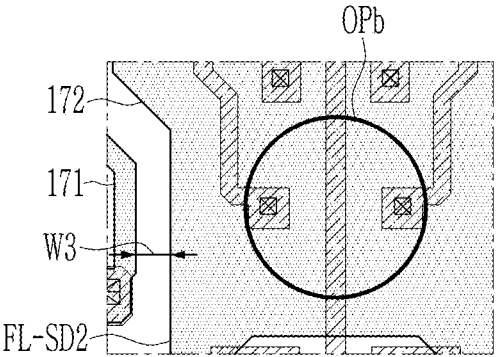

In FIGS. 24A and 24B, the feature of ③ is more readily determined by comparing the comparative example and the embodiment. FIG. 24A is a plan view of a comparative example, and FIG. 24B illustrates an embodiment.

Referring to FIG. 24A, a width W3' between the expansion portion FL-SD2 of the driving voltage line 172 and the data line 171 is illustrated as being relatively greater, and referring to FIG. 24B, a width W3 between the expansion portion FL-SD2 of the driving voltage line 172 and the data line 171 is shown as being relatively small. Such a width difference between the expansion portion FL-SD2 and the data line 171 may be due to an additional pattern SD1e of the first data conductive layer in the comparative example of FIG. 24A. For example, in the comparative example shown in FIG. 24A, there is a limit in reducing the width W3' between the expansion portion FL-SD2 and the data line 171 due to the additional pattern SD1e of the first data conductive layer. However, in the embodiment shown in FIG. 24B, the width W3 between the expansion portion FL-SD2 and the data line 171 can be sufficiently reduced because the additional pattern SD1e of the comparative example is not formed. In the comparative example shown in FIG. 24A, the additional pattern SD1e of the first data conductive layer is a pattern for transmitting a second initialization voltage AVinit to a seventh transistor T7, and in the embodiment of FIGS. 7 to 20, the width W3 between the expansion portion FL-SD2 and the data line 171 can be sufficiently reduced by changing the position of the seventh transistor T7 to another position. In addition, in the embodiment of FIGS. 7 to 20, the seventh transistor T7 can be formed as an N-type transistor including an oxide semiconductor.

④ in FIG. 21 illustrates that the shape of the expansion portion FL-SD1 positioned in the first data conductive layer has been changed.

Figure 25A:
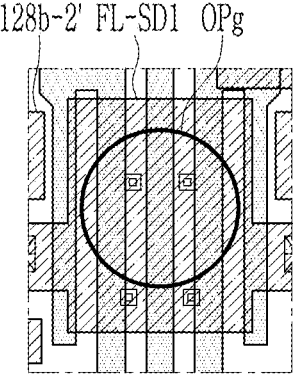
Figure 25B:
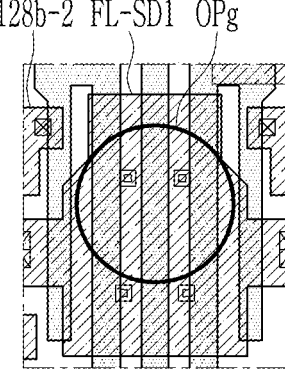

In FIGS. 25A and 25B, the features of ④ are determined more readily by comparing the comparative example and the embodiment. FIG. 25A is a schematic plan view of a comparative example, and FIG. 25B illustrates an embodiment.

Referring to FIG. 25A, the expansion portion FL-SD1 of the comparative example has a rectangular shape, excluding the protruded portion. FIG. 25A illustrates, among other things, a first extension portion 128b-2'. In contrast, referring to FIG. 25B, it can be determined that the expansion portion FL-SD1 according to the embodiment has a structure of which a width is reduced toward an upper portion thereof, excluding the protruded portion.

In the embodiment of FIGS. 7 to 20, the end of the first extension portion 128b-2 protruded in the horizontal direction (first direction) of the second initialization voltage line 128 positioned on the first data conductive layer is extended, and thus the size of the expansion portion FL-SD1 is formed to be partially smaller.

In particular, the end of the first extension portion 128b-2 of the second initialization voltage line 128 is connected to the oxide semiconductor layer to transmit the second initialization voltage AVinit to the seventh transistor T7.

In contrast, in the comparative example, since the seventh transistor T7 is positioned in a different place from the embodiment, the end of the first extension portion 128b-2 of the second initialization voltage line 128 does not need to be expanded, and the expansion portion FL-SD1 has a rectangular shape.

The expansion portion FL-SD1 is provided to planarize the second organic layer 182, the third organic layer 183, and the green anode positioned thereon, but in the embodiment, although the width of the expansion portion FL-SD1 is partially reduced, there is no problem in flattening the green anode because the second organic layer 182 and the third organic layer 183 are positioned thereon.

Hereinabove, the embodiment of FIGS. 7 to 20 and the features of the embodiment have been described.

Hereinafter, an embodiment that further includes a dummy opening will be described with reference to FIGS. 26 to 31.

First, referring to FIGS. 26 and 27, an embodiment that includes a dummy anode connection opening OP4-2 that corresponds to the anode connection opening OP4 will be described.

Figure 26:
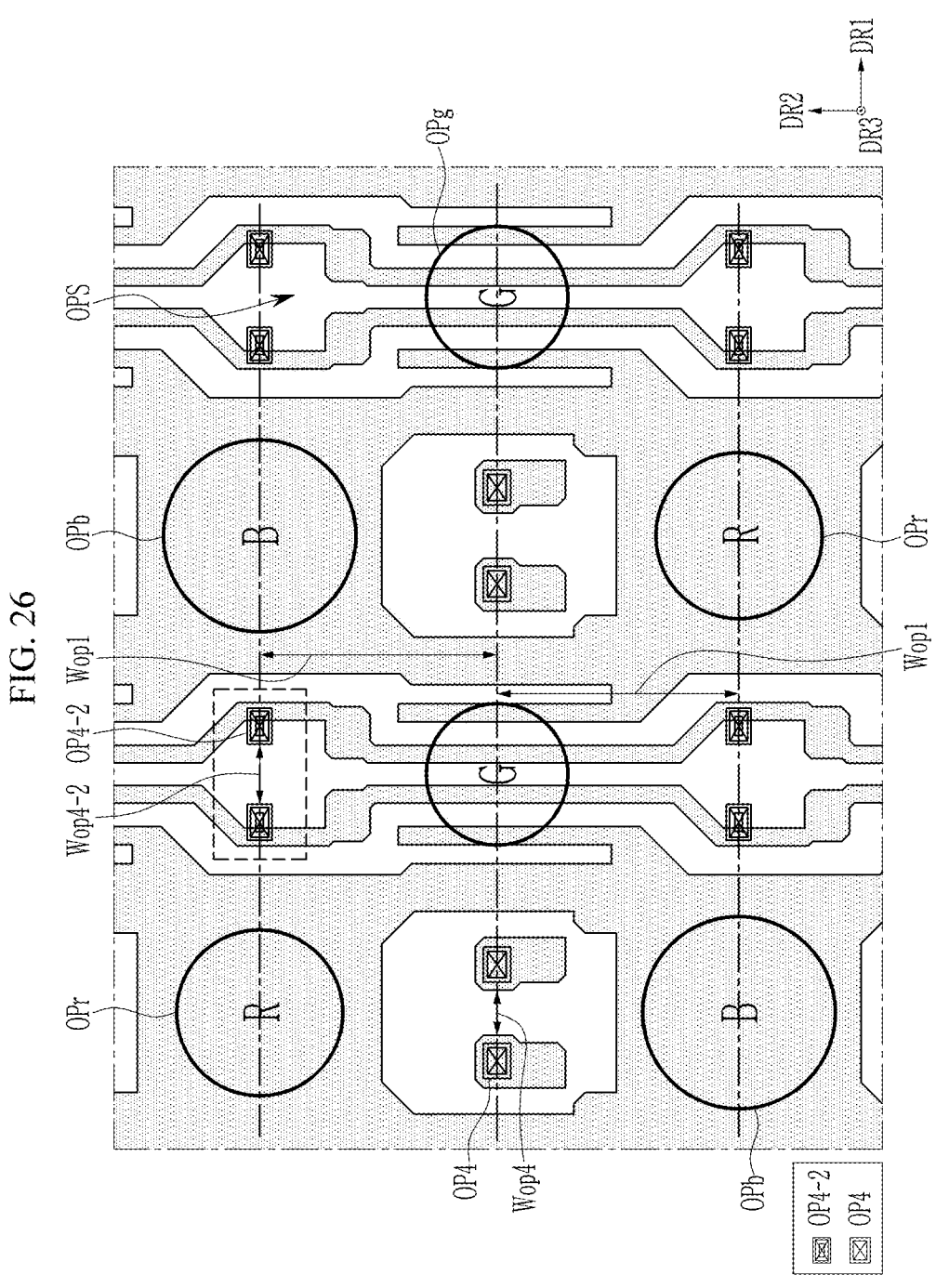
FIG. 26 is a schematic plan view of a part of a lower panel layer according to another embodiment.
Figure 27:
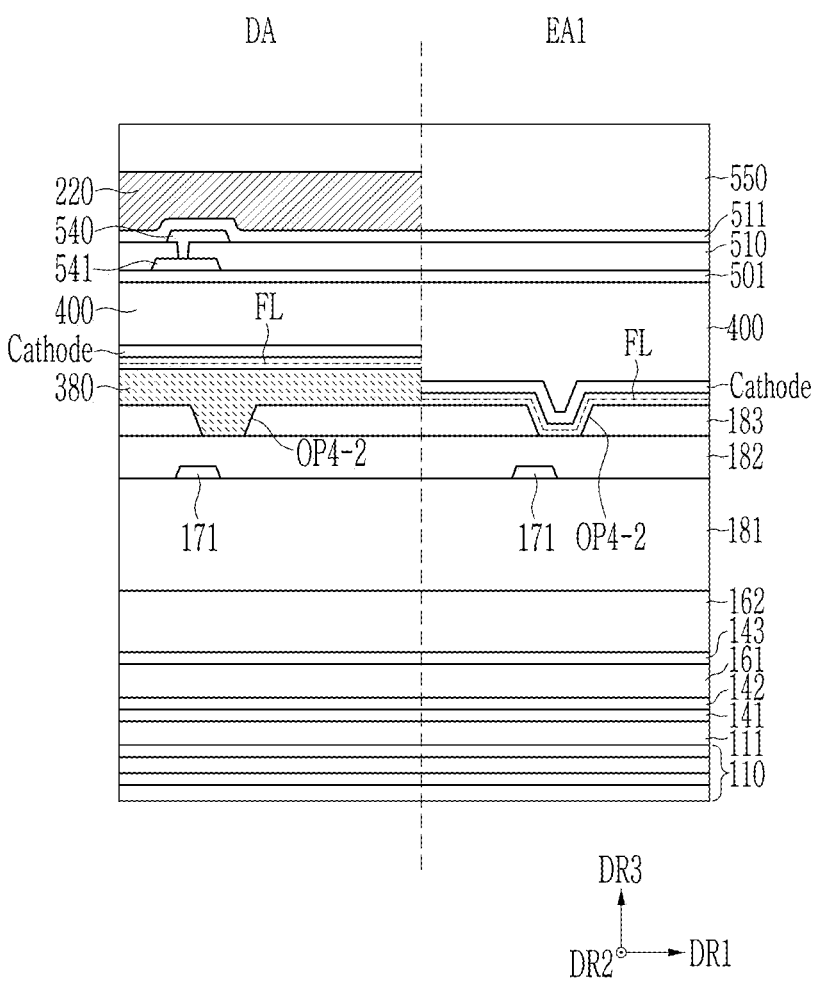
FIG. 27 is a schematic cross-sectional view of the embodiment of FIG. 26.

FIG. 26 is a schematic plan view of a part of a lower panel layer according to another embodiment, and FIG. 27 is a schematic cross-sectional view of the embodiment of FIG. 26.

FIG. 26 illustrates a second data conductive layer and anode connection openings OP4 formed in a second organic layer 182 and a third organic layer 183. In addition, a dummy anode connection opening OP4-2 formed in the third organic layer 183 is further formed in the dotted line square box of FIG. 26.

Referring to FIG. 27, the dummy anode connection opening OP4-2 cannot be formed in the second organic layer 182, but can be formed only in the third organic layer 183. In addition, the dummy anode connection opening OP4-2 is positioned between openings OPr and OPb of different colors in a black pixel defining layer 380, and may have the same center line as the center line in the horizontal direction of two adjacent different color openings OPr and OPb. In embodiments, the center line in the horizontal direction of the adjacent two openings OPr and OPb of different colors passes through the dummy anode connection opening OP4-2 or may pass through the center of the dummy anode connection opening OP4-2. In the embodiment illustrated in FIG. 26, the center line in the horizontal direction of two adjacent openings OPr and OPb of different colors passes through the center of the dummy anode connection opening OP4-2.

As previously described with reference to FIG. 21, the distance Wop1 between the center line in the horizontal direction of the green opening OPg and the center lines in the horizontal direction of the openings OPr and OPb of different colors positioned above and below are the same, and thus the center line in the horizontal direction of the dummy anode connection opening OP4-2 and the center line in the horizontal direction of the anode connection opening OP4 also have the same width as Wop1.

In the embodiment of FIG. 26 compared to the embodiment of FIG. 21, the anode connection opening OP4 or the dummy anode connection opening OP4-2 are positioned above and below and on the left and right of each of the openings OPr, OPg, and OPb of the black pixel defining layer 380, and thus the green anode may be more symmetrical, thereby being flatter (Refer to FIGS. 34A and B). Due to this, external light is not reflected asymmetrically from the anode Anode, and color separation does not occur.

In addition, FIG. 26 illustrates a width Wop4 in the horizontal direction of two adjacent anode connection openings OP4 and a width Wop4-2 in the horizontal direction of two adjacent dummy anode connection openings OP4-2. In embodiments, the two widths Wop4 and Wop4-2 in the horizontal direction may be equal to each other, and may also be different from each other. In case that the two widths Wop4 and Wop4-2 are different from each other, depending on embodiments, widths between the respective openings OPr, OPg, and OPb of the closest black pixel defining layer 380 and the anode connection opening OP4 or the dummy anode connection opening OP4-2 may be constant.

In FIG. 26, the portion shown as the photosensor area OPS may correspond to the planar structure of the first component area EA1, and in case that light blocking layers (for example, black pixel defining layer 380 and light blocking member 220) are not included on the upper portion of the photosensor area OPS, the portion corresponds to the first component area EA1. Therefore, the dummy anode connection opening OP4-2 positioned in and around the photosensor area OPS may be positioned in the display area DA or in the first component area EA1.

Hereinafter, referring to FIG. 27, a case in which a cross-sectional structure of a dummy anode connection opening OP4-3 is positioned in the display area DA and a case that the cross-sectional structure of a dummy anode connection opening OP4-3 is positioned in the first component area EA1 will be described.

FIG. 27 illustrates a cross-sectional structure of a case that the dummy anode connection opening OP4-2 is positioned in the display area DA and a cross-sectional structure of a case that the dummy anode connection opening OP4-2 is positioned in the first component area EA1.

FIG. 27 briefly illustrates a lower portion of the first organic layer 181, only focusing on the insulating layer, and illustrates, in detail, components on the data line 171 above the first organic layer 181.

First, a structure of the display area DA will be described.

The second organic layer 182 is positioned on the first organic layer 181 and the data line 171, and the third organic layer 183 is positioned on the second organic layer 182.

The dummy anode connection opening OP4-2 is not formed in the second organic layer 182 but is formed only in the third organic layer 183. For reference, the anode connection opening OP4 is formed in the second organic layer 182 and the third organic layer 183 to be connected to the anode and the lower anode connection member ACM2, and thus is different from the dummy anode connection opening OP4-2.

The black pixel defining layer 380, the function layer FL, the cathode Cathode, and the encapsulation layer 400 are sequentially positioned on the third organic layer 183 and the dummy anode connection opening OP4-2. Here, the dummy anode connection opening OP4-2 may be filled with the black pixel defining layer 380.

Sensing insulation layers 501, 510, and 511 and sense electrodes 540 and 541 are positioned on the encapsulation layer 400 to sense a touch, the light blocking member 220 and the planarization layer 550 may be positioned on the sensing insulation layers 501, 510, and 511 and the sense electrodes 540 and 541, and a color filter layer 230 may be positioned in the opening OPBM of the light blocking member 220.

A structure of the first component area EA1 is as follows.

The second organic layer 182 is positioned on the first organic layer 181 and the data line 171, and the third organic layer 183 is positioned on the second organic layer 182. The dummy anode connection opening OP4-2 is not formed in the second organic layer 182, but is formed only in the third organic layer 183.

The function layer FL, the cathode Cathode, and the encapsulation layer 400 are sequentially positioned on the third organic layer 183 and the dummy anode connection opening OP4-2, and the dummy anode connection opening OP4-2 may be filled with the function layer FL, the cathode Cathode, and the encapsulation layer 400. In embodiments, at least one of the function layer FL, the cathode Cathode, and the encapsulation layer 400 may be removed and thus may not be positioned in the dummy anode connection opening OP4-2.

The sensing insulation layers 501, 510, and 511 and the sensing electrodes 540 and 541 may be positioned on the encapsulation layer 400 to sense a touch, and the planarization layer 550 may be positioned on the sensing insulation layers 501, 510, and 511 and the sensing electrodes 540 and 541.

Unlike the display area DA, the black pixel defining layer 380 and the light blocking member 220 that block light are not positioned in the first component area EA1, and the color filter layer 230 may not be positioned.

The dummy anode connection opening OP4-2 is not formed in the second organic layer 182 because even if the anode or the cathode is positioned on the upper portion of the dummy anode connection opening OP4-2, a short with other conductive layers therebelow can be prevented.

Hereinafter, an embodiment in which the first scan line 151 positioned in the first gate conductive layer is bent at the periphery of the photosensor area OPS or the first component are EA1 will be described with reference to FIGS. 28 to 30.

First, an embodiment will be described with reference to FIGS. 28 and 29.

Figure 28:
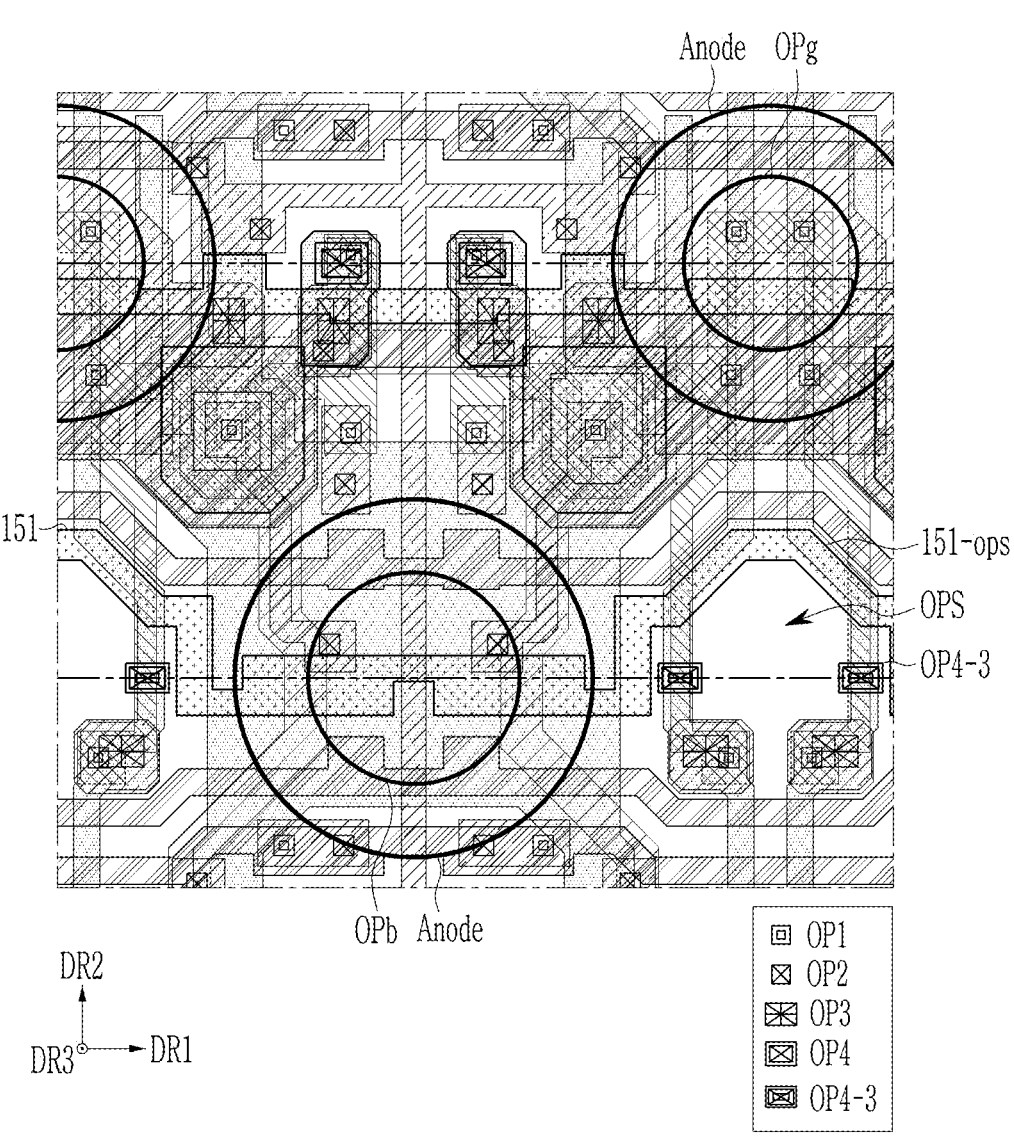
FIG. 28 is a schematic plan view of a part of a lower panel layer according to another embodiment.
Figure 29:
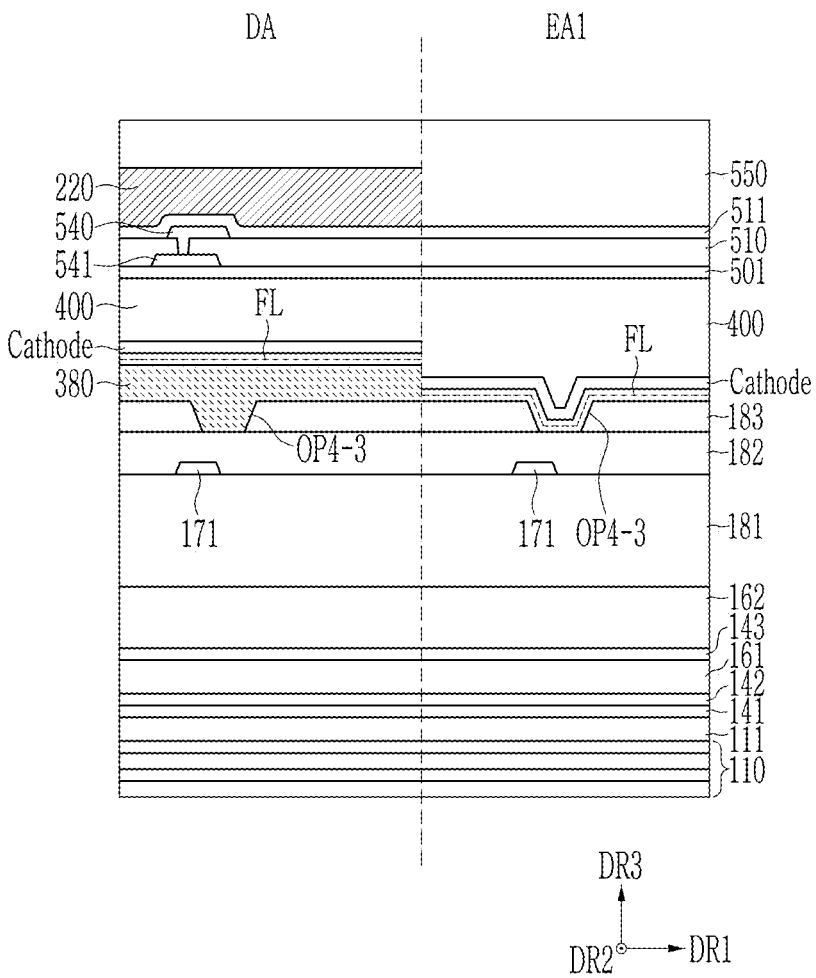
FIG. 29 is a schematic cross-sectional view of the embodiment of FIG. 28.

FIG. 28 is a schematic plan view of a part of a lower panel layer according to another embodiment, and FIG. 29 is a schematic cross-sectional view of the embodiment of FIG. 28.

FIGS. 7 to 19 are different from FIG. 28 at least in that in the planar structure, the first scan line 151 includes a bent portion 151-ops along an upper boundary of the photosensor area OPS or the first component area EA1 in the periphery of the photosensor area OPS. In addition, in FIG. 28, the first scan line 151 forms a dummy anode connection opening OP4-3 at a portion bent in the photosensor area OPS.

The position of the dummy anode connection opening OP4-3 is aligned with the center line in the horizontal direction of a blue opening OPb of the black pixel defining layer 380, similar to the dummy anode connection opening OP4-2 described above, or the dummy anode connection opening OP4-3 may be positioned at a position where a center line in the horizontal direction of the blue opening OPb of the black pixel defining layer 380 passes through the dummy anode connection opening OP4-3. Although not illustrated in FIG. 28, the blue opening OPb and the red opening OPr of the black pixel defining layer 380 are alternately arranged in the first direction DR1, and thus the dummy anode connection opening OP4-3 may have a center that corresponds to a center in the horizontal direction of the red opening OPr of the black pixel defining layer 380.

In FIG. 28, a portion shown as the photosensor area OPS may correspond to the planar structure of the first component area EA1, and may correspond to the first component area EA1 in case that the light blocking layers (black pixel defining layer 380 and light blocking member 220) are not included in the upper portion of the photosensor area OPS. Therefore, the dummy anode connection opening OP4-3 positioned in and around the photosensor area OPS may be positioned in the display area DA or in the first component area EA1.

Hereinafter, referring to FIG. 29, a case of a cross-sectional structure of the dummy anode connection opening OP4-3 positioned in the display area DA and a case of a cross-sectional structure of the dummy anode connection opening OP4-3 positioned in the first component area EA1 will be separately described.

FIG. 29 illustrates a cross-sectional structure of a case that the dummy anode connection opening OP4-3 is positioned in the display area DA and a cross-sectional structure of the dummy anode connection opening OP4-3 positioned in the first component area EA1.

FIG. 29 briefly illustrates the lower portion of the first organic layer 181, focusing on only the insulating layer, and illustrates, in detail, components on the data line 171 above the first organic layer 181.

First, a structure of the display area DA will be described.

The second organic layer 182 is positioned on the first organic layer 181 and the data line 171, and the third organic layer 183 is positioned on the second organic layer 182. The dummy anode connection opening OP4-3 is not formed in the second organic layer 182, but is formed only in the third organic layer 183. The function layer FL, the cathode Cathode, and the encapsulation layer 400 are sequentially positioned on the third organic layer 183 and the dummy anode connection opening OP4-3. Here, the dummy anode connection opening OP4-3 may be filled with the black pixel defining layer 380.

The sensing insulation layers 501, 510, and 511 and the sensing electrodes 540 and 541 may be positioned on the encapsulation layer 400 to sense a touch, a light blocking member 220 and a planarization layer 550 may be positioned on the sensing insulation layers 501, 510, and 511 and the sensing electrodes 540 and 541, and a color filter layer 230 may be positioned in the opening OPBM of the light blocking member 220.

A structure of the first component area EA1 is as follows.

The second organic layer 182 is positioned on the first organic layer 181 and the data line 171, and the third organic layer 183 is positioned on the second organic layer 182. The dummy anode connection opening OP4-3 is not formed in the second organic layer 182, but is formed only in the third organic layer 183. The encapsulation layer 400 is positioned on the third organic layer 183 and the dummy anode connection opening OP4-3, and the dummy anode connection opening OP4-3 may be filled with the encapsulation layer 400. The sensing insulation layers 501, 510, and 511 and the sensing electrodes 540 and 541 may be positioned on the encapsulation layer 400 to sense a touch, and the planarization layer 550 may be positioned on the sensing insulation layers 501, 510, and 511 and the sensing electrodes 540 and 541.

Unlike the display area DA, the black pixel defining layer 380 and the light blocking member 220 that block light are not positioned in the first component area EA1, and the color filter layer 230 may not be positioned.

The dummy anode connection opening OP4-3 is not formed in the second organic layer 182 because even if the anode or the cathode is positioned on the upper portion of the dummy anode connection opening OP4-3, a short circuit with other conductive layers therebelow can be prevented.

Hereinafter, an embodiment in which a dummy scan portion 151-*d* that is symmetrical to the portion 151-ops bent along the boundary of the photosensor area OPS of the first scan line 151 and is not connected with the first scan line 151 is further included will be described with reference to FIG. 30, in addition to FIG. 28. Here, the dummy scan portion 151-*d* may also be disposed in the first gate conductive layer, similar to the first scan line 151.

Figure 30:
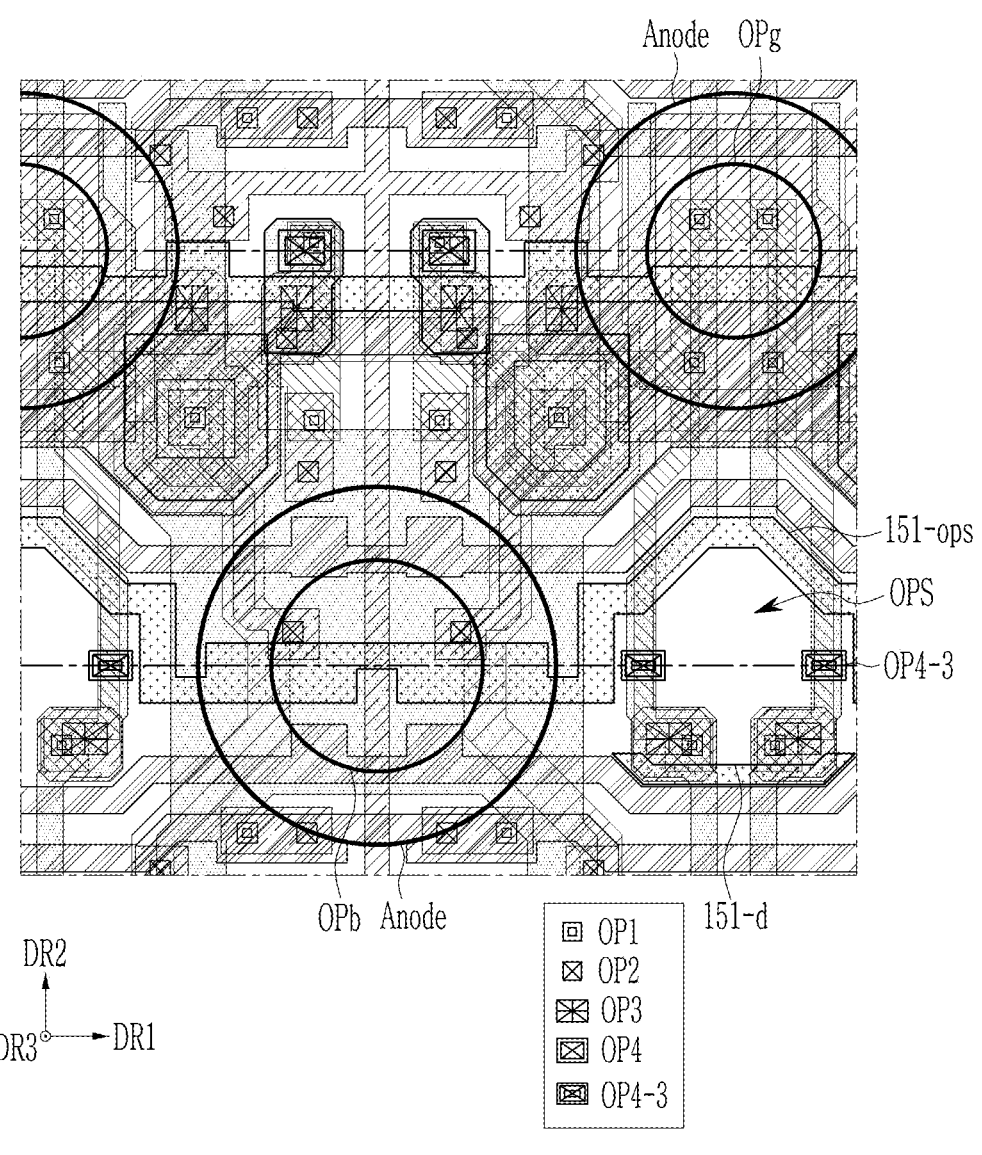
FIG. 30 is a schematic plan view illustrating a part of a lower panel layer according to another embodiment.

FIG. 30 is a schematic plan view illustrating a part of a lower panel layer according to another embodiment.

Referring to FIG. 30, in addition to the embodiment of FIG. 28, the dummy scan portion 151*d* that is not connected with the first scan line 151 while being positioned along a lower boundary of the photosensor area OPS and formed in the same layer (for example, the first gate conductive layer) as the first scan line 151 is further included.

In embodiments, the dummy scan portion 151-*d* may be integrally formed with the first scan line 151.

In embodiments, unlike the embodiment of FIG. 28, the bent portion 151-ops of the first scan line 151 may extend along the lower boundary of the photosensor area OPS, and in this case, the dummy scan portion 151-*d* may be positioned along an upper boundary of the photosensor area OPS. Here, the lower boundary and the upper boundary of the photosensor area OPS or first component area EA1 may be boundaries positioned on sides in the second direction DR2.

Hereinafter, a relationship with the opening OPBM of the light blocking member 220 formed in the upper panel layer will also described with reference to FIG. 31.

Figure 31:
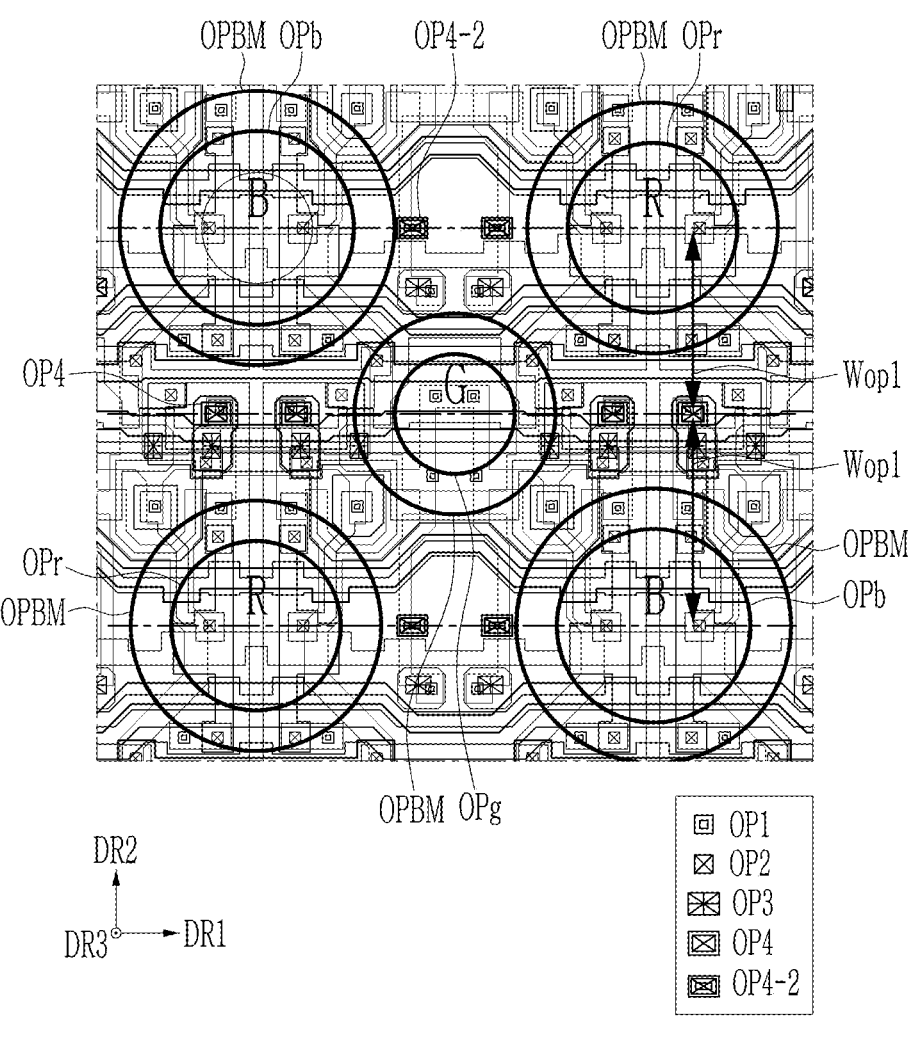
FIG. 31 is a schematic plan view illustrating a lower panel layer according to another embodiment.

FIG. 31 is a schematic plan view illustrating a lower panel layer according to another embodiment.

Referring to FIG. 31, the opening OPBM of the light blocking member 220 and the openings OPr, OPg, and OPb of the black pixel defining layer 380 may have a same center in a plan view. In this case, the center line in the horizontal direction of the openings OPr, OPg, and OPb of the black pixel defining layer 380 or the opening OBPM of the light blocking member 220, and the center lines adjacent to each other above and below the center line have a same width therebetween. In addition, in FIG. 31, the center lines of the anode connection opening OP4 and the dummy anode connection opening OP4-2 may also be positioned to correspond to the center line in the horizontal direction of the openings OPr, OPg, and OPb of the black pixel defining layer 380 or the opening OPBM of the light blocking member 220, respectively, or the center line in the horizontal direction of the openings OPr, OPg, and OPb of the black pixel defining layer 380 or the opening OPBM of the light blocking member 220 may be positioned to pass through the anode connection opening OP4 and the dummy anode connection opening OP4-2.

Therefore, due to the symmetrical structure, a flat feature may be obtained, external light is not asymmetrically reflected from the anode, and color separation does not occur.

Hereinafter, referring to FIGS. 32A to 34B, simulation results of the degree of flattening of different anodes according to the comparative example and the embodiment will be described.

Figure 32B:
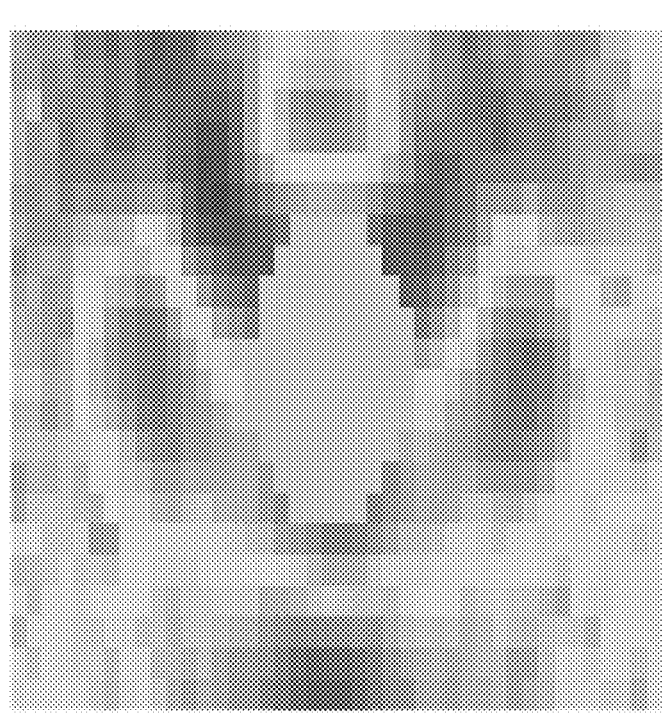
Figure 34A:
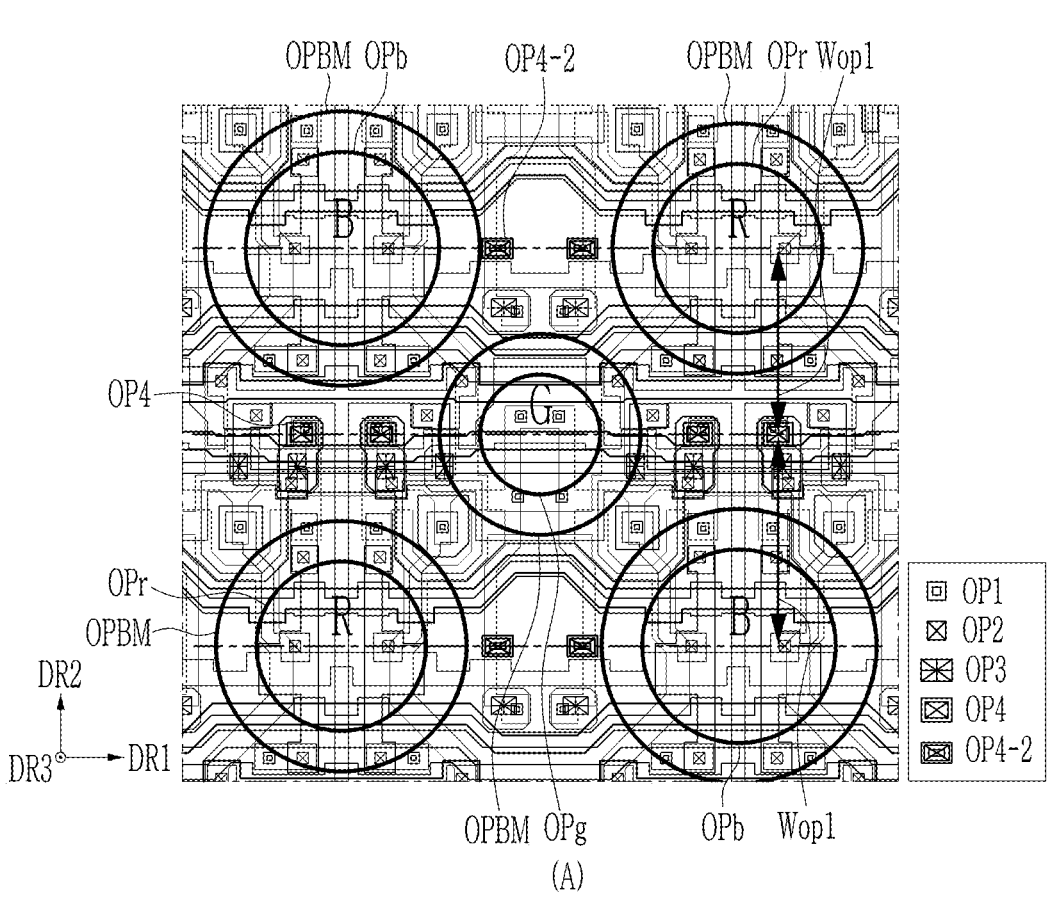
Figure 34B:
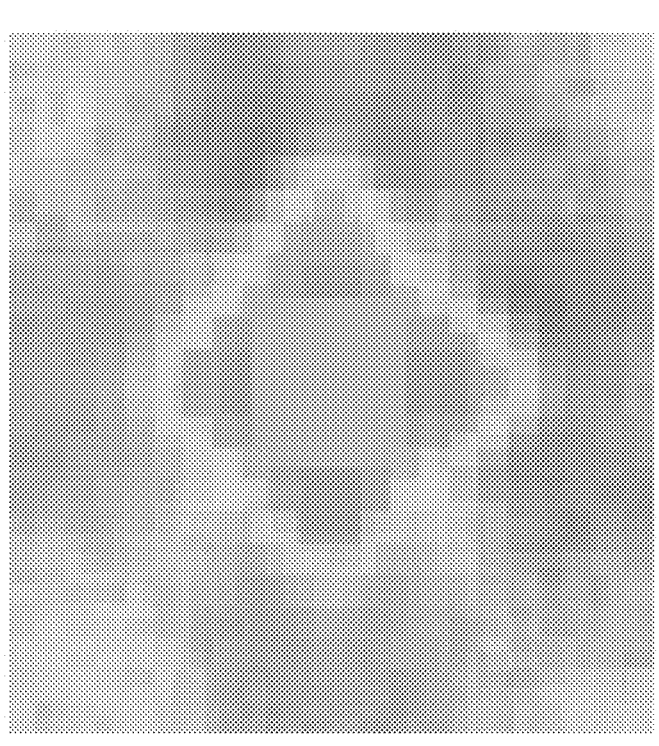

FIGS. 32A and 32B illustrates flat features of the lower panel layer and the anode according to the comparative example, and FIGS. 33A and 34B illustrate the flat feature of the lower panel layer and the anode according to the embodiment.

First, a structure of the comparative example is illustrated in FIG. 32A. In the comparative example shown in FIG. 32A, the center line in the horizontal direction of the anode connection opening OP4 does not correspond to the center line in the horizontal direction of the green opening OPg.

The degree of flatness of the anode with respect to the comparative example is as shown in FIG. 32B.

Figure 33B:
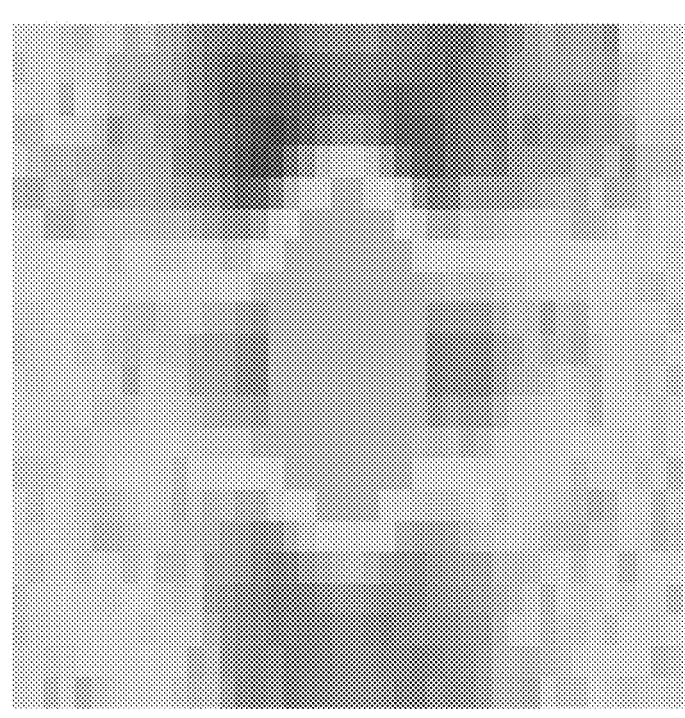

FIG. 33A, as shown in FIGS. 7 to 25B illustrates an embodiment in which a center line in the horizontal direction of an anode connection opening OP4 corresponds to a center line in the horizontal direction of a green opening OPg. FIG. 33B illustrates the degree of flatness of the anode in the embodiment of FIG. 33A. Comparing FIG. 33B with FIG. 32B, it can be determined that the anode in FIG. 33B has much more symmetrical flatness.

FIG. 34A illustrates an embodiment in which, as shown in FIG. 26 or 31, a center line in the horizontal direction of an anode connection opening OP4 corresponds to a center line in the horizontal direction of a green opening OPg, and additionally, a center line in the horizontal direction of a dummy anode connection opening OP4-2 corresponds to the center line in the horizontal direction of openings OPr and OPb of different colors. FIG. 34B illustrates the degree of flatness of the anode in the embodiment of FIG. 34A. Comparing FIG. 34B with FIG. 32B, it can be determined that the anode in FIG. 34B has much more symmetrical flatness.

Referring to FIGS. 32A to 34B, the anode of each embodiment according to the disclosure has a more symmetrical flat feature compared to the comparative example.

Hereinabove, embodiments having the features of the dummy anode connection opening OP4-2 and the features of the anode connection opening OP4 have been described, but in embodiments, an embodiment including only the feature of the dummy anode connection opening OP4-2, for example, the feature that the center line in the horizontal direction of the dummy anode connection opening OP4-2 corresponds to the center line in the horizontal direction of the openings OPr and OPb of different colors, is also available, and adjacent anodes may have symmetrical flatness due to the features of the dummy anode connection opening OP4-2.

In addition, although it is described in the above that the center lines correspond to each other or the distance or width between the center lines is the same, a difference of about 10% of the distance or width value between the center lines may occur in consideration of errors during actual manufacturing. For example, in an embodiment where the distance between adjacent center lines is about 10 μm, it can be determined that the center lines correspond to each other in case that the center line has a distance within about 1 μm, and in case that the distance values between other adjacent center lines is about 9 μm or more and less than about 11 μm, it can be determined that they have a same distance or width.

In embodiments, the center line of the opening OP of the black pixel defining layer 380 or the center line of the opening OPBM of the light blocking member 220 passes the anode connection openings OP4, OP4-1, and OP4-2 in a plan view, which may be included in the range of the disclosure. This is because in case that the size of the anode connection openings OP4, OP4-1, and OP4-2 is not large enough and thus in consideration of the error, the above-described effect can be provided even though the center line of the opening OP of the black pixel defining layer 380 or the center line of the opening OPBM of the light blocking member 220 passes through the anode connection openings OP4, OP4-1, and OP4-2.

Hereinafter, referring to FIG. 35, a layered structure of an embodiment to which a reflection adjusting layer 235 is applied instead of the color filter 230 will be described.

Figure 35:
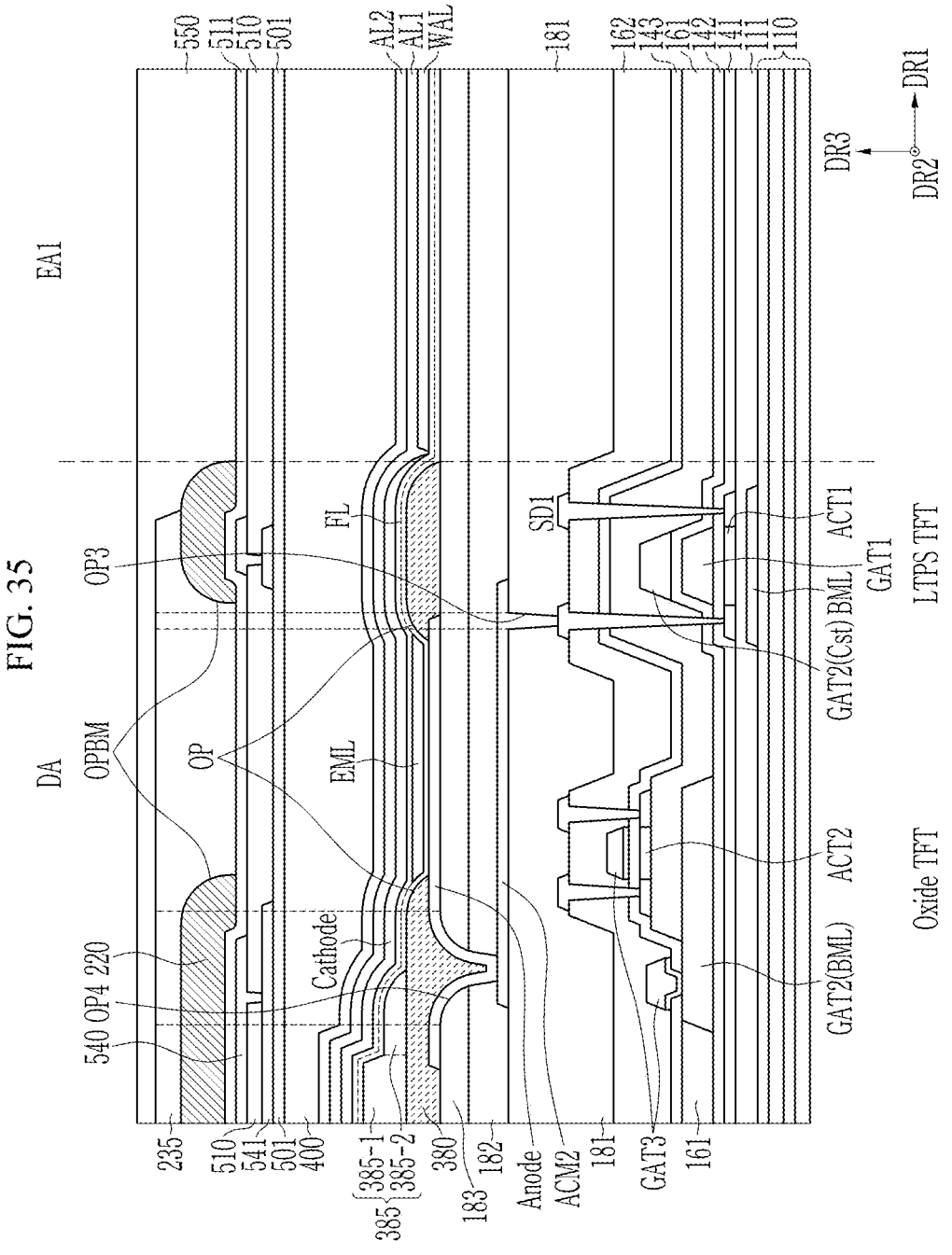
FIG. 35 is a schematic cross-sectional view of a light emitting display device according to another embodiment.

FIG. 35 is a schematic cross-sectional view of a light emitting display device according to another embodiment.

FIG. 35 is a schematic cross-sectional view corresponding to FIG. 20, and a portion that is different from FIG. 20 will be mainly described hereinafter.

A reflection adjusting layer 235 may be positioned on a light blocking member 220. The reflection adjusting layer 235 may selectively absorb light of a wavelength of a partial band among light reflected inside the display device or light incident outside the display device. The reflection adjusting layer 235 may fill an opening OP of the light blocking member 220.

For example, the reflection adjusting layer 235 may absorb a first wavelength region of about 490 nm to 5 about 05 nm and a second wavelength region of about 585 nm to about 600 nm, and thus light transmittance in the first wavelength region and the second wavelength region may be about 40% or less. The reflection adjusting layer 235 may absorb light of a wavelength out of the red, green, or blue light emitting wavelength range emitted from a light emitting diode. As described, since the reflection adjusting layer 235 absorbs light of a wavelength that does not belong to the wavelength range of red, green, or blue emitted from the light emitting diode, the decrease in luminance of the display device can be prevented or minimized, and simultaneously deterioration of the luminous efficiency of the display device can be prevented or minimized, and visibility may be improved.

In the embodiment, the reflection adjusting layer 235 may be provided as an organic material layer including a dye, a pigment, or a combination thereof. The reflection adjusting layer 235 may include a tetraazaporphyrin (TAP)-based compound, a porphyrin-based compound, a metal porphyrin-based compound, an oxazine-based compound, a squarylium-based compound, a triarylmethane-based compound, a polymethine-based compound, an anthraquinone-based compound, a phthalocyanine-based compound, an azo-based compound, a perylene-based compound, a xanthene-based compound, a diammonium-based compound, a dipyrromethene-based compound, a cyanine-based compound, and a combination thereof.

In the embodiment, the reflectance measured in a specular component included (SCI) mode on the surface of the reflection adjusting layer 235 may be about 10% or less. For example, the reflection adjusting layer may absorb external light reflected in the display device to improve visibility.

In the embodiment, the reflection adjusting layer 235 may have a transmittance of about 64% to about 72%. The transmittance of the reflection adjusting layer 235 may be adjusted according to the content of the pigment and/or dye included in the reflection adjusting layer 235.

In embodiments, the reflection adjusting layer 235 may not be positioned in a first component area EA1.

In addition, in the embodiment including the reflection adjusting layer 235, a capping layer AL1 and a low reflective layer AL2 may be additionally formed between a cathode Cathode and an encapsulation layer 400.

The capping layer AL1 may serve to improve the luminous efficiency of the light emitting diode by the principle of reinforcing (or constructive) interference. For example, the capping layer AL1 may include a material having a refractive index of about 1.6 or more for light having a wavelength of about 589 nm.

The capping layer AL1 may be an organic capping layer including an organic material, an inorganic capping layer including an inorganic material, or a composite capping layer including an organic material and an inorganic material. For example, the capping layer AL1 may include a carbocyclic compound, a heterocyclic compound, an amine group-containing compound, a porphine derivatives, a phthalocyanine derivatives, a naphthalocyanine derivatives, an alkali metal complex, an alkaline earth metal complex, or any combination thereof. The carbocyclic compound, the heterocyclic compound, and the amine group-containing compound may be optionally substituted with substituents including O, N, S, Se, Si, F, Cl, Br, I, or any combination thereof.

A low reflective layer AL2 may be disposed on the capping layer AL1. The low reflective layer AL2 may overlap a front surface of a substrate 110.

The low reflective layer AL2 may include an inorganic material having low reflectance, and in an embodiment, the low reflective layer AL2 may include a metal or metal oxide. In case that the low reflective layer AL2 includes a metal, it may include, for example, ytterbium (Yb), bismuth (Bi), cobalt (Co), molybdenum (Mo), titanium (Ti), zirconium (Zr), aluminum (Al), chromium (Cr), niobium (Nb), platinum (Pt), tungsten (W), indium (In), tin (Sn), iron (Fe), nickel (Ni), tantalum (Ta), manganese (Mn), zinc (Zn), germanium (Ge), silver (Ag), magnesium (Mg), gold (Au), copper (Cu), calcium (Ca), or a combination thereof. In addition, in case that the low reflective layer AL2 includes a metal oxide, it may include, for example, $SiO_2$, $TiO_2$, $ZrO_2$, $Ta_2O_5$, $HfO_2$, $Al_2O_3$, $ZnO$, $Y_2O_3$, $BeO$, $MgO$, $PbO_2$, $WO_3$, $SiN_x$, $LiF$, $CaF_2$, $MgF_2$, $CdS$, or a combination thereof.

In the embodiment, an absorption coefficient k of the inorganic material included in the low reflective layer AL2 may be about 4.0 or less and about 0.5 or more ($0.5 < k \leq 4.0$). In addition, the inorganic material included in the low reflective layer AL2 may have a refractive index n of 1 or more ($n \geq 1.0$).

The low reflective layer AL2 induces destructive interference between the light incident on the display device and the light reflected from the metal disposed under the low reflective layer AL2, thereby reducing external light reflectance. Therefore, the display quality and visibility of the display device can be improved by reducing the external light reflectance of the display device through the low reflective layer AL2.

In embodiments, the capping layer AL1 may be omitted such that the low reflective layer AL2 may contact the cathode Cathode.

An encapsulation layer 400 is positioned on the low reflective layer AL2, and the other structures are shown in FIG. 20, and a description thereof will be omitted.

The cathode Cathode formed in a display area may not be formed in the first component area EA1, and in the embodi-ment of FIG. 35, a low adhesive layer WAL may be positioned at the cathode Cathode position in the first component area EA1. The low adhesive layer WAL may be positioned on a function layer FL in the first component area EA1. The low adhesive layer WAL is a material with weak adherence, and in embodiments, the cathode Cathode is not disposed on the upper surface of the low adhesive layer WAL, or the low adhesive layer WAL may include a material having a feature that the cathode Cathode is formed with a very thin thickness.

For example, the low adhesive layer WAL may be formed by using a material such as [8-quinolinolato lithium] (Liq), N,N-diphenyl-N,N-bis(9-phenyl-9H-carbazol-3-yl)biphe-nyl-4,4'-diamine (HT01), N(diphenyl-4-yl)9,9-dimethyl-N-(4(9-phenyl-9H-carbazol-3-yl)phenyl)-9H-fluorene-2-amine (HT211), 2-(4-(9,10-di(naphthalene-2-yl)anthracene-2-yl)phenyl)-1-phenyl-1H-benzo-[D]imidazole (LG201), and the like.

The specification illustrates and describes an embodiment in which the low adhesive layer WAL is positioned in the first component area EA1, but in another embodiment, it may be removed by a laser process or the like. In this case, the laser process may be a laser process performed on the cathode Cathode.

The capping layer AL1, the low reflective layer AL2, and the encapsulation layer 400 may be disposed on the low adhesive layer WAL in the first component area EA1.

The above description is an example of technical features of the disclosure, and those skilled in the art to which the disclosure pertains will be able to make various modifica-tions and variations. Therefore, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclo-sure should be interpreted by the following claims, and it should be interpreted that all technical spirits within the equivalent scope are included in the scope of the disclosure.

What is claimed is:

1. A light emitting display device comprising:
 a first semiconductor layer that is positioned on a sub-strate;
 a first gate insulating layer that is positioned on the first semiconductor layer;
 a first gate conductive layer that is positioned on the first gate insulating layer;
 a second gate insulating layer that is positioned on the first gate conductive layer;
 a first data conductive layer that is positioned on the second gate insulating layer and having an expansion portion;
 a lower organic layer that is positioned on the first data conductive layer;
 a second data conductive layer that is positioned on the lower organic layer, and includes a first anode connec-tion member and a second anode connection member;
 an upper organic layer that is positioned on the second data conductive layer;
 a first anode and a second anode that are positioned on the upper organic layer; and
 a pixel defining layer that includes a first opening and a second opening respectively exposing the first anode and the second anode, wherein the upper organic layer comprises:

a first anode connection opening through which the first anode is electrically connected with the first anode connection member; and a second anode connection opening through which the second anode is electrically connected with the second anode connection member, a center line that passes through the first anode connection opening or a center of the first anode connection opening and the second anode connection opening or a center of the second anode connection opening passes through a center of the first opening, the expansion portion of the first data conductive layer overlaps the first opening in a plan view and includes a protruded portion in a plan view, the expansion portion of the first data conductive layer is spaced apart from the first anode connection member of the second data conductive layer in a plan view, and the expansion portion of the first data conductive layer and the first anode connection member of the second data conductive layer are not electrically connected each other.

2. The light emitting display device of claim 1, wherein the center line extends in a horizontal direction, and matches the center of the first opening.

3. The light emitting display device of claim 2, wherein the first anode overlapping the first opening in a plan view is an anode of a green light emitting diode, and the second anode overlapping the second opening in a plan view is an anode of a red light emitting diode or an anode of a blue light emitting diode.

4. The light emitting display device of claim 2, further comprising:

a third anode that is positioned on the upper organic layer, wherein the pixel defining layer further comprises a third opening exposing the third anode, and a distance from the center line in a horizontal direction, passing through the first anode connection opening or the center of the first anode connection opening or the center of the first opening to the center line in the horizontal direction, passing through the center of the second opening is equal to a distance from the center line in the horizontal direction, passing through the first anode connection opening or the center of the first anode connection opening to the center line in the horizontal direction, passing through the center of the third opening.

5. The light emitting display device of claim 4, wherein the first anode overlapping the first opening in a plan view is an anode of a green light emitting diode, the second anode overlapping the second opening in a plan view is an anode of a red light emitting diode, and the third anode overlapping the third opening in a plan view is an anode of a blue light emitting diode.

6. A light emitting display device comprising:

a first semiconductor layer that is positioned on a substrate;

a first gate insulating layer that is positioned on the first semiconductor layer;

a first gate conductive layer that is positioned on the first gate insulating layer;

a second gate insulating layer that is positioned on the first gate conductive layer;

a first data conductive layer that is positioned on the second gate insulating layer;

a lower organic layer that is positioned on the first data conductive layer;

a second data conductive layer that is positioned on the lower organic layer, and includes a first anode connection member and a second anode connection member;

an upper organic layer that are positioned on the second data conductive layer;

a first anode and a second anode that are positioned on the upper organic layer; and a pixel defining layer that includes a first opening and a second opening respectively exposing the first anode and the second anode, wherein the upper organic layer comprises a first anode connection opening and a second anode connection opening through which the first anode and the second anode are respectively electrically connected with the first anode connection member and the second anode connection member, a center line that passes through the first anode connection opening or a center of the first anode connection opening and the second anode connection opening or a center of the second anode connection opening passes through a center of the first opening or a center of the second opening, the second data conductive layer further comprises a driving voltage line that includes a plurality of expansion portions and a connection portion electrically connecting the plurality of expansion portions, the first data conductive layer includes an expansion portion that overlaps the first opening in a plan view and includes a protruded portion, the protruded portion of the expansion portion of the first data conductive layer and the connection portion of the driving voltage line are electrically connected with each other through an opening positioned in the lower organic layer, and the opening of the lower organic layer is covered by the protruded portion of the expansion portion of the first data conductive layer and the connection portion of the driving voltage line in a plan view.

7. A light emitting display device comprising:

a first semiconductor layer that is positioned on a substrate;

a first gate insulating layer that is positioned on the first semiconductor layer;

a first gate conductive layer that is positioned on the first gate insulating layer;

a second gate insulating layer that is positioned on the first gate conductive layer;

a first data conductive layer that is positioned on the second gate insulating layer;

a lower organic layer that is positioned on the first data conductive layer;

a second data conductive layer that is positioned on the lower organic layer, and includes a first anode connection member and a second anode connection member;

an upper organic layer that are positioned on the second data conductive layer;

a first anode and a second anode that are positioned on the upper organic layer; and a pixel defining layer that includes a first opening and a second opening respectively exposing the first anode and the second anode, wherein the upper organic layer comprises a first anode connection opening and a second anode connection opening through which the first anode and the second anode are respectively electrically connected with the first anode connection member and the second anode connection member, a center line that passes through the first anode connection opening or a center of the first anode connection opening and the second anode connection opening or a center of the second anode connection opening passes through a center of the first opening or a center of the second opening, the first data conductive layer comprises an expansion portion overlapping the first opening in a plan view, and the expansion portion has a structure that is narrowed toward a side.

8. A light emitting display device comprising:

a first semiconductor layer that is positioned on a substrate;

a first gate insulating layer that is positioned on the first semiconductor layer;

a first gate conductive layer that is positioned on the first gate insulating layer;

a second gate insulating layer that is positioned on the first gate conductive layer;

a first data conductive layer that is positioned on the second gate insulating layer;

a lower organic layer that is positioned on the first data conductive layer;

a second data conductive layer that is positioned on the lower organic layer, and includes a first anode connection member and a second anode connection member;

an upper organic layer that are positioned on the second data conductive layer;

a first anode and a second anode that are positioned on the upper organic layer; and a pixel defining layer that includes a first opening and a second opening respectively exposing the first anode and the second anode, wherein the upper organic layer comprises a first anode connection opening and a second anode connection opening through which the first anode and the second anode are respectively electrically connected with the first anode connection member and the second anode connection member, a center line that passes through the first anode connection opening or a center of the first anode connection opening and the second anode connection opening or a center of the second anode connection opening passes through a center of the first opening or a center of the second opening, the light emitting display device further comprises between the second gate insulating layer and the first data conductive layer:

a second gate conductive layer positioned on the second gate insulating layer;

a first interlayer insulating layer positioned on the second gate conductive layer;

a second semiconductor layer positioned on the first interlayer insulating layer and including an oxide semiconductor;

a third gate insulating layer positioned on the second semiconductor layer;

a third gate conductive layer positioned on the third gate insulating layer; and a second interlayer insulating layer positioned on the third gate conductive layer, and the first data conductive layer is positioned on the second interlayer insulating layer.

9. The light emitting display device of claim 8, further comprising:

a polycrystalline semiconductor transistor that includes:

a channel in the first semiconductor layer; and a gate electrode in the first gate conductive layer; and an oxide semiconductor transistor that includes:

a channel in the second semiconductor layer; and a gate electrode in the third gate conductive layer, wherein a driving transistor generating an output current to the first anode or the second anode is the polycrystalline semiconductor transistor, and an anode initialization transistor that initializes the first anode or the second anode is the oxide semiconductor transistor.

10. The light emitting display device of claim 9, wherein the first data conductive layer comprises:

a wiring portion extended in a vertical direction; and an extension portion protruded to opposite sides from the wiring portion in a horizontal direction, an end of the extension portion is expanded, and the light emitting display device comprises a second initialization voltage line that transmits a second initialization voltage to the anode initialization transistor.

11. A light emitting display device comprising:

a first semiconductor layer that is positioned on a substrate;

a first gate insulating layer that is positioned on the first semiconductor layer;

a first gate conductive layer that is positioned on the first gate insulating layer;

a second gate insulating layer that is positioned on the first gate conductive layer;

a first data conductive layer that is positioned on the second gate insulating layer;

a lower organic layer that is positioned on the first data conductive layer;

a second data conductive layer that is positioned on the lower organic layer, and includes a first anode connection member and a second anode connection member;

an upper organic layer that are positioned on the second data conductive layer;

a first anode and a second anode that are positioned on the upper organic layer; and a pixel defining layer that includes a first opening and a second opening respectively exposing the first anode and the second anode, wherein the upper organic layer comprises a first anode connection opening and a second anode connection opening through which the first anode and the second anode are respectively electrically connected with the first anode connection member and the second anode connection member, a center line that passes through the first anode connection opening or a center of the first anode connection opening and the second anode connection opening or a center of the second anode connection opening passes through a center of the first opening or a center of the second opening, the upper organic layer further comprises a dummy anode connection opening, and a horizontal direction center line passing through the center of the first opening of the pixel defining layer or the center of the second opening passes through the dummy anode connection opening or the center of the dummy anode connection opening.

12. The light emitting display device of claim 11, further comprising:

a display area and a first component area, wherein the dummy anode connection opening is positioned in the display area, and at least part of the pixel defining layer is positioned in the dummy anode connection opening.

13. The light emitting display device of claim 12, wherein the dummy anode connection opening is positioned in the first component area, at least part of a function layer is positioned in the dummy anode connection opening, and the function layer comprises at least one of an electron injection layer, an electron transport layer, a hole transport layer, and a hole injection layer of a light emitting diode.

14. The light emitting display device of claim 13, wherein the first gate conductive layer comprises a first scan line, and the first scan line has a structure bent along the boundary of the first component area.

15. The light emitting display device of claim 14, wherein the first gate conductive layer further comprises a dummy scan portion, the first scan line is bent along an upper boundary of the first component area, and the dummy scan portion is separated from the first scan line while being bent along a lower boundary of the first component area.

16. A light emitting display device comprising:

a semiconductor layer that is positioned on a substrate;

a first gate insulating layer that is positioned on the semiconductor layer;

a gate conductive layer that is positioned on the first gate insulating layer;

a second gate insulating layer that is positioned on the gate conductive layer;

a first data conductive layer that is positioned on the second gate insulating layer;

a lower organic layer that is positioned on the first data conductive layer;

a second data conductive layer that is positioned on the lower organic layer;

an upper organic layer that are positioned on the second data conductive layer;

a first anode and a second anode that are positioned on the upper organic layer; and a pixel defining layer that includes a first opening and a second opening respectively exposing the first anode and the second anode, wherein the upper organic layer comprises a dummy anode connection opening, and a center line passing through a center of the first opening and a center of the second opening of the pixel defining layer passes through the dummy anode connection opening or a center of the dummy anode connection opening.

17. The light emitting display device of claim 16, comprising a display area and a first component area, wherein the dummy anode connection opening is positioned in the display area, and at least part of the pixel defining layer is positioned in the dummy anode connection opening.

18. The light emitting display device of claim 17, wherein the dummy anode connection opening is positioned in the first component area, at least part of a function layer is positioned in the dummy anode connection opening, and the function layer comprises at least one of an electron injection layer, an electron transport layer, a hole transport layer, and a hole injection layer of a light emitting diode.

19. The light emitting display device of claim 18, wherein the gate conductive layer comprises a first scan line, and the first scan line has a structure bent along the boundary of the first component area.

20. The light emitting display device of claim 19, wherein the gate conductive layer further comprises a dummy scan portion, the first scan line is bent along an upper boundary of the first component area, and the dummy scan portion is separated from the first scan line while being bent along a lower boundary of the first component area.

\* \* \* \* \*